United States Patent
Kuo et al.

(10) Patent No.: US 11,508,633 B2
(45) Date of Patent: Nov. 22, 2022

(54) PACKAGE STRUCTURE HAVING TAPER-SHAPED CONDUCTIVE PILLAR AND METHOD OF FORMING THEREOF

(71) Applicant: Taiwan Semiconductor Manufacturing Co., Ltd., Hsinchu (TW)

(72) Inventors: Hung-Jui Kuo, Hsinchu (TW); Hui-Jung Tsai, Hsinchu (TW); Tai-Min Chang, Taipei (TW); Chia-Wei Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/886,755

(22) Filed: May 28, 2020

(65) Prior Publication Data

US 2021/0375708 A1 Dec. 2, 2021

(51) Int. Cl.
| | |
|---|---|
| *H01L 23/31* | (2006.01) |
| *H01L 21/56* | (2006.01) |
| *H01L 23/538* | (2006.01) |
| *H01L 25/065* | (2006.01) |
| *H01L 23/00* | (2006.01) |

(52) U.S. Cl.
CPC ........ *H01L 23/3114* (2013.01); *H01L 21/561* (2013.01); *H01L 23/5384* (2013.01); *H01L 24/05* (2013.01); *H01L 24/16* (2013.01); *H01L 25/0657* (2013.01); *H01L 2224/0231* (2013.01); *H01L 2224/05008* (2013.01); *H01L 2224/05099* (2013.01); *H01L 2224/12105* (2013.01); *H01L 2224/16145* (2013.01); *H01L 2924/181* (2013.01)

(58) Field of Classification Search
CPC . H01L 24/16; H01L 23/3114; H01L 23/5384; H01L 2224/12105; H01L 2924/181; H01L 2224/023; H01L 2224/024; H01L 2224/02372; H01L 24/03; H01L 24/06; H01L 24/17; H01L 24/19; H01L 24/20; H01L 24/50; H01L 24/92; H01L 24/97; H01L 2224/2901; H01L 2224/0555; H01L 2224/0501; H01L 2224/08058; H01L 21/76885; H01L 24/05; H01L 24/24; H01L 24/73; H01L 24/82; H01L 23/3128; H01L 23/5383; H01L 23/49816; H01L 23/5389
USPC .......................................................... 257/678
See application file for complete search history.

(56) References Cited

U.S. PATENT DOCUMENTS 3,416,975 A * 12/1968 Webb ................ C23F 1/20
148/266
5,889,326 A * 3/1999 Tanaka .............. H01L 24/11
257/737

(Continued)

FOREIGN PATENT DOCUMENTS

WO WO-2017/108513 A1 * 6/2017 ........... H01L 21/306

*Primary Examiner* — Khiem D Nguyen
(74) *Attorney, Agent, or Firm* — JCIPRNET

(57) ABSTRACT

A conductive structure, includes: a plurality of conductive layers; a plurality of conductive pillars being formed on the plurality of conductive layers, respectively; and a molding compound laterally coating the plurality of conductive pillars. Each of the plurality of conductive pillars is a taper-shaped conductive pillar, and is tapered from the conductive layers.

20 Claims, 58 Drawing Sheets

(56) References Cited

U.S. PATENT DOCUMENTS

| | | | |
|---|---|---|---|
| 6,346,469 B1* | 2/2002 | Greer | H01L 24/11 |
| | | | 438/614 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,105,530 B2* | 8/2015 | Lin | H01L 24/81 |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,929,071 B2* | 3/2018 | Cheng | H01L 24/96 |
| 10,510,674 B2* | 12/2019 | Lin | H01L 24/24 |
| 10,763,231 B2* | 9/2020 | Mishra | H01L 24/11 |
| 2009/0020739 A1* | 1/2009 | Arnold | H01L 45/165 |
| | | | 257/2 |
| 2012/0025365 A1* | 2/2012 | Haba | H01L 24/17 |
| | | | 257/692 |
| 2015/0262909 A1* | 9/2015 | Chen | H01L 21/76804 |
| | | | 257/774 |
| 2015/0262954 A1* | 9/2015 | Lee | H01L 24/13 |
| | | | 257/737 |
| 2017/0154850 A1* | 6/2017 | Kao | H01L 23/3171 |
| 2017/0256511 A1* | 9/2017 | Kim | H01L 23/3114 |
| 2018/0090459 A1* | 3/2018 | Kim | H01L 24/05 |
| 2018/0286823 A1* | 10/2018 | Tai | H01L 24/02 |
| 2019/0131220 A1* | 5/2019 | Lu | H01L 23/3114 |
| 2019/0164783 A1* | 5/2019 | Huang | H01L 24/96 |
| 2019/0229046 A1* | 7/2019 | Tsai | H01L 23/49816 |
| 2019/0311988 A1* | 10/2019 | Yu | H01L 24/19 |
| 2019/0333811 A1* | 10/2019 | Wu | H01L 23/3114 |
| 2020/0006309 A1* | 1/2020 | Chen | H01L 24/20 |

* cited by examiner

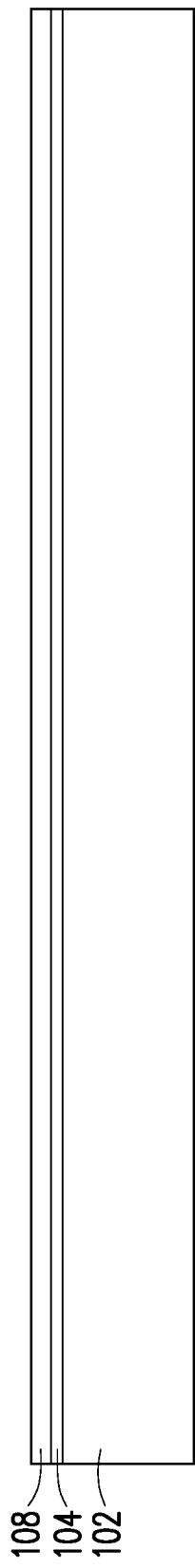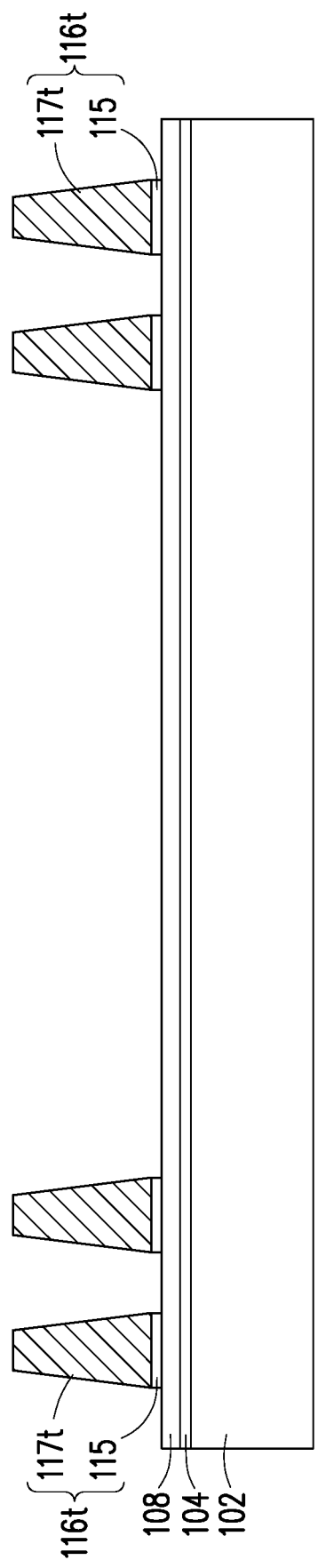

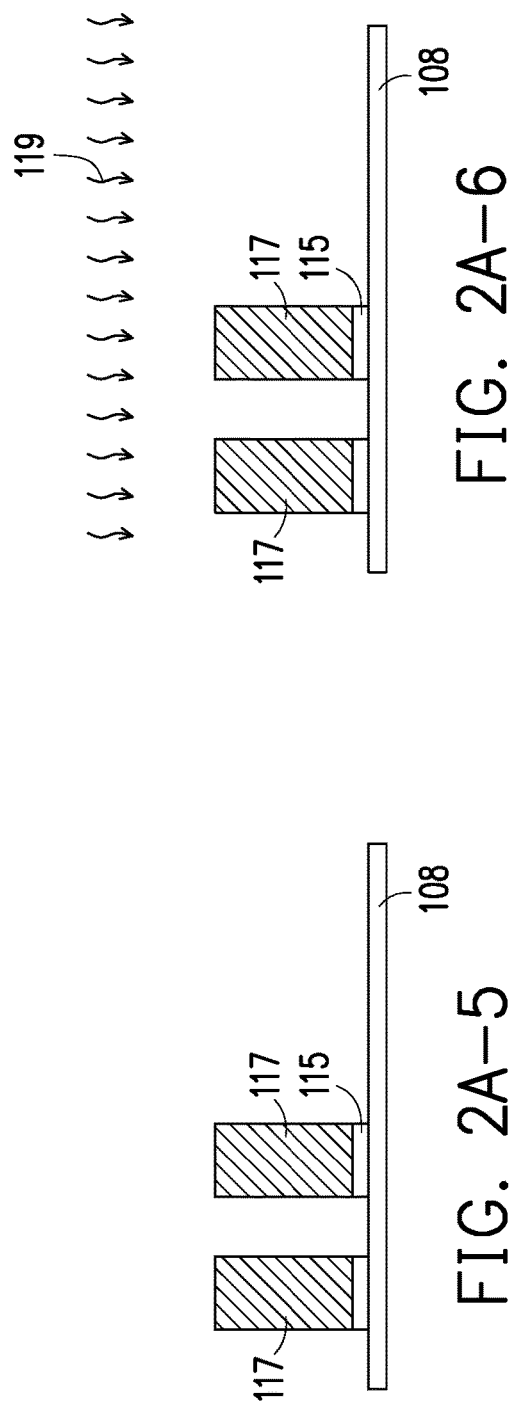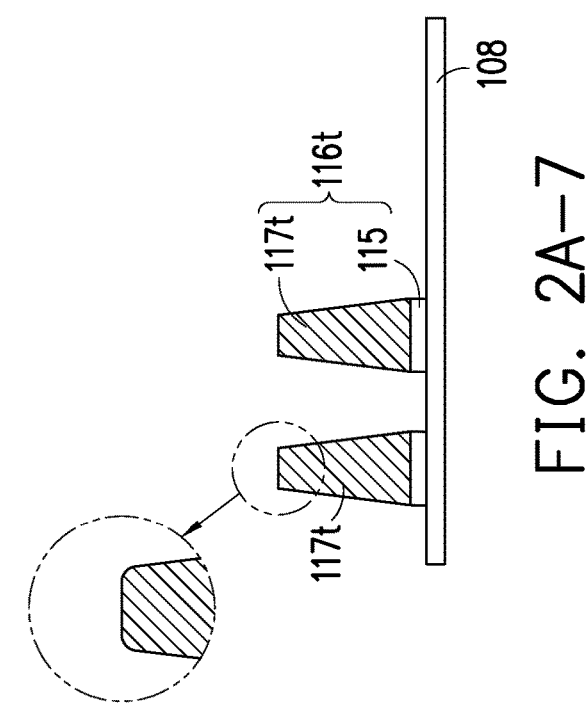

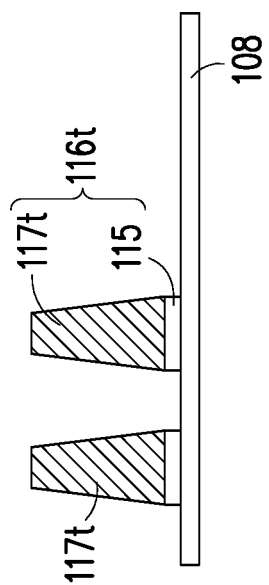

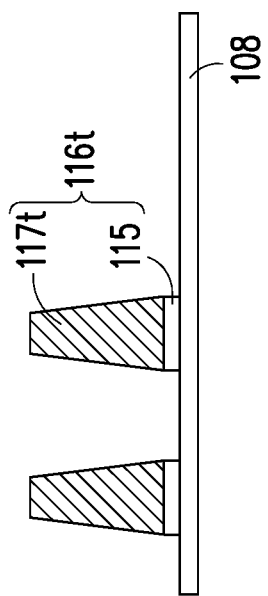

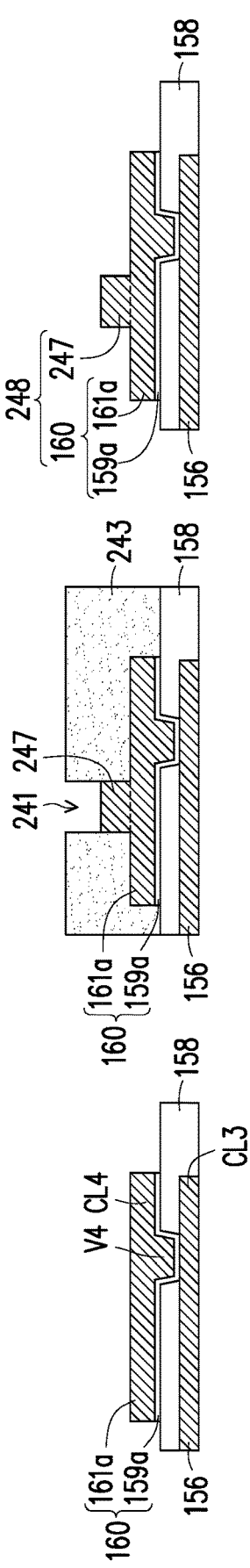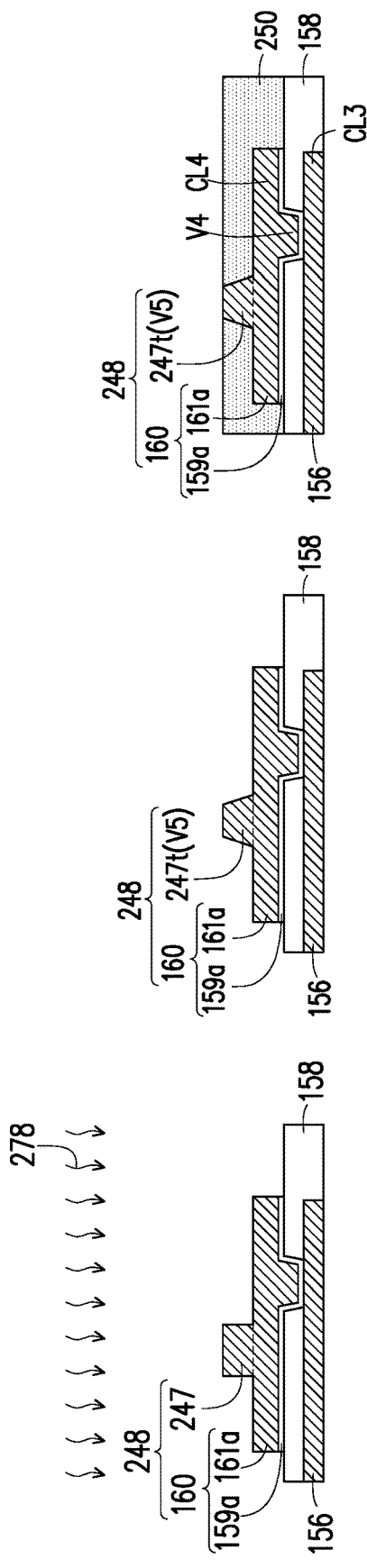

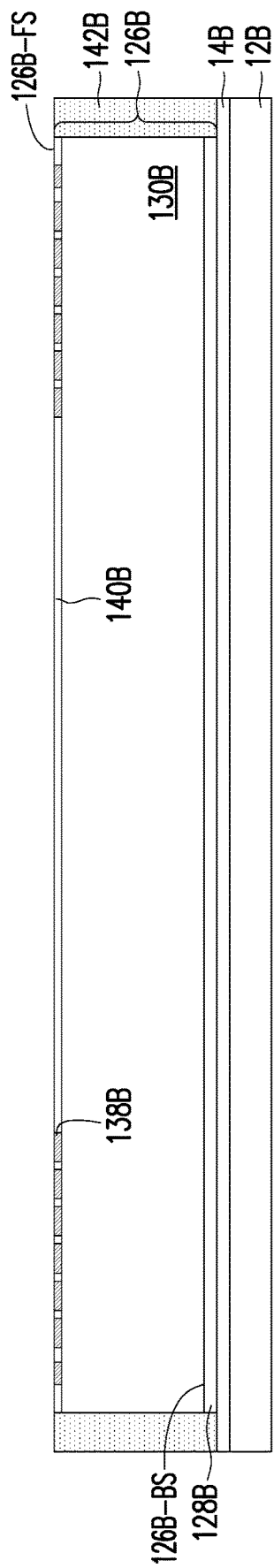
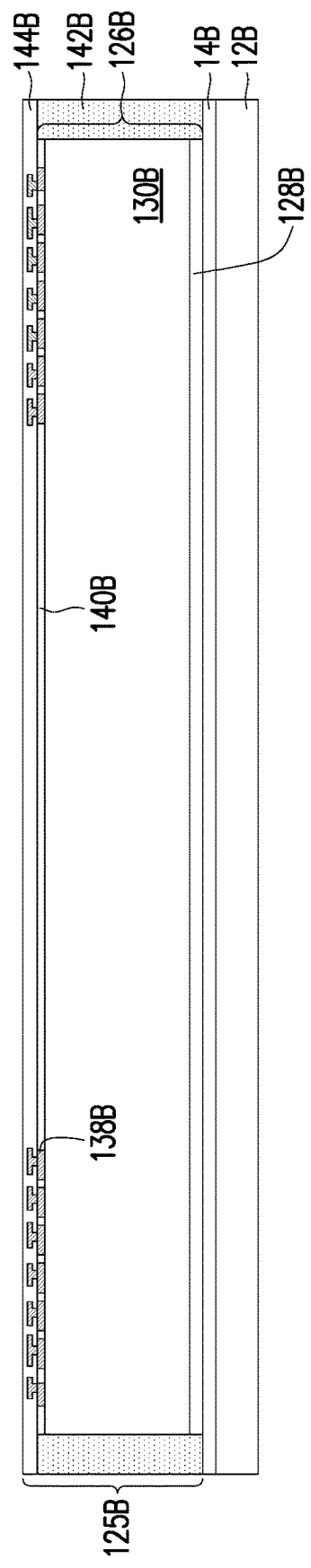
FIG. 16A
FIG. 16B

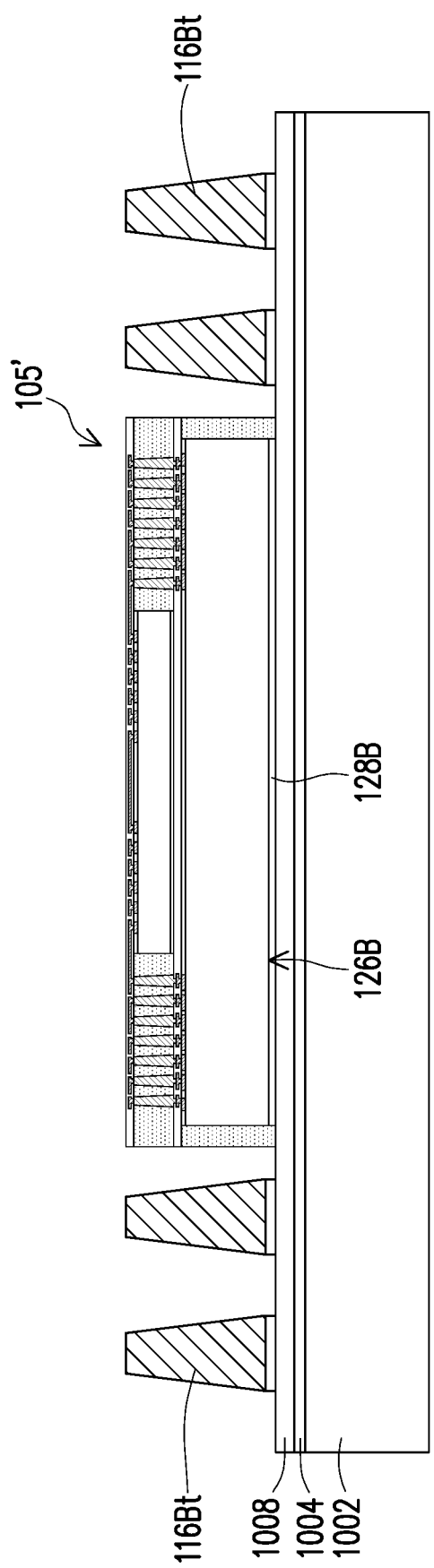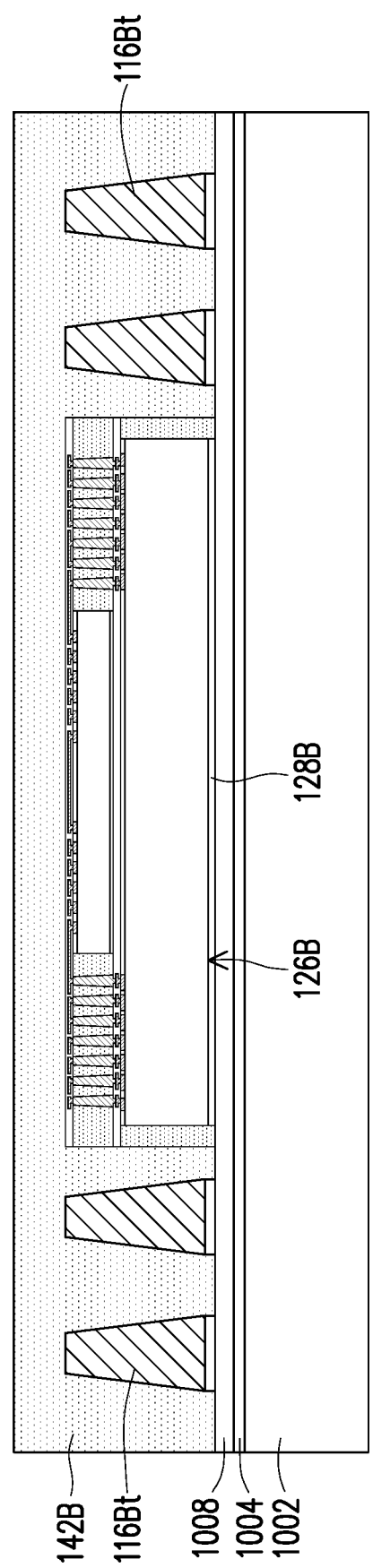
FIG. 16I
FIG. 16J

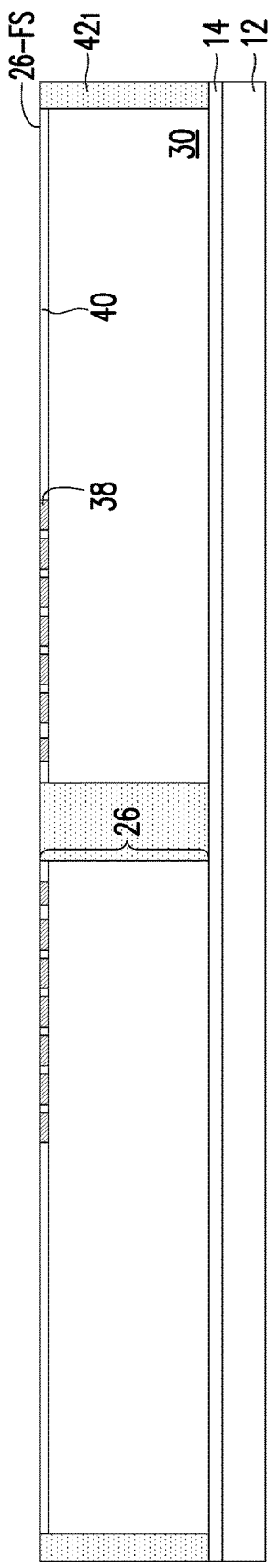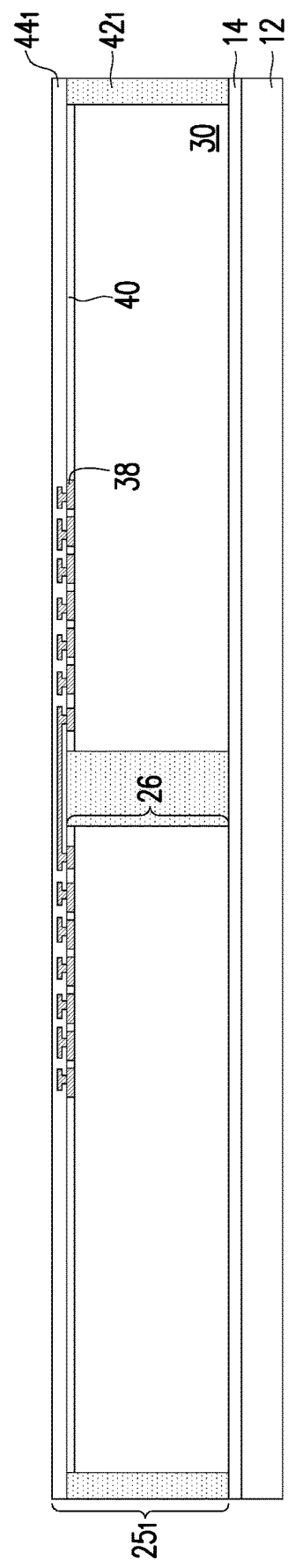
FIG. 17A
FIG. 17B

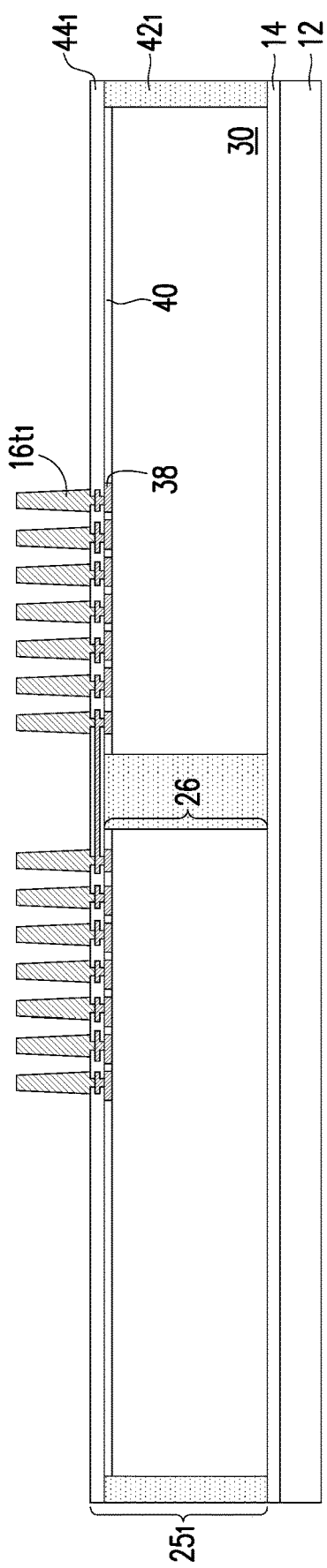
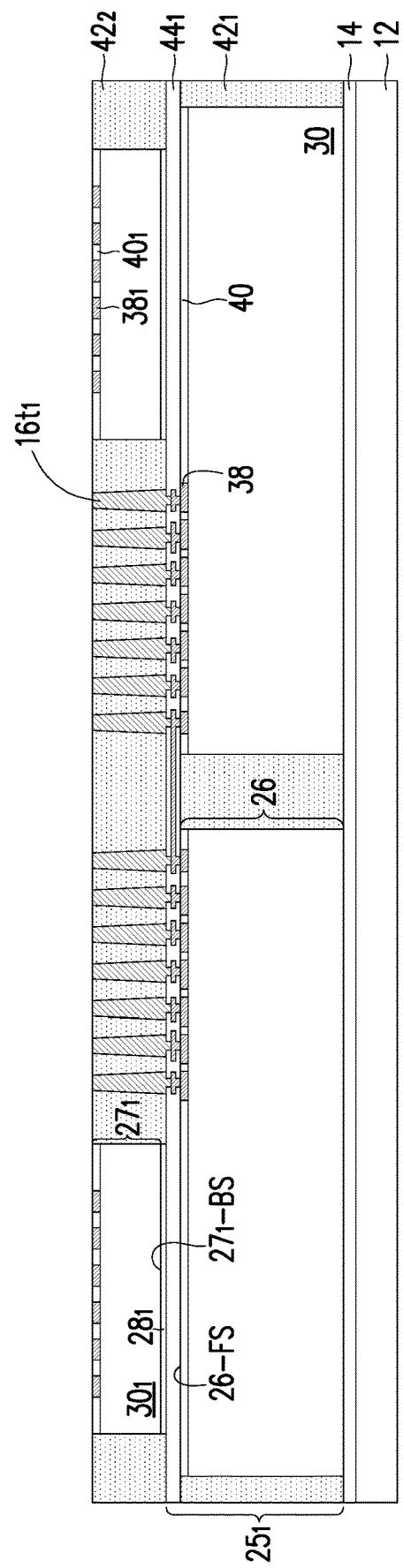

PACKAGE STRUCTURE HAVING TAPER-SHAPED CONDUCTIVE PILLAR AND METHOD OF FORMING THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. The formation of the redistribution circuit structure also plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1F are schematic cross-sectional views illustrating a method of manufacturing a device package according to some embodiments of the disclosure.

FIGS. 2A-1 through 2A-7 are schematic cross-sectional views illustrating a method of manufacturing conductive pillars according to some embodiments of the disclosure.

FIGS. 2B-1 through 2B-5 are schematic cross-sectional views illustrating an alternative method of manufacturing conductive pillars according to some embodiments of the disclosure.

FIGS. 2C-1 through 2C-5 are schematic cross-sectional views illustrating an alternative method of manufacturing conductive pillars according to some embodiments of the disclosure.

FIGS. 16A through 16M are schematic cross-sectional views illustrating a method of manufacturing a device package according to some embodiments of the disclosure.

FIGS. 17A through 17I are schematic cross-sectional views illustrating a method of manufacturing a device package according to some embodiments of the disclosure.

DETAILED DESCRIPTION

Figure 1C:
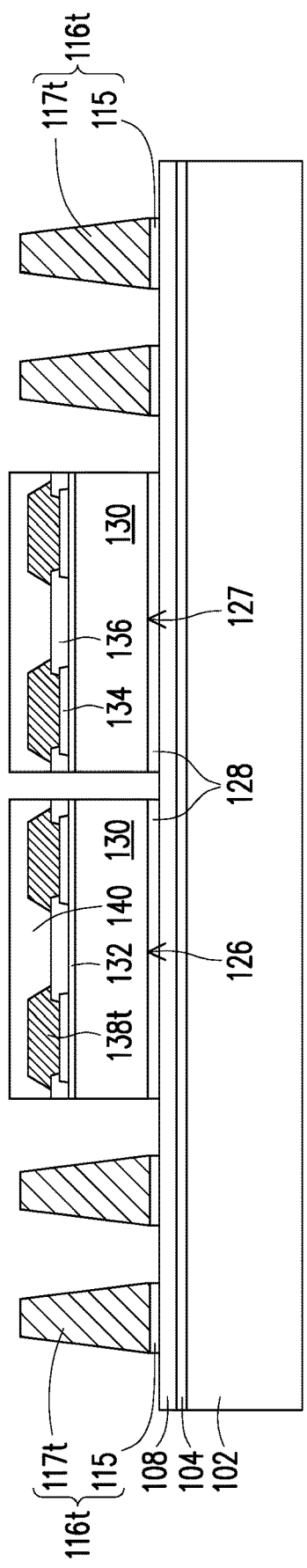

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In a typical package structure manufacturing process, conductive connectors, such as conductive pillars, vias or die connectors, are formed on dielectric layers and are used to connect top dies with high input/output (I/O) counts on an integrated fan-out (INFO) package.

The conductive connectors, such as conductive pillars, vias or die connectors, may have a vertical profile. During the process forming the molding compound, the vertical sidewall of the conductive connectors may prevent the polymer used for dielectric layer or molding compounds from filling in the space between the conductive connectors completely. Also, the polymer used for molding compounds or dielectric materials may have large viscosity. The large viscosity of the polymer makes the polymer difficult to fill the space between the conductive connectors. Furthermore, when the spacing between the conductive connectors become smaller and smaller, the capillary effect between the conductive connectors also make the polymer difficult to fill the space between the conductive connectors. As a result, bubbles may be generated at the end of the conductive connector connecting the dielectric layer which the conductive connectors are formed on. During the thermal process, these bubbles, which contain water vapor and other gases, may expand and damage the package.

In this disclosure, taper-shaped conductive connectors are formed to avoid forming bubbles during the process of forming molding compound.

FIGS. 1A through 1F are schematic cross-sectional views illustrating a method of manufacturing a device package 100A according to some embodiments of the disclosure. The device packages 100A may also be referred to as integrated fan-out (InFO) packages.

Referring to FIG. 1A, a carrier substrate (or referred to as a substrate) 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages may be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Referring to FIG. 1A, a bottom dielectric layer 108 is formed on the release layer 104. The bottom surface of the bottom dielectric layer 108 may be in contact with the top surface of the release layer 104. In some embodiments, the bottom dielectric layer 108 is formed of a polymer, such as polybenzoxazole (PBO), polyimide (PI), benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

Referring to FIG. 1B, taper-shaped conductive pillars 116$t$ are formed on the bottom dielectric layer 108. Specifically, the taper-shaped conductive pillars 116$t$ are tapered from the end connecting the bottom dielectric layer 108.

Figure 1D:
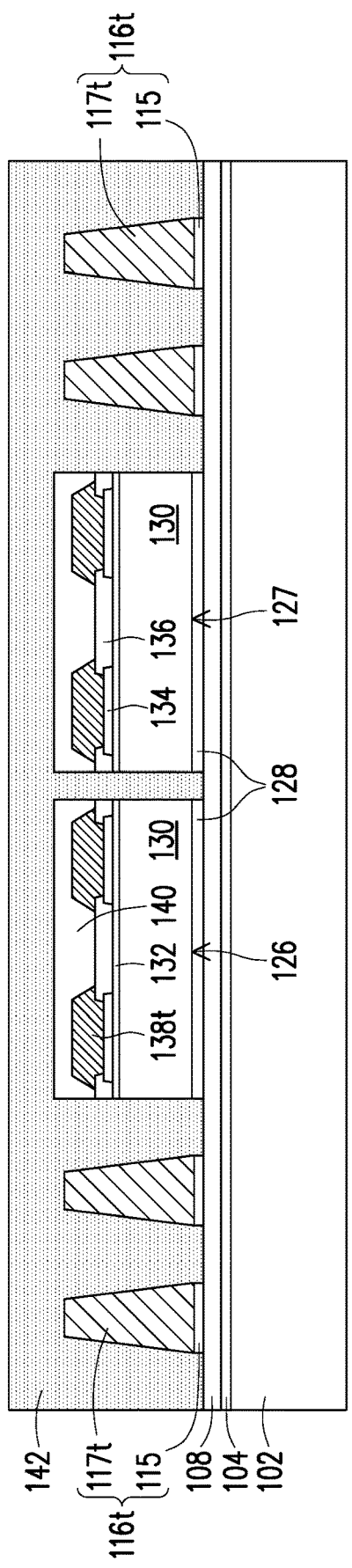

The taper-shaped conductive pillars 116$t$ are used to prevent forming bubbles at the end of the taper-shaped conductive pillars connecting the bottom dielectric layer 108 during the process of forming the molding compound, which is to be shown in FIG. 1D. The structures of the taper-shaped conductive pillars 116$t$ will be discussed in detail in later paragraphs and in FIGS. 4A and 4B.

The method of forming the taper-shaped conductive pillar is shown in FIGS. 2A-1 to 2A-7 and FIG. 20.

Figures 1, 2A:
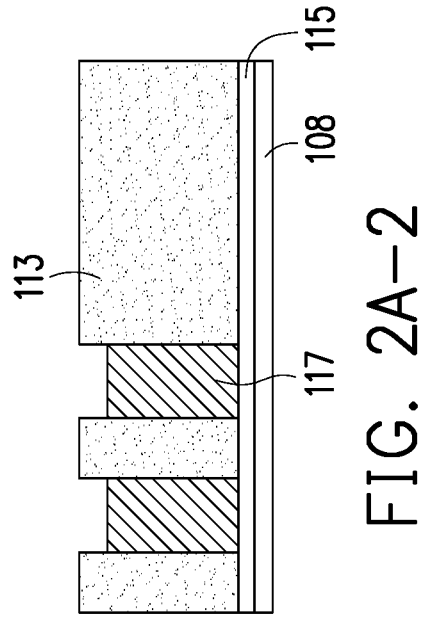
Figure 20:
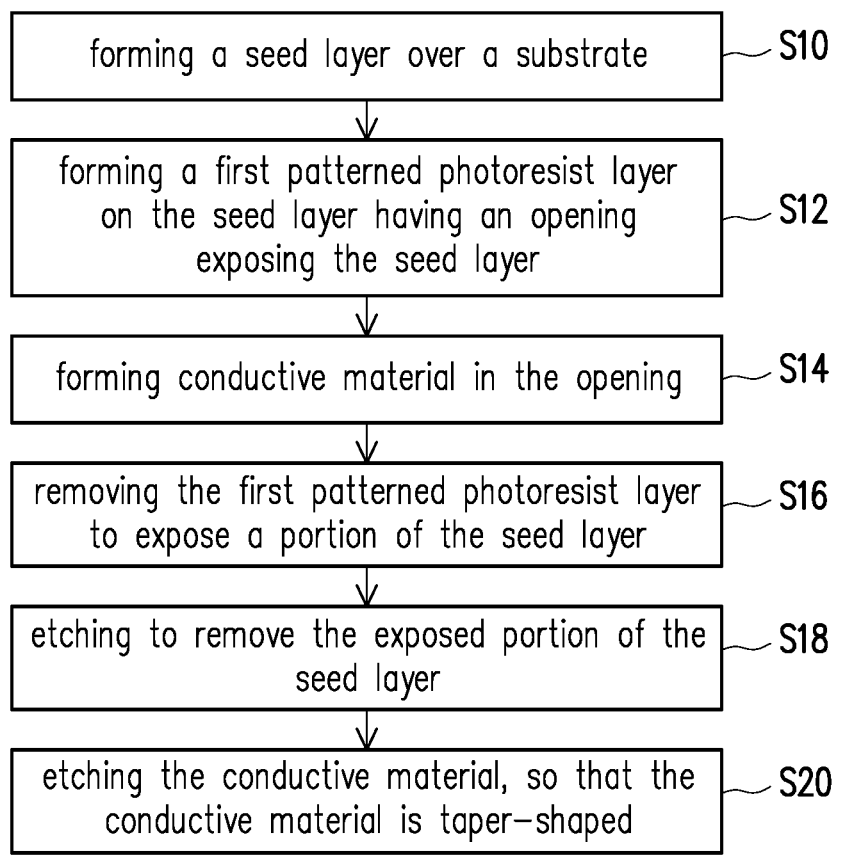
FIG. 20 illustrates a block diagram of a method for forming a conductive feature according to the disclosure.

Referring to FIG. 2A-1 and Step S10 of FIG. 20, a seed layer 115 is formed on the bottom dielectric layer 108. In some embodiments, the seed layer 115 is a metal layer, which may be a single layer or a composite layer comprising a plurality of sub-layers formed of different materials. For example, the seed layer 115 includes a titanium layer and a copper layer over the titanium layer. The seed layer 115 may be formed by using, for example, physical vapor deposition (PVD) or the like.

Referring to FIG. 2A-1 and step S12 of FIG. 20, a photoresist 113 is formed and patterned on the seed layer 115. The photoresist 113 may be formed by spin coating or the like and may be exposed to light for patterning. The patterning forms openings 119 through the photoresist 113 to expose the seed layer 115. The openings 119 of the photoresist 113 have substantial vertical profiles. After the photoresist 113 is patterned, the photoresist 113 may be referred to as a patterned mask layer.

Figures 2, 2A:
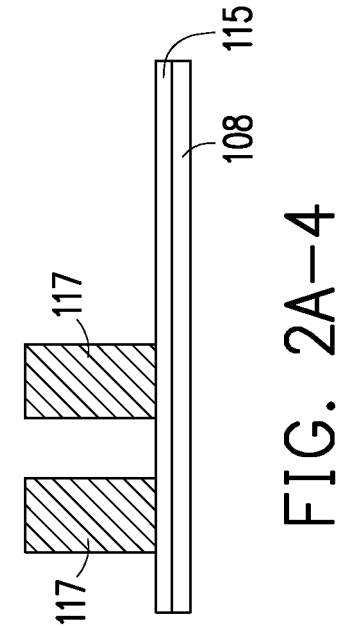

Referring to FIG. 2A-2 and step S14 of FIG. 20, a conductive material 117 is formed in the openings 119 of the photoresist 113 and on the exposed portions of the seed layer 115. The conductive material 117 may be formed by plating, such as electroplating, electroless plating, or the like. The conductive material 117 may include a metal, such as copper, titanium, tungsten, aluminum, or the like. Since the openings 119 of the photoresist 113 have substantial vertical profiles, the conductive material 117 formed in the openings 119 also have substantial vertical profiles.

Figures 2, 2A, 3:
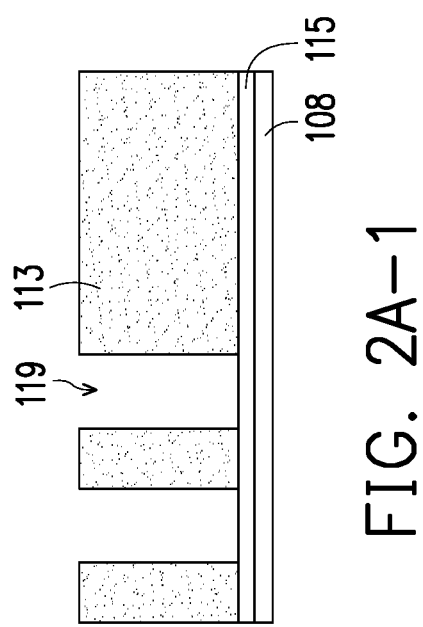
Figures 2, 2A, 3, 4:
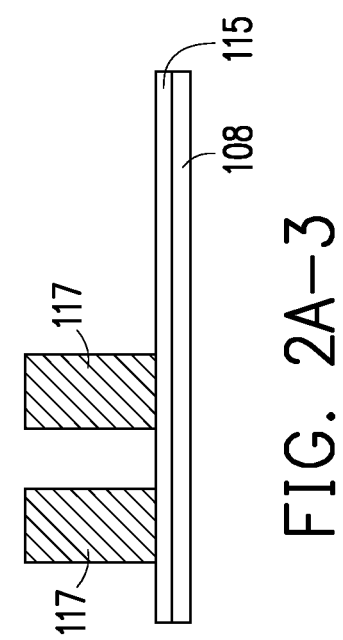
Figures 1, 2B:
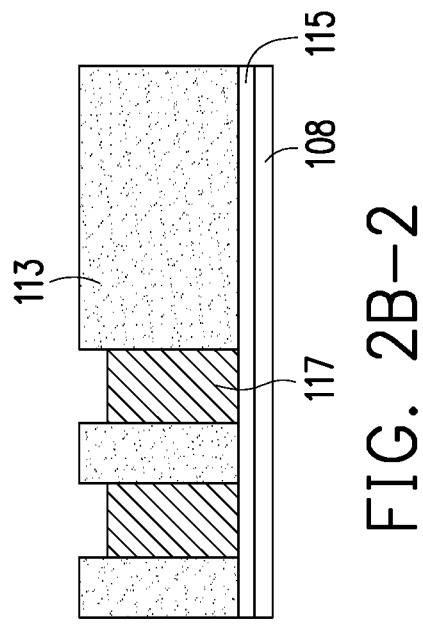
Figures 2, 2B:
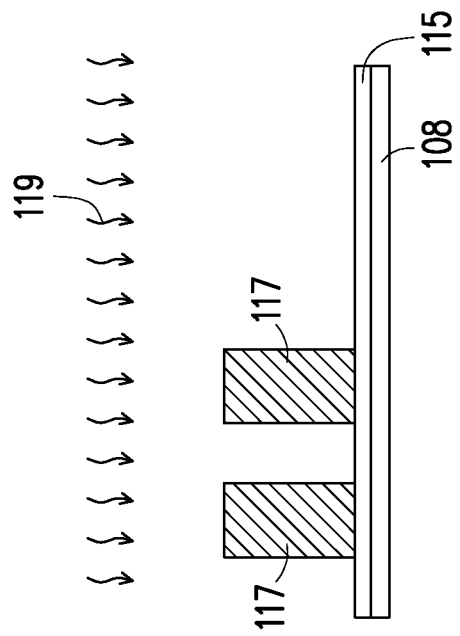
Figures 2, 2B, 3:
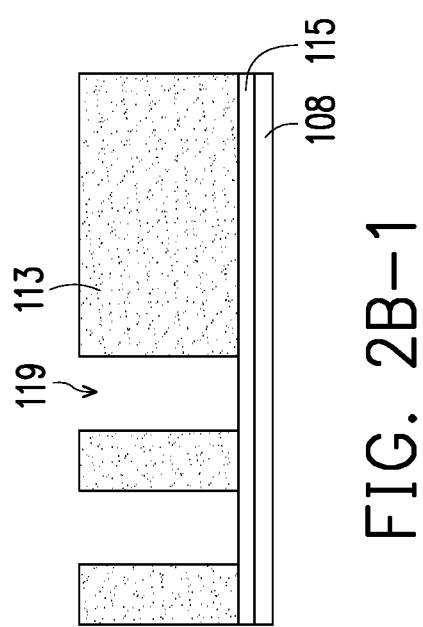
Figures 2, 2B, 3, 4:
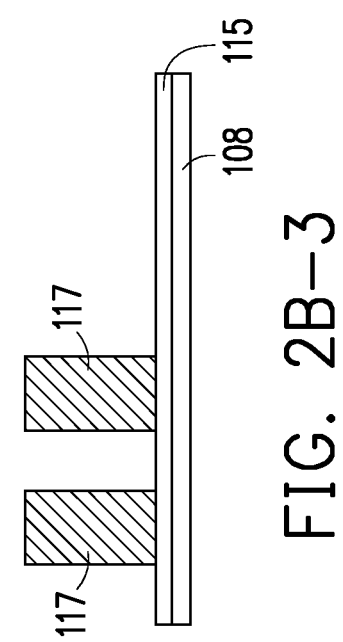

Referring to FIG. 2A-3 and step S16 of FIG. 20, the photoresist 113 is removed to expose a portion of the seed layer 115. The photoresist 113 may be removed by an acceptable ashing or stripping process, such as using an oxygen plasma or the like, for example.

Referring to FIGS. 2A-4 and 2A-5, and step S18 of FIG. 20, once the photoresist 113 is removed, etching the exposed portion of the seed layer 115 by using an acceptable etching process 118, such as by a wet or dry etching process, so the exposed portion of the seed layer 115 is removed. In some embodiments, a clean process may be additionally performed after the etching process 118.

In some embodiments, the etching process 118 to etch the seed layer 115 is a wet etching process. The etchant used in the wet etching process may include hydrogen peroxide ($H_2O_2$), phosphoric acid ($H_3PO_4$), sulfuric acid ($H_2SO_4$) or a combination thereof. In some embodiments, the wetting agent is also added in the etching solution. In some embodiments, the wetting agent can be anionic surfactant (e.g. sodium dodecyl sulfate, sodium dodecyl benzene sulfate), cationic surfactant (e.g. cetyltrimethylammonium bromide, benzethonium chloride), non-ionic surfactant (e.g. propanesulfonic acid, poloxamers), and water-soluble polymers (e.g. polyethylene glycol, polyvinyl alcohol). The etching process time of the wet etching process is about 0.1 to 10 min. The temperature of the wet etching process is about 15-65° C. During the wet etching process for the seed layer 115, the conductive material 117 may also be etched. By adding the wetting agent, the wet etching to the seed layer 115 and the conductive material 117 is anisotropic, and the etching rate at the top surface of the conductive material 117 and the sidewall of the conductive material 117 is different, with very little etching at the sidewall of the conductive material 117. After the wet etching process 118, the seed layer 115 is etched, and the sidewall of the conductive material 117 is relatively uniformly etched or slightly tapered at the top of the conductive material 117, as shown in FIG. 2A-5.

In some embodiments, the etching process 118 is a dry etching process. The gas used in the dry etching process 118 may include argon, a mixture of argon/oxygen, argon/nitrogen, argon/helium or other gas mixture containing argon. The processing time of the dry etching process 119 may be about 0.1 to 60 minutes, and the processing temperature of the dry etching process may be between 15-150° C. When the etching process 118 is a dry etching process, the etching process 118 is an anisotropic etching process, and the etching rate at the top surface of the conductive material 117 and the sidewall of the conductive material 117 is different, with very little etching at the sidewall of the conductive material 117. After the dry etching process 118, the seed layer 115 is etched, and the sidewall of the conductive material 117 is relatively uniform or slightly tapered at the top of the conductive material 117, which is similar to the result of the wet etching process, as shown in FIG. 2A-5.

Referring to FIGS. 2A-5 and 2A-6 and step S20 of FIG. 20, after the exposed portion of the seed layer 115 is removed, the conductive material 117 is treated to form a taper-shaped conductive material. The treatment may be using an acceptable etching process 119, such as a wet etching process. The etching solution used in the etching process 119 is similar to the wet etching process 118, but without adding the wetting agent in the etching solution.

During the etching process 119, without the wetting agent in the etching solution, the etching of the conductive material 117 is an isotropic etching process. As a result, the etching rate at the edge of the top surface of the conductive material 117 is faster than the edge of the bottom surface of the conductive material 117. As a result, after the etching process 119, the conductive material 117 is etched to a taper-shaped conductive material 117t, as shown in FIG. 2A-7.

Referring to FIG. 2A-7, after the etching process 119, the conductive material 117 is etched and has a taper-shaped profile which becomes a taper-shaped conductive material 117t. The taper-shaped conductive material 117t is tapered from the dielectric layer 108. The seed layer 115 and the taper-shaped conductive material 117t together form the taper-shaped conductive pillars 116t. In some embodiments, after the taper-shaped conductive pillars 116t are formed, a clean process may be additionally performed to surfaces of the taper-shaped conductive pillars 116t and the dielectric layer 108.

The etching process shown in FIGS. 2A-1 to 2A-7 and FIG. 20 for forming taper-shaped conductive material 117t may also be referred as a two-step etching process, since etching process 118 and 119 are involved to form the taper-shaped conductive material 117t.

In some embodiments, the taper-shaped conductive material 117t may be formed in the method shown in FIGS. 2B-1 to 2B-5.

Referring to FIGS. 2B-1 to 2B-3, which are similar to methods described in FIGS. 2A-1 to 2A-3, therefore, the method is not repeat hereof.

Referring to FIG. 2B-4, the conductive material 117 and the seed layer 115 are etched by etching process 119, wherein the etching solution is similar to the etching solution used in etching process 119 in FIG. 2A-6, which is without the wetting agent. Without the wetting agent, the wet etching process 119 is isotropic, the etching rate at the edge of the top surface of the conductive material 117 is faster than the edge of the bottom surface of the conductive material 117. As a result, after the etching process 119, the seed layer 115 is removed, and the conductive material 117 is etched to a taper-shaped conductive material 117t, as shown in FIG. 2B-5. Comparing to FIGS. 2A-1 to 2A-7, the seed layer 115 and the conductive material 117 are etched in the same process 119 which etches the seed layer 115 forms the taper-shaped conductive material 117t. The method described in FIGS. 2B-1 to 2B-5 for forming taper-shaped conductive material 117t may also be referred as one step process, since only one etching process 119 is involved.

In some embodiments, the taper-shaped conductive material 117t may be formed in the method shown in FIGS. 2C-1 to 2C-5.

Figures 2, 2C:
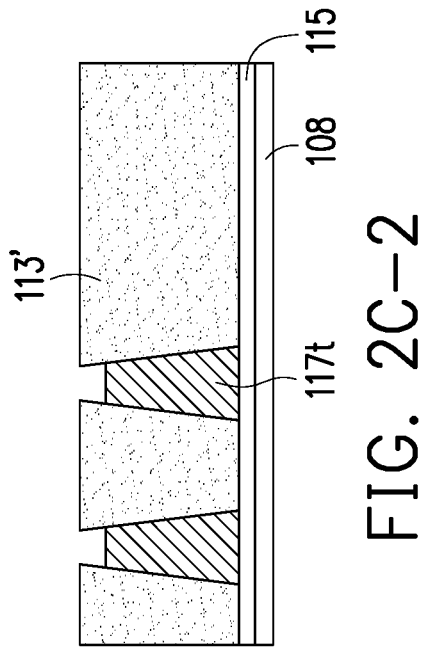
Figures 1, 2C:
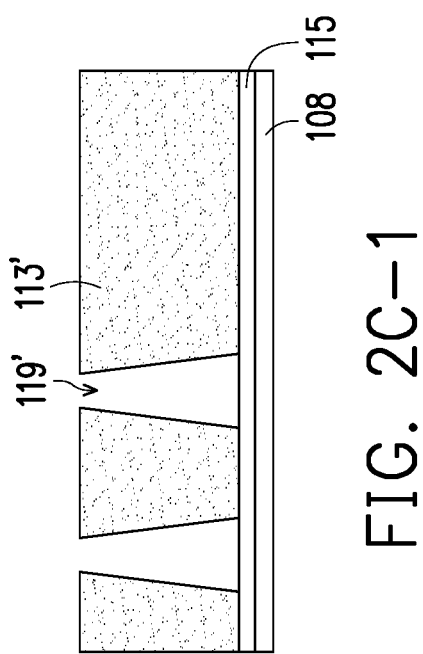
Figures 2, 2C, 3, 4:
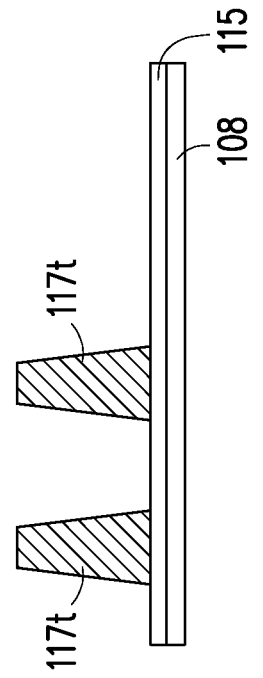
Figures 2, 2C, 3:
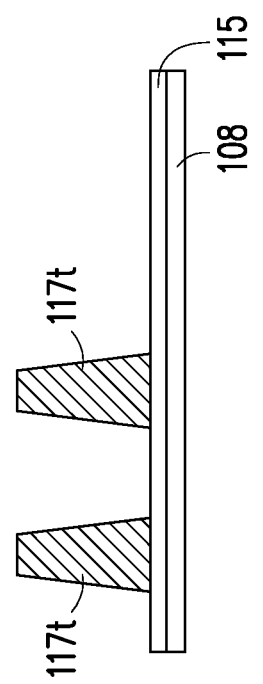

Referring to FIG. 2C-1, similar to FIG. 2A-1, a seed layer 115 is formed on the bottom dielectric layer 108, and a photoresist 113' with openings 119' is formed and patterned on the seed layer 115. The difference between the photoresist 113' and openings 119' shown in FIG. 2C-1 and the photoresist 113 and the openings 119 is that the photoresist 113' is defined to an undercut pattern so the openings 119' has a trapezoid shape, which the openings 119' near the seed layer 115 are wider then the opening 119' away from the seed layer 115. The patterning of the photoresist 113' and the forming of the openings 119' may be controlled through the type of photoresist, the energy and exposing time of lithography, and the developing condition after the lithography.

Referring to FIG. 2C-2, a conductive material 117t is formed in the openings 119' of the photoresist 113' and on the exposed portions of the seed layer 115. The material and the forming process are similar to the conductive material 117, which is not repeat hereof. Since the openings 119' are narrow at the top surface of the photoresist 113' and wide at the bottom surface of the photo resist 113', the taper-shaped conductive material 117t may be formed on the seed layer 115 directly.

Referring to FIG. 2C-3, the photoresist 113' is removed to expose a portion of the seed layer 115. The photoresist 113' may be removed by methods similar to remove photoresist 113.

Referring to FIG. 2C-4, once the photoresist 113' is removed, etching the exposed portion of the seed layer 115 by using an acceptable etching process 118, which is similar to the etching process 118 described in FIG. 2A-4.

Referring to FIG. 2C-5, after the exposed portion of the seed layer 115 is removed by etching process 118, the remaining portion of the seed layer 115 and the taper-shaped conductive material 117t together form the taper-shaped conductive pillars 116t over the dielectric layer 108.

Referring back to FIG. 1C, after the taper-shaped conductive pillars 116t are formed, integrated circuit (IC) dies 126 and 127 are adhered to the release layer 104 by an adhesive 128. The IC dies 126 and 127 are attached laterally aside the taper-shaped conductive pillars 116*t*. The IC dies 126 and 127 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the IC dies 126 and 127 may have different sizes (e.g., different heights and/or surface areas). In alternative embodiments, the IC dies 126 and 127 may have the same size (e.g., same heights and/or surface areas).

The IC dies 126 and 127 may include taper-shaped die connectors 138*t*. The taper-shaped die connectors 138*t* are formed on the pads 134 and the passivation films 136. The taper-shaped die connectors 138*t* are tapered from the end connecting the pads 134. The taper-shaped die connectors 138*t* is encapsulated by dielectric layer 140.

Figure 3A:
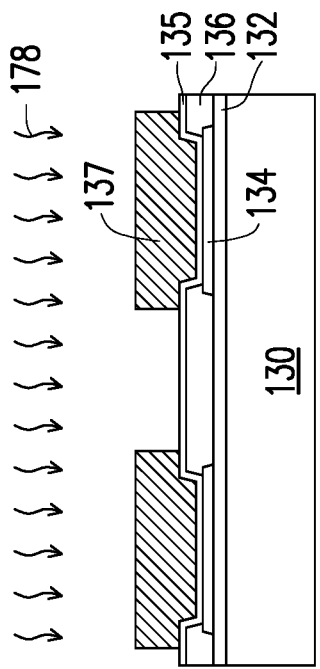
FIGS. 3A through 3G are schematic cross-sectional views illustrating a method of manufacturing IC dies according to some embodiments of the disclosure.
Figure 3B:
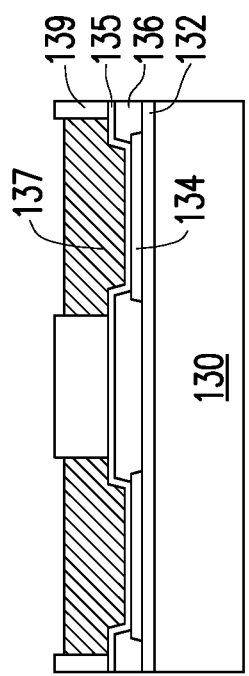
Figure 3C:
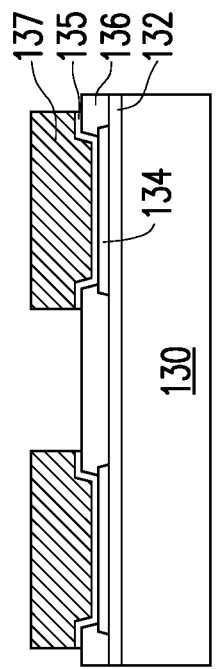
Figure 3D:
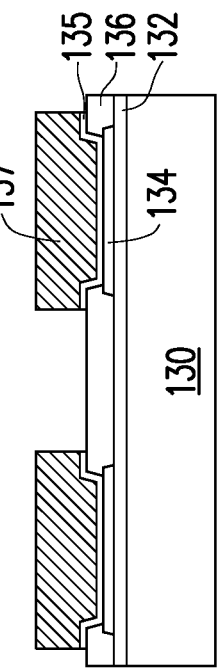
Figure 3E:
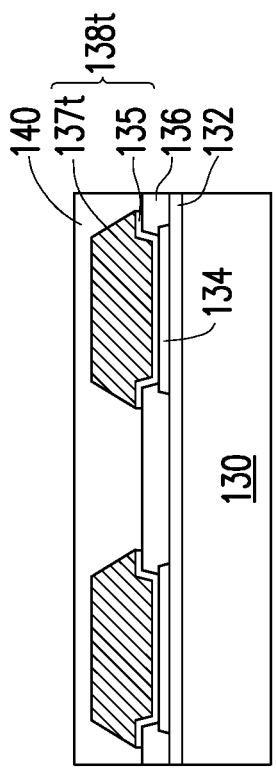

The taper-shaped die connectors 138*t* are used to prevent forming bubbles at the end of the die connectors 138*t* connecting the passivation films 136 when being encapsulated by the dielectric layer 140, which is to be shown in FIG. 3E. The properties of the taper-shaped die connectors 138*t* will be discussed in detail in later paragraphs and in FIG. 4B.

Referring to FIG. 1C, before being adhered to the bottom dielectric layer 108, the IC dies 126 and 127 may be processed according to applicable manufacturing processes to form integrated circuits in the IC dies 126 and 127. The process for forming the IC dies 126 and 127 are shown in FIGS. 3A to 3G.

FIGS. 3A to 3G are schematic cross-sectional views illustrating a method of manufacturing IC die 126 according to some embodiments of the disclosure.

Referring to FIG. 3A, as an example to form the IC die 126, devices (not shown) and an interconnect structure 132 are formed on a semiconductor substrate (or referred to as a wafer) 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

Pads 134 are formed on the interconnect structures 132, such as aluminum pads, to which external connections are made. The pads 134 are on what may be referred to as respective active sides of the IC die 126. A passivation film 136 is formed on the interconnect structure 132 and on portions of the pads 134. Openings are formed on the passivation film 136 and extend through the passivation film 136 to the pads 134.

Referring to FIG. 3A, a seed layer 135 is formed over the pad 134 and the passivation film 136 and in the openings extending through the passivation film 136. In some embodiments, the seed layer 135 is a metal layer, which may be a single layer or a composite layer comprising a plurality of sub-layers formed of different materials. In some embodiments, the seed layer 135 includes a titanium layer and a copper layer over the titanium layer, which is similar to the seed layer 115 which includes a titanium layer and a copper layer. The seed layer 135 may be formed using, for example, PVD or the like.

Referring to FIG. 3A, a photoresist 139 is then formed and patterned on the seed layer 135. The photoresist 139 may be formed by spin coating or the like and may be exposed to light for patterning. The pattern of the photoresist 139 corresponds to the die connectors 138. The patterning forms via openings through the photoresist 139 to expose the seed layer 135.

Referring to FIG. 3A, a conductive material 137 is then formed in the via openings of the photoresist 139 and on the exposed portions of the seed layer 135. In some embodiments, the conductive material 137 may include a conductive material such as copper, aluminum, gold, nickel, palladium, the like, or a combination thereof, and may be formed by sputtering, printing, electro plating, electroless plating, CVD, or the like.

Referring to FIG. 3B, the photoresist 139 is removed. The photoresist 139 may be removed by an acceptable ashing or stripping process, such as using an oxygen plasma or the like.

Referring to FIG. 3B and step S18 of FIG. 20, once the photoresist 139 is removed, etching the exposed portion of the seed layer 135 by using an acceptable etching process 178, such as etching process similar to the etching process shown in FIGS. 2A-4 to 2A-6.

Referring to FIG. 3C, after the etching process 178, the exposed portion of the seed layer 135 is removed. A portion of the seed layer 135 and a conductive material 137 are left.

Referring to FIG. 3D and step S20 of FIG. 20, the conductive material 137 is treated to form a taper-shaped conductive material. The treatment may be using an acceptable etching process 179, such as by a wet etching process similar to the etching process 119. In some embodiments, a clean process may be additionally performed after the etching process 179.

Referring to FIG. 3E, after the etching process 179, the conductive material 137 is etched and has a taper-shaped profile which becomes a taper-shaped conductive material 137*t*. The taper-shaped conductive material 137*t* is tapered from the end connecting the pad 134. The seed layer 135 and the taper-shaped conductive material 137*t* together form the taper-shaped die connectors 138*t*. In some embodiments, after the taper-shaped die connectors 138*t* are formed, a clean process may be additionally performed to surfaces of the taper-shaped die connectors 138*t* and the passivation films 136.

The taper-shaped die connectors 138*t* (for example, comprising a metal such as copper) extend through the openings in the passivation films 136 and are mechanically and electrically coupled to the corresponding pads 134. The taper-shaped die connectors 138*t* may be formed by, for example, plating, or the like. The taper-shaped die connectors 138*t* electrically couple the corresponding integrated circuits of the IC dies 126 and 127 as shown in FIG. 1C.

Figure 3F:
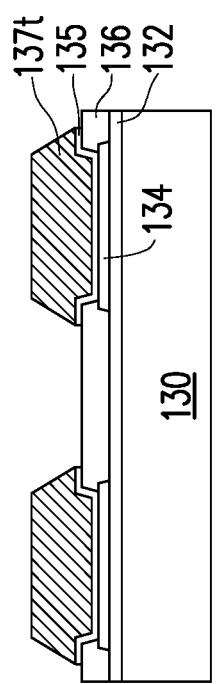

Referring to FIG. 3F, a dielectric layer 140 is formed on the active sides of the IC dies 126, such as on the passivation films 136 and the taper-shaped die connectors 138*t*. The dielectric layer 140 laterally encapsulates the taper-shaped die connectors 138*t*. The dielectric layer 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

With the taper-shaped die connectors 138t, the polymer with high viscosity used for dielectric layer 140 fills between the space of the fine pitch taper-shaped die connectors 138t without forming bubbles at the end of the taper-shaped die connectors 138t connecting the passivation films 136 after polymer coating and/or curing. Detailed structures of the taper-shaped die connectors 138t will be discussed in later paragraphs and in FIG. 4B. In some embodiments, the dielectric layer 140 may be omitted and the taper-shaped die connectors 138t and the passivation films 136 are exposed.

Figure 3G:
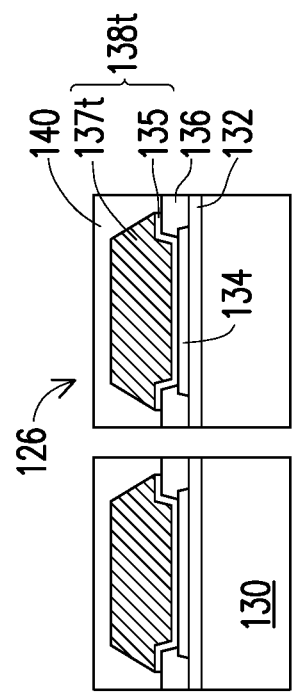

Referring to FIG. 3G, a die-saw (singulation) step is performed on the wafer to separate the wafer into a plurality of IC dies 126. In some embodiments, the singulation process may include sawing, laser ablation, etching, a combination thereof, or the like. In some embodiments, the taper-shaped die connectors 138t may also be formed by methods described in FIGS. 2B-1 to 2B-5 or 2C-1 to 2C-5.

Referring back to FIG. 1C, the IC dies 126 and 127 are adhered to the release layer 104 by an adhesive 128 after a release layer 104 and a bottom dielectric layer 108 are formed on the carrier substrate 102, and taper-shaped conductive pillars (or referred to as through vias) 116t are formed on the bottom dielectric layer 108. In some embodiments, the back-side surface may be referred to as non-active surfaces. The back-side surfaces are opposite to front-side surfaces, and the non-active surfaces are opposite to active side surfaces. The adhesive 128 may be applied to the back-side surfaces of the IC dies 126 and 127 before singulating to separate the IC dies 126 and 127. The adhesive 128 may be any suitable adhesive, epoxy, die attach film (DAF), or the like.

Referring to FIG. 1D, an encapsulant 142 is formed on the various components. After formation, the encapsulant 142 laterally encapsulates the taper-shaped conductive pillars 116t and IC dies 126 and 127. In some embodiments, the encapsulant 142 includes a molding compound, a molding underfill, a resin such as epoxy, a combination thereof, or the like. In some other embodiments, the encapsulant 142 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 142 includes nitride such as silicon nitride, oxide such as silicon oxide, phosphosilicate glass (PSG), borosilicate glass (BSG), boron-doped phosphosilicate glass (BPSG), a combination thereof, or the like.

The encapsulant 142 may be applied by compression molding, transfer molding, spin-coating, lamination, deposition, or similar processes, and may be formed over the carrier substrate 102 such that the taper-shaped conductive pillars 116t and/or the IC dies 126 and 127 are buried or covered. The encapsulant 142 is then cured.

In some embodiments in which the IC dies 126 and 127 do not include the dielectric layer 140, the encapsulant 142 is also formed on the active sides of the IC dies 126 and 127 to encapsulate the passivation films 136 and the taper-shaped die connectors 138t.

With the taper-shaped conductive pillars 116t, the polymer with high viscosity used for encapsulant 142 may fill the space between the taper-shaped conductive pillars 116t without forming bubbles at the end of the taper-shaped conductive pillars 116t connecting the bottom dielectric layer 108 after polymer coating and/or curing. Detailed structures of the taper-shaped conductive pillars 116t will be discussed in later paragraphs and in FIG. 4A.

In a process of forming the molding compound shown in FIG. 1D or a coating process shown in FIG. 3F, the conductive connectors, such as conductive pillars 116t or die connectors 138t, and the layer which the conductive connectors are formed on, such as the dielectric layer 108 for conductive pillars 116t or the pads 134 and the passivation layer 136 for die connectors 138t, are encapsulated by dielectric layer 140 and molding compounds 142.

The conductive connectors with taper shape, such as the taper-shaped conductive pillars 116t and taper-shaped die connectors 138t, prevent generating bubbles at the bottom end thereof.

Figure 4B:
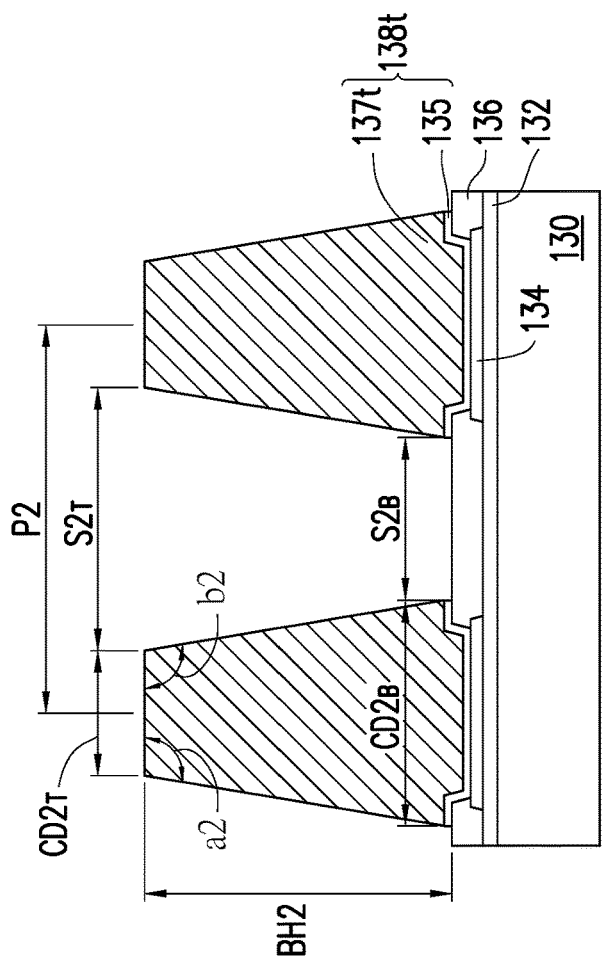
FIGS. 4A and 4B illustrate structures of the conductive pillars and the die connectors according to some embodiments of the disclosure.
Figure 4A:
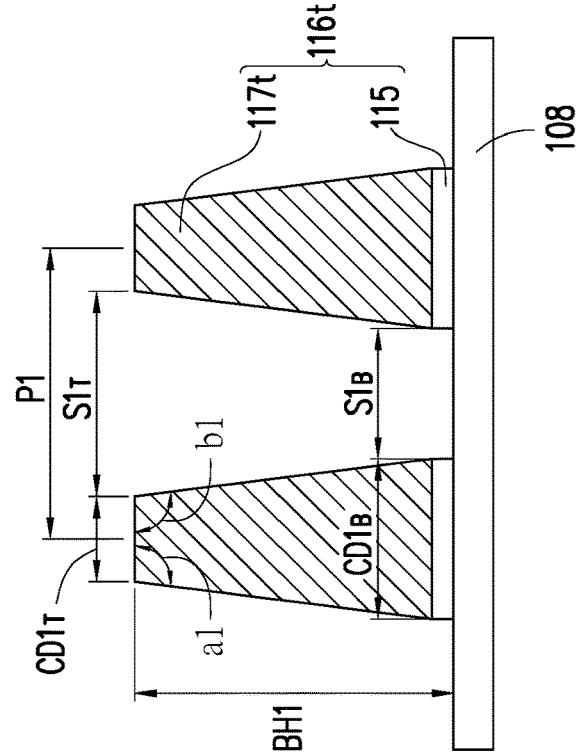

FIG. 4A shows the structures of the taper-shaped conductive pillars 116t, and FIG. 4B shows the structures of the taper-shaped die connectors 138t.

FIG. 4A shows the structures of the taper-shaped conductive pillars 116t. In order to prevent forming bubbles during the encapsulation process, taper-shaped conductive pillars 116t are formed, as shown in FIGS. 2A-1 to 2A-7, 2B-1 to 2B-5 or 2C-1 to 2C-5.

The taper-shaped conductive pillars 116t has dimension $CD1_T$, dimension $CD1_B$, and a height BH1. The dimension $CD1_T$ of the taper-shaped conductive pillars 116t is the width of the top end of the taper-shaped conductive pillars 116t, which does not connect with the dielectric layer 108. The dimension $CD1_B$ of the taper-shaped conductive pillars 116t is the width of the bottom end thereof. The height BH1 of the taper-shaped conductive pillars 116t is the height of the top end of the taper-shaped conductive pillars 116t to the bottom end of the taper-shaped conductive pillars 116t.

The dimension $CD1_T$ of the taper-shaped conductive pillars 116t is less than the dimension $CD1_B$ of the taper-shaped conductive pillars 116t. In some embodiments, the dimension $CD1_B$ of the taper-shaped conductive pillars 116t is less than 15 µm. In some embodiments, the dimension $CD1_T$ of the taper-shaped conductive pillars 116t is less than 15 µm. In some embodiments, the ratio of dimension $CD1_B$ to dimension $CD1_T$ of the taper-shaped conductive pillars 116t is larger than 1 and is smaller or equal to 3.

In some embodiments, the angles a1 and b1 between the top side (the shorter side) of the taper-shaped conductive pillars 116t and each of the two lateral sides of the conductive pillars 116t are both larger than 90 degrees. In some embodiments, the angle a1 is different from the angle b1. In some embodiments, the angle a1 is the same as angle b1. In some embodiments, at least one of the angles a1 or b1 is larger than 90 degrees. In some embodiments, the angles a1 and b1 are larger than 90 degrees and smaller than 135 degrees. In some embodiments, the angles a1 and b1 are larger than 90 degrees and smaller than 135 degrees.

In some embodiments, the height BH1 of the taper-shaped conductive pillars 116t is larger than 80 µm. In some embodiments, the ratio of the height BH1 to the dimension $CD1_B$ of the taper-shaped conductive pillars 116t, $BH1/CD1_B$, is larger than or equal to 5. In some embodiments, the ratio of the height BH1 to the dimension $CD1_T$ of the taper-shaped conductive pillars 116t, $BH1/CD1_T$, is larger than or equal to 5.

The pitch P1 is a distance between the centers of the adjacent taper-shaped conductive pillars 116t. In some embodiments, a ratio of the pitch P1 to the dimension $CD1_B$ is larger than or equal to 3. In some embodiments, the pitch P1 between the adjacent taper-shaped conductive pillars 116t is less than 45 µm.

The space $S1_B$ is a distance between the opposing bottom sides, or the bottom end, of the adjacent taper-shaped conductive pillars 116t connecting the dielectric layer 108. In some embodiments, the space $S1_B$ between the adjacent taper-shaped conductive pillars 116t is less than 30 μm. In some embodiments, the space $S1_B$ between the adjacent taper-shaped conductive pillars 116t is substantially similar to the dimension $CD1_B$ of the taper-shaped conductive pillars 116t. In some embodiments, the ratio of the height BH1 of the conductive pillars 116t to the space $S1_B$ between the adjacent taper-shaped conductive pillars 116t, $BH1/S1_B$, is larger than or equal to 5.

The space $S1_T$ is a distance between the opposing top sides, or the top end of the adjacent taper-shaped conductive pillars 116t not connecting the dielectric layer 108. The space $S1_T$ is larger than the space $S1_B$. In some embodiments, the space $S1_T$ between the adjacent taper-shaped conductive pillars 116t is larger than or equal to the dimension $CD1_T$ of the taper-shaped conductive pillars 116t. In some embodiments, the ratio of the height BH1 of the conductive pillars 116t to the space $S1_T$ between the adjacent taper-shaped conductive pillars 116t, $BH1/S1_T$, is larger than or equal to 1.33. In some embodiments, the ratio of the height BH1 of the conductive pillars 116t to the space $S1_B$ between the adjacent taper-shaped conductive pillars 116t, $BH1/S1_B$, is larger than or equal to 2.

FIG. 4B shows the structures of the taper-shaped die connectors 138t. In order to prevent forming bubbles during the encapsulation process, taper-shaped die connectors 138t are formed, as shown in FIGS. 3A-3G.

The taper-shaped die connectors 138t has dimension $CD2_T$, dimension $CD2_B$, and a height BH2. The dimension $CD2_T$ of the taper-shaped die connectors 138t is the width of the top end of the taper-shaped die connectors 138t which does not connect with the pad 134. The dimension $CD2_B$ of the taper-shaped die connectors 138t is the width of the bottom end thereof. The height BH2 of the taper-shaped die connectors 138t is the height of the top end of the taper-shaped die connectors 138t to the bottom end of the taper-shaped die connectors 138t.

The dimension $CD2_T$ of the taper-shaped die connectors 138t is less than the dimension $CD2_B$ of the taper-shaped die connectors 138t. In some embodiments, the dimension $CD2_T$ of the taper-shaped die connectors 138t is less than 15 μm. In some embodiments, the dimension $CD2_B$ of the taper-shaped die connectors 138t is less than 15 μm. In some embodiments, the ratio of dimension $CD2_B$ to dimension $CD2_T$ of the taper-shaped die connectors 138t is larger than 1 and is smaller or equal to 3.

In some embodiments, the angles a2 and b2 between the top side (the shorter side) of the taper-shaped die connectors 138t and each of the two lateral sides of the die connectors 138t are both larger than 90 degrees. In some embodiments, the angle a2 is different from the angle b2. In some embodiments, the angle a2 is the same as angle b2. In some embodiments, the angles a2 and b2 are larger than 90 degrees and smaller than 135 degrees. In some embodiments, the angles a2 and b2 are larger than 90 degrees and smaller than 135 degrees.

In some embodiments, the height BH2 of the taper-shaped die connectors 138t is larger than 30 μm. In some embodiments, the ratio of the height BH2 to the dimension $CD2_B$ of the taper-shaped die connectors, $BH2/CD2_B$, is larger than or equal to 2. In some embodiments, the ratio of the height BH2 to the dimension $CD2_T$ of the taper-shaped die connectors 138t, $BH2/CD2_T$, is larger than or equal to 2.

The pitch P2 is a distance between the centers of the adjacent taper-shaped die connectors 138t. In some embodiments, a ratio of the pitch P2 to the dimension $CD2_B$ is larger than or equal to 2. In some embodiments, the pitch P2 between the adjacent taper-shaped die connectors 138t is less than 50 μm.

The space $S2_B$ is a distance between the opposing bottom sides, or the bottom end, of the adjacent taper-shaped die connectors 138t connecting the passivation layer 136. In some embodiments, the space $S2_B$ between the adjacent taper-shaped die connectors 138t is less than 15 μm. In some embodiments, the space $S2_B$ between the adjacent taper-shaped die connectors 138t is substantially similar to the dimension $CD2_B$ of the taper-shaped die connectors 138t. In some embodiments, the ratio of the height BH2 of the die connectors 138t to the space $S2_B$ between the adjacent taper-shaped die connectors 138t, $BH2/S2_B$, is larger or equal to 2.

The space $S2_T$ is a distance between the opposing top sides, or the top end of the adjacent taper-shaped die connectors 138t not connecting the passivation layer 136. The space $S2_T$ is larger than the space $S2_B$. In some embodiments, the space $S2_T$ between the adjacent taper-shaped die connectors 138t is larger than or equal to the dimension $CD2_T$ of the taper-shaped die connectors 138t. In some embodiments, the ratio of the height BH2 of the die connectors 138t to the space $S2_T$ between the adjacent taper-shaped die connectors 138t, $BH2/S2_T$, is larger than or equal to 1. In some embodiments, the ratio of the height BH2 of the die connectors 138t to the space $S2_T$ between the adjacent taper-shaped die connectors 138t, $BH2/S2_B$, is larger than or equal to 2.

Figure 1E:
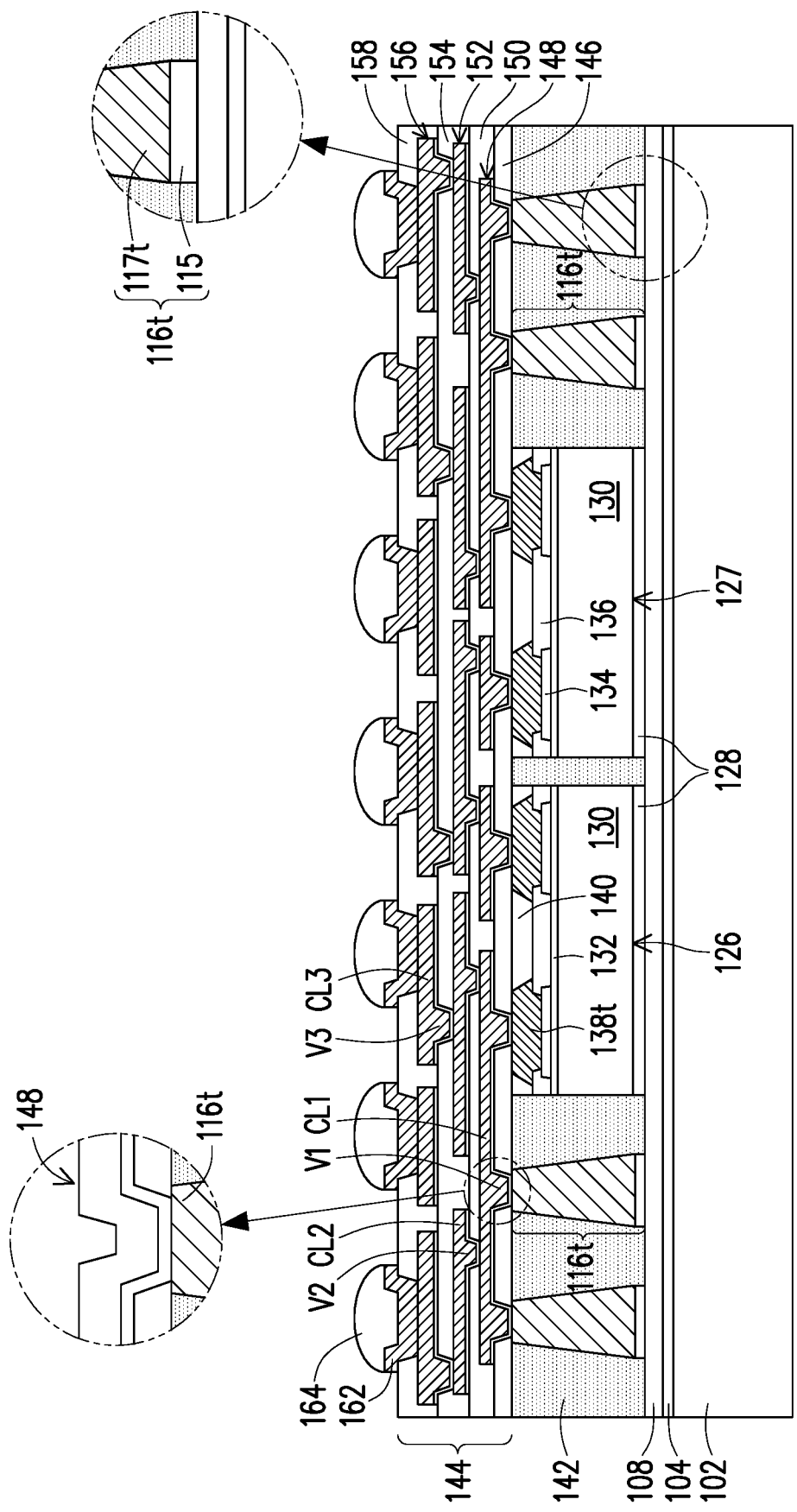

Referring to FIG. 1E, a planarization process is then performed on the encapsulant 142 to remove a portion of the encapsulant 142, such that the top surfaces of the taper-shaped conductive pillars 116t and the taper-shaped die connectors 138t are exposed. In some embodiments which the top surfaces of the taper-shaped conductive pillars 116t and the front-side surfaces of the IC dies 126 and 127 are not coplanar (as shown in FIG. 1C), portions of the taper-shaped conductive pillars 116t or/and portions of the dielectric layer 140 may also be removed by the planarization process. In some embodiments, top surfaces of the taper-shaped conductive pillars 116t, the taper-shaped die connectors 138t, the dielectric layer 140, and the encapsulant 142 are substantially coplanar after the planarization process. The planarization process may be, for example, a chemical-mechanical polish (CMP), a grinding process, or the like. In some embodiments, the planarization may be omitted, for example, if the taper-shaped conductive pillars 116t and taper-shaped die connectors 138t are already exposed. The taper-shaped conductive pillars 116t penetrate the encapsulant 142, and the taper-shaped conductive pillars 116t are sometimes referred to as taper-shaped through vias 116t or taper-shaped through integrated fan-out vias (TIVs) 116t.

Referring to FIG. 1E, a front-side redistribution structure 144 is formed over front-side surfaces of the IC dies 126 and 127, the taper-shaped through vias 116t, and the encapsulant 142. The front-side redistribution structure 144 includes dielectric layers 146, 150, 154, and 158; metallization patterns 148, 152, and 156; and under bump metallurgies (UBMs) 162. The metallization patterns may also be referred to as redistribution layers or redistribution lines. The front-side redistribution structure 144 is shown as an example. More or fewer dielectric layers and metallization patterns may be formed in the front-side redistribution structure 144. In some embodiments, fewer or more dielectric layers and metallization patterns are possible.

Referring to FIG. 1E, the metallization pattern 148 includes conductive lines on and extending along the top surface of the dielectric layer 146. The metallization pattern 148 further includes conductive vias extending through the dielectric layer 146 to be physically and electrically connect to the taper-shaped through vias 116t and the IC dies 126 and 127. The sidewalls of the conductive vias V1 and the conductive lines CL1 may be straight or inclined. In some embodiments, the conductive vias V1 have inclined sidewall and are tapered toward the IC dies 126 and 127. In addition, the metallization pattern 148 may be a conformal layer, and has a recess on the conductive via.

Referring to FIG. 1E, after the metallization pattern 148 is formed, the dielectric layers 150, 154, 158, and the metallization patterns 152, 156 are formed alternately. The dielectric layer 150, 154, and 158 may be formed in a manner similar to the dielectric layer 146, and may be formed of the same material as the dielectric layer 146. The metallization patterns 152 and 156 may include conductive lines CL2 and CL3 on the underlying dielectric layer and conductive vias V2 and V3 extending through the underlying dielectric layer respectively. The metallization patterns 152 and 156 may be formed in a manner similar to the metallization pattern 148, and may be formed of the same material as the metallization pattern 148. The UBMs 162 are optionally formed on and extending through the dielectric layer 158. The UBMs 162 may be formed in a manner similar to the metallization pattern 148, and may be formed of the same material as the metallization pattern 148.

Referring to FIG. 1E, conductive connectors 164 are formed on the UBMs 162. The conductive connectors 164 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 164 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In another embodiment, the conductive connectors 164 may include a conductive material such as solder, copper, aluminum, gold, nickel, silver, palladium, tin, the like, or a combination thereof. In some embodiments, the conductive connectors 164 are formed by initially forming a layer of solder through such commonly used methods such as evaporation, electroplating, printing, solder transfer, ball placement, or the like. Once a layer of solder has been formed on the structure, a reflow process may be performed in order to shape the material into the desired bump shapes.

Figure 1F:
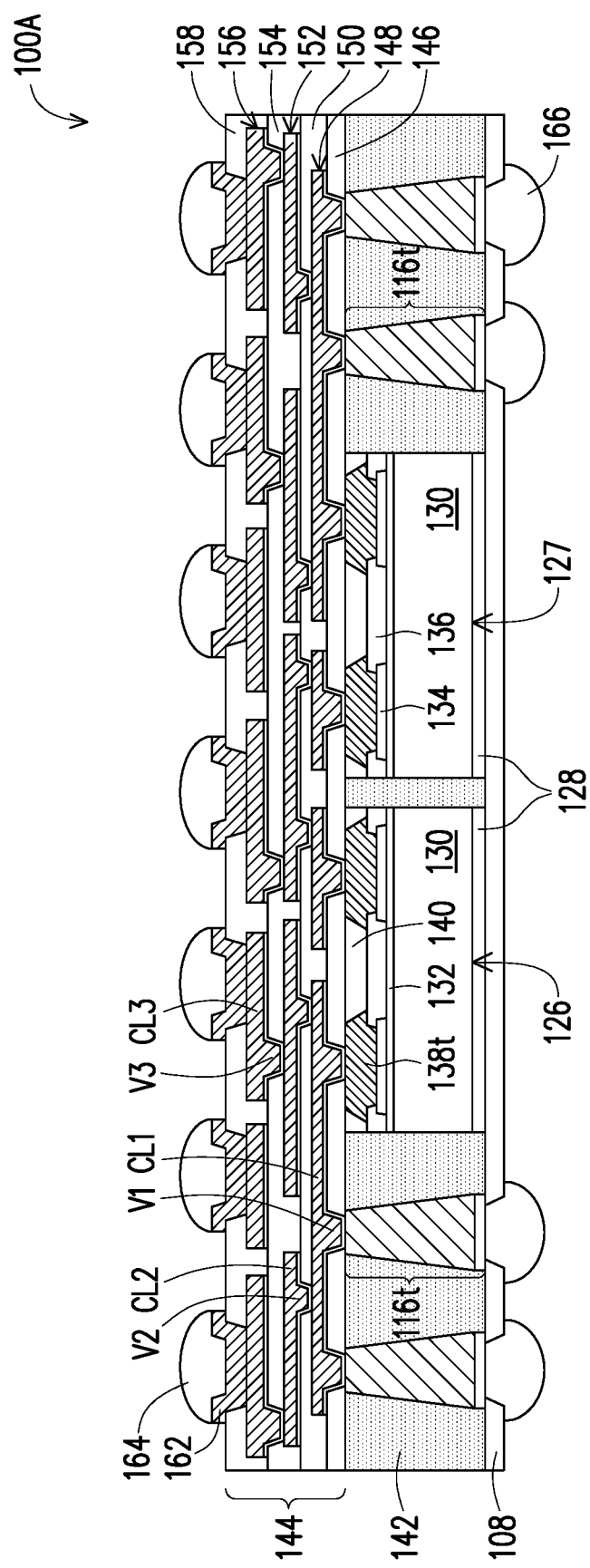

Referring to FIG. 1E and 1F, a carrier substrate debonding is performed to detach (or "de-bond") the carrier substrate 102 from the encapsulant 142 and the adhesive 128 to form a package. In accordance with some embodiments, the de-bonding includes projecting a light such as a laser light or an UV light on the release layer 104 so that the release layer 104 decomposes under the heat of the light and the carrier substrate 102 may be removed. The package is then flipped over and placed on a tape (not shown).

Referring to FIG. 1F, in some embodiments, conductive connectors 166 are formed on the seed layer 115 to electrically connect to the taper-shaped through vias 116t and the IC dies 126 and 127 through the RDL structure 144, and thereby forming a device package 100A. In some embodiments, the conductive connectors 166 may be formed in a manner similar to the conductive connectors 164, and may be formed of the same material as the conductive connectors 164.

Referring to FIG. 1F, the device package 100A has the taper-shaped through vias 116t and the taper-shaped die connectors 138t. Both the taper-shaped through vias 116t and taper-shaped die connectors 138t are tapered in the same direction, which are tapered toward the front-side redistribution structure 144.

The device package 100A also has the conductive vias V1, V2, and V3 in the front-side redistribution layer 144. The conductive vias V1, V2, and V3 are also tapered, and are tapered in a direction which is opposite to the tapered-direction of the taper-shaped through vias 116t and taper-shaped die connectors 138t.

With the taper-shaped through vias 116t and taper-shaped die connectors 138t, when the encapsulant 142 and the dielectric layer 140 are formed, the polymer forming the encapsulant 124 may fill the spaces between the taper-shaped through vias 116t and taper-shaped die connectors 138t completely without forming the bubbles during the process of coating process for forming the dielectric layer.

FIG. 5A to 5F are schematic cross-sectional views illustrating device packages 100B, 100C, 101A, 101B, 101C and 101A' according to some embodiments of the disclosure.

In the above embodiment, such as FIG. 1F, there are two taper-shaped through vias 116t on each side of the IC dies 126 and 127, respectively. In some embodiments, such as FIG. 5A, when the polymer used for encapsulant 142 has low viscosity, the taper-shaped through vias 116t may be replaced with rectangular through vias 116r in the device package 100B. In other embodiments, more or fewer taper-shaped TIVs 116t or rectangular TIVs 116r may be embedded in the encapsulate 142. In addition, the number of TIVs 116t or 116r on either side of IC dies 126 and 127 may be the same or different. Furthermore, there may be no through vias on each side of the IC dies 126 and 127, respectively. For example, in the device package 100C shown in FIG. 5B, there is no through vias on either side of the IC dies 126 and 127.

Furthermore, in the above embodiment, such as FIG. 1F, there is a bottom dielectric layer 108 on the back-side surfaces of the IC dies 126 and 127, the encapsulate 142 and the taper-shaped through vias 116t. In other embodiments, there is no bottom dielectric layer 108 on the back-side surfaces of the IC dies 126 and 127, the encapsulate 142 and the taper-shaped through vias 116t. For example, in the device packages 101A, 101B and 101C shown in FIGS. 5C, 5D and 5E, there are no bottom dielectric layer 108 on the back-side surfaces of the IC dies 126 and 127 and the encapsulate 142, respectively.

In addition, in some embodiments, the bottom dielectric layer 108 may be replaced by a back-side RDL structure 144'. For example, in the device structure 101A' shown in FIG. 5F, the conductive connectors 166 are electrically connected to the taper-shaped through vias 116t through the back-side RDL structure 144'. The back-side RDL structure 144' may be formed in a manner similar to the front-side RDL structure 144, 244 or 344 (described below), and may be formed of the same material as the front-side RDL structure 144, 244 or 344. The back-side RDL structure 144' is shown as an example. More or fewer dielectric layers and metallization patterns may be formed in the back-side RDL structure 144'.

Furthermore, although one IC die 126 and one IC die 127 are illustrated as being adhered in a package region, it should be appreciated that one integrated circuit die 126 or more IC dies 126 and 127 may be adhered in each package region. For example, one integrated circuit die 126 or 127 may be adhered in each region, one integrated circuit die 126 and multiple IC dies 127, multiple IC dies 126 or multiple IC dies 127 may be adhered in each region. Further, the IC dies 126 and 127 may vary in size.

Figure 6A:
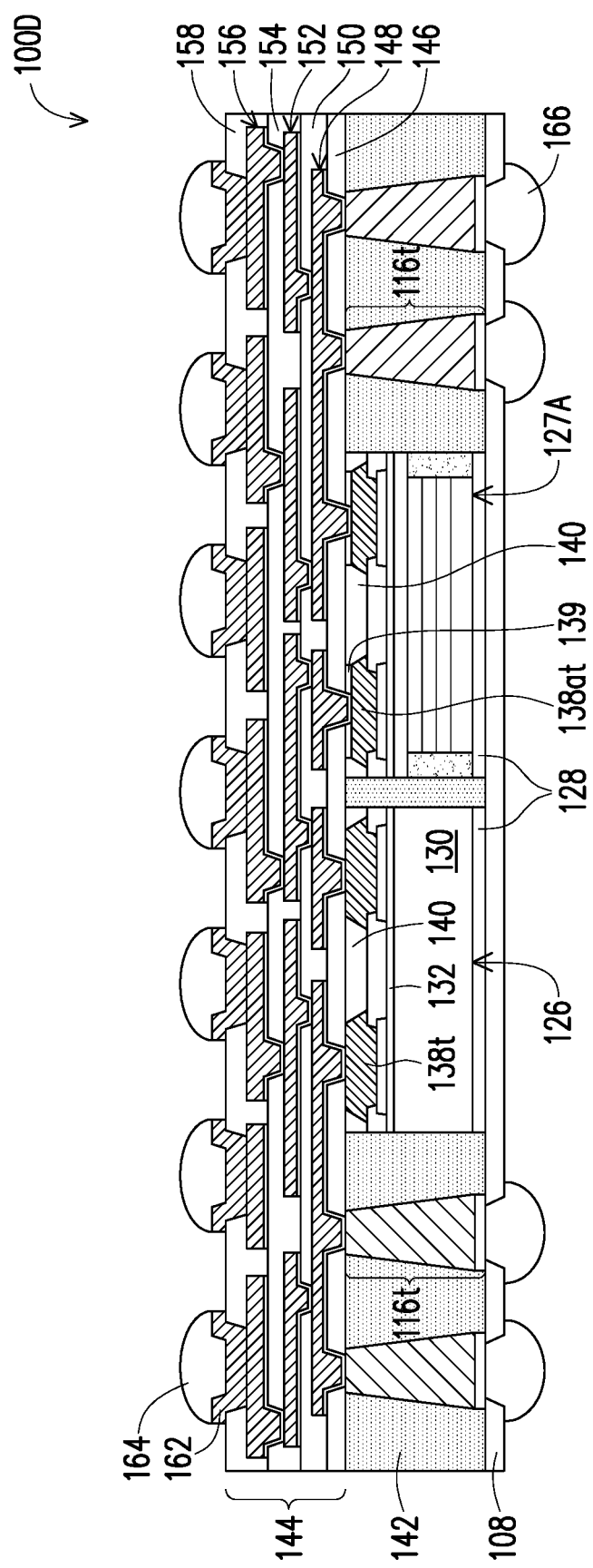
FIGS. 6A through 6C are schematic cross-sectional views illustrating device packages according to some embodiments of the disclosure.
Figure 6B:
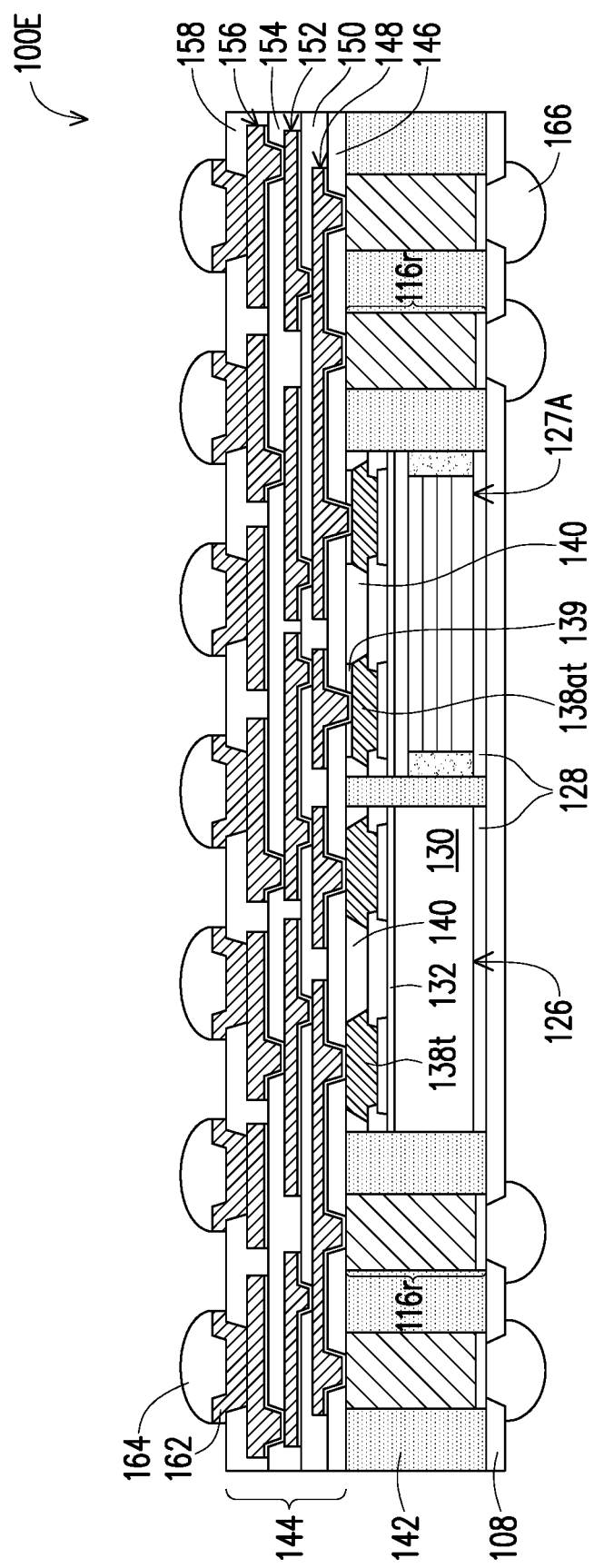
Figure 6C:
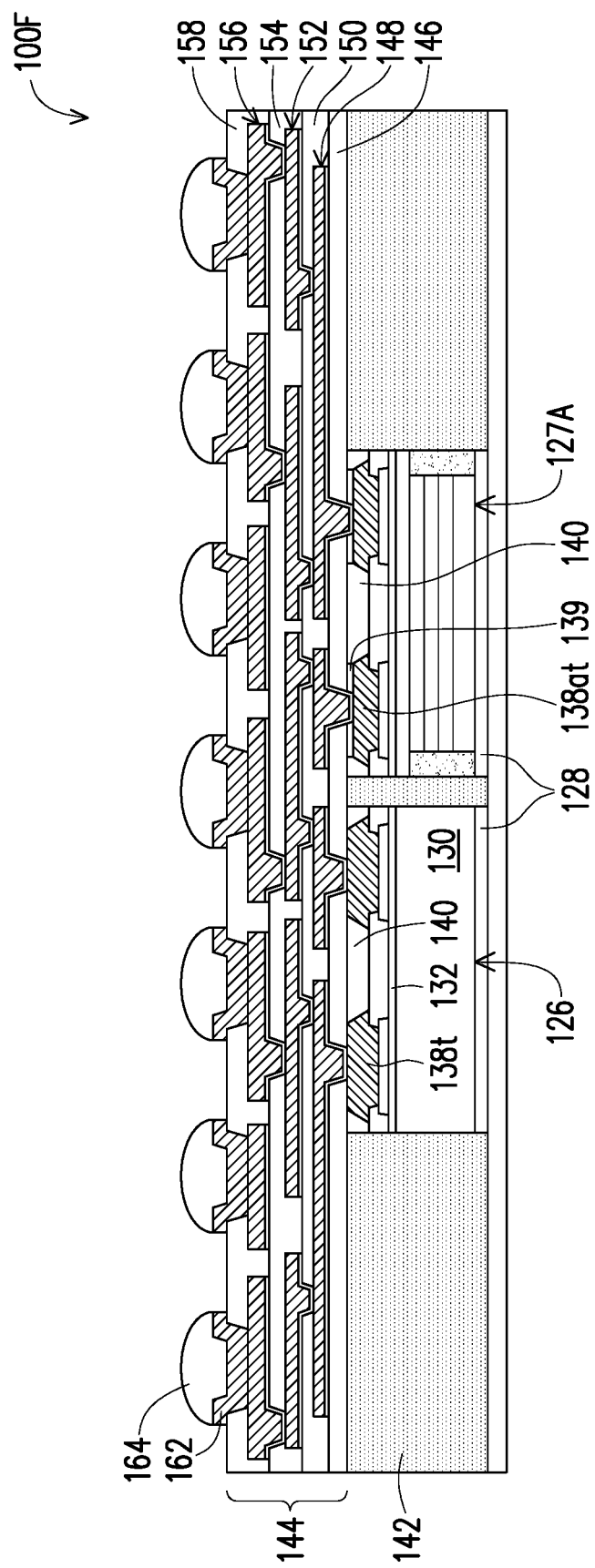

FIGS. 6A, 6B and 6C are schematic cross-sectional views illustrating device packages 100D, 100E and 100F according to some embodiments of the disclosure.

Figure 5A:
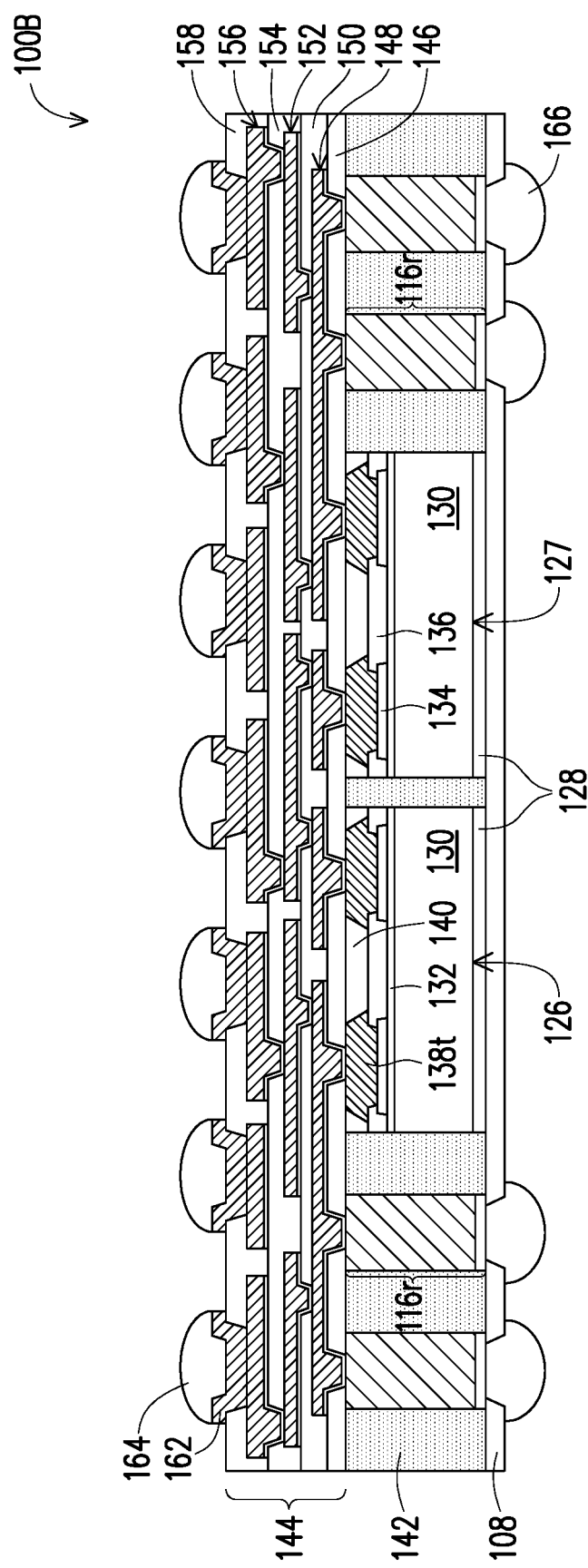
FIGS. 5A through 5F are schematic cross-sectional views illustrating device packages according to some embodiments of the disclosure.
Figure 5B:
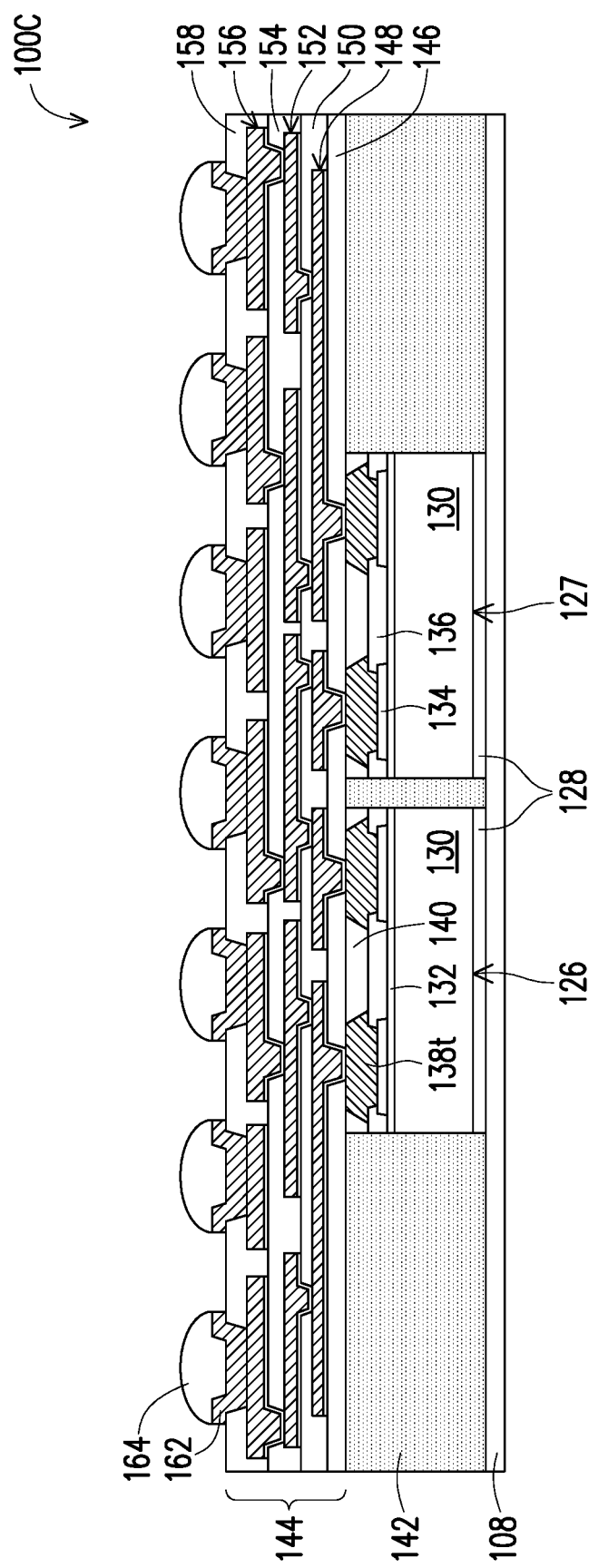
Figure 5C:
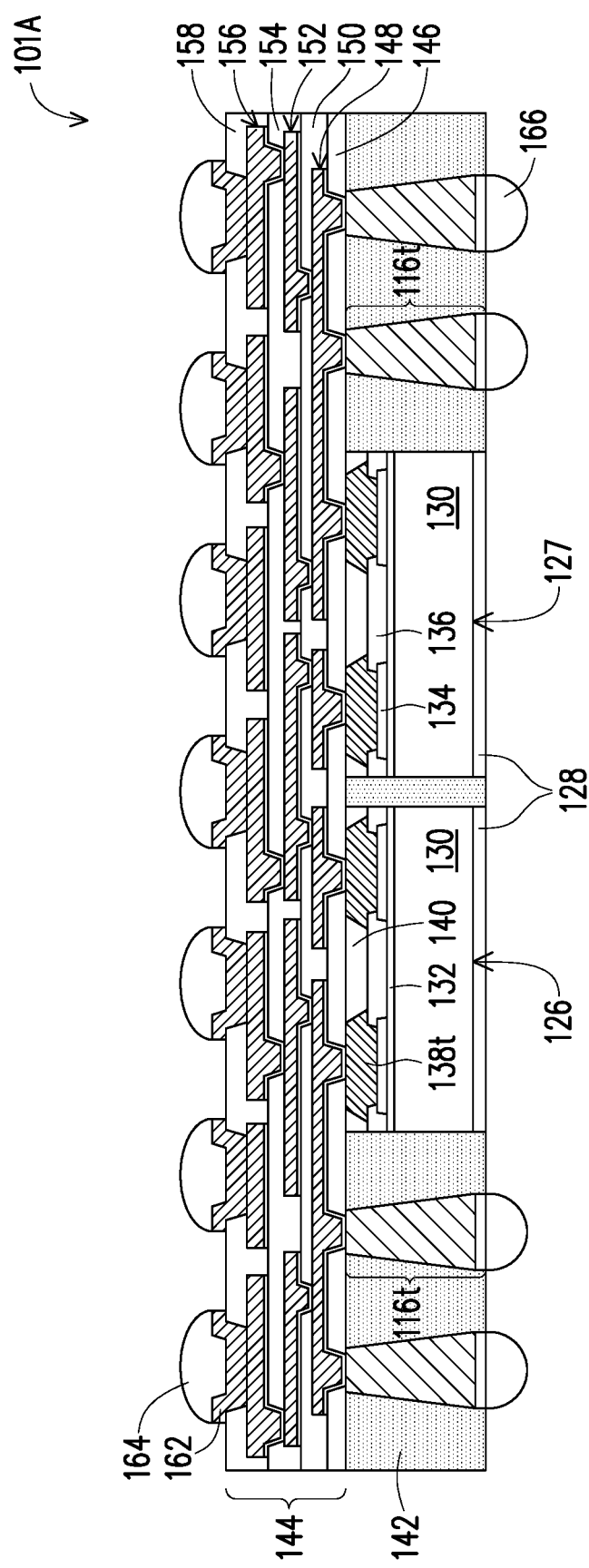
Figure 5D:
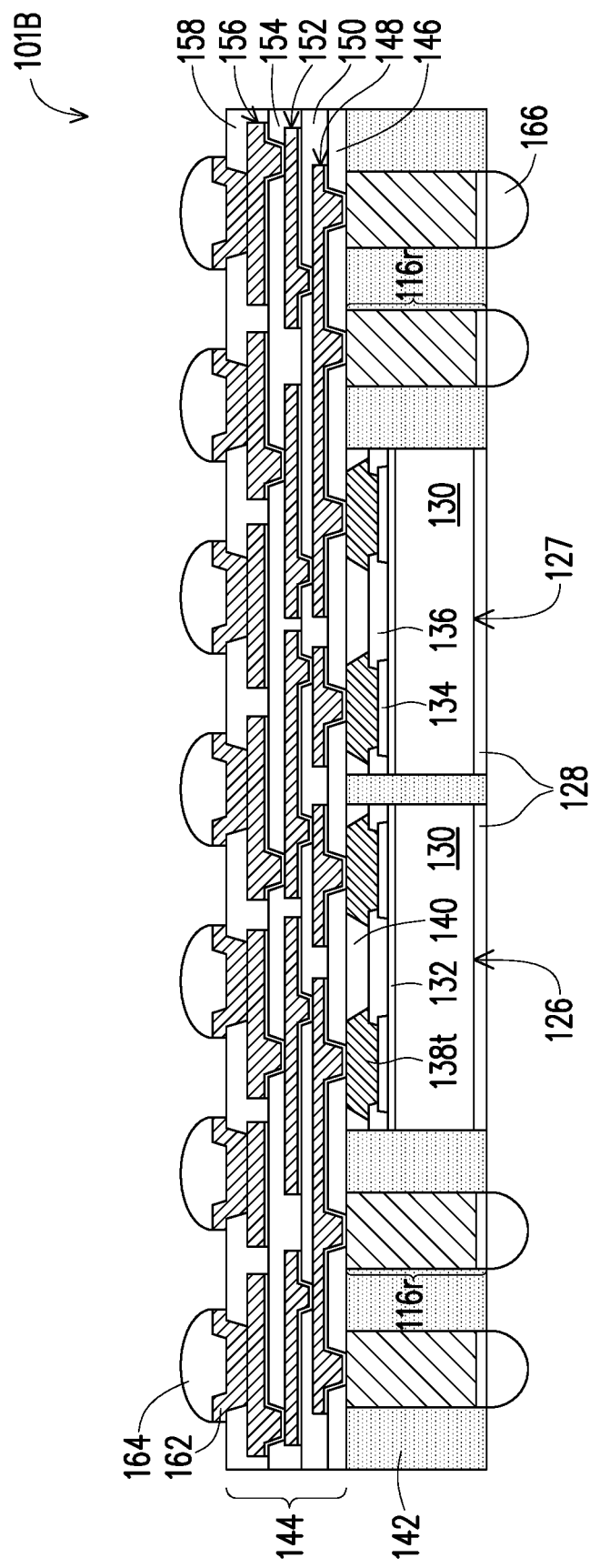
Figure 5E:
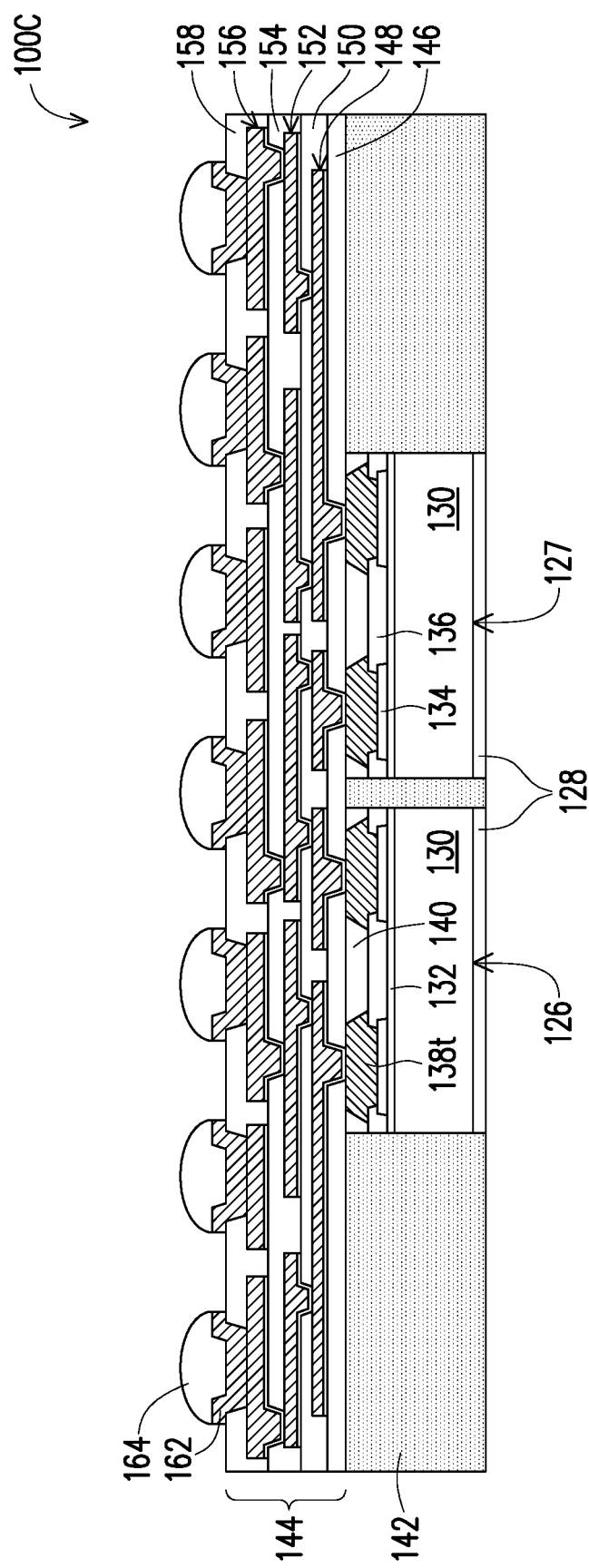
Figure 5F:
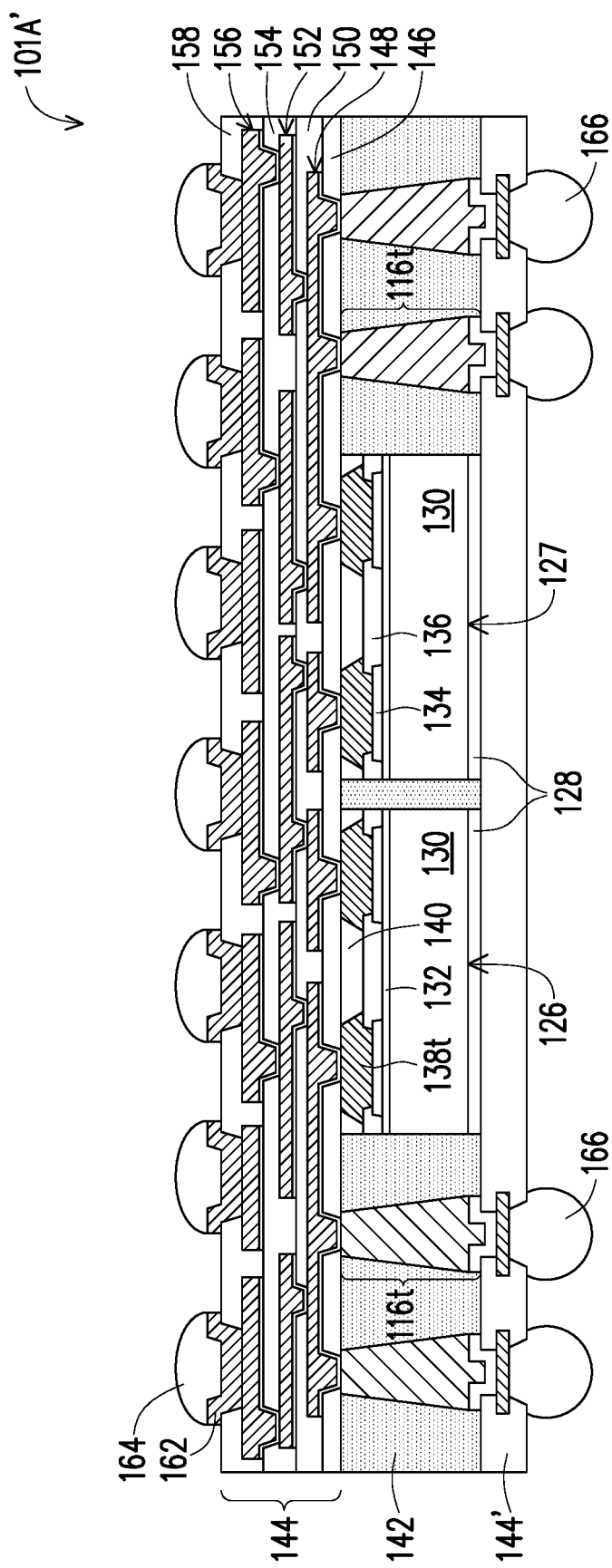

Referring to FIGS. 6A, 6B and 6C, the device package structures 100D, 100E and 100F are similar to the device package 100A, 100B and 100C illustrated in FIGS. 1F, 5A and 5B respectively, and the difference is that the device package 100D, 100E and 100F each include the IC die 126 and the IC die 127A. The IC die 126 may be a die with a large footprint, such as a system-on-chip (SoC) device, and the IC die 127A may be a memory die, such as a stack of memory dies (e.g., DRAM dies, SRAM dies, high-bandwidth memory (HBM) dies, hybrid memory cubes (HMC) dies, or the like). In other some embodiments, the IC die 127A has taper-shaped die connectors 138at and conductive caps 139 on the taper-shaped die connectors 138at, and the taper-shaped die connectors 138at includes conductive pillars, and the conductive caps 139 include metal. In some embodiments, the taper-shaped die connectors 138at include a conductive material such as copper, aluminum, gold, nickel, palladium, the like, or a combination thereof, and may be formed by sputtering, printing, electro plating, electroless plating, CVD, or the like. The conductive caps 139 include nickel, tin, tin-lead, gold, copper, silver, palladium, indium, nickel-palladium-gold, nickel-gold, the like, or a combination thereof and may be formed by a plating process.

Figure 7A:
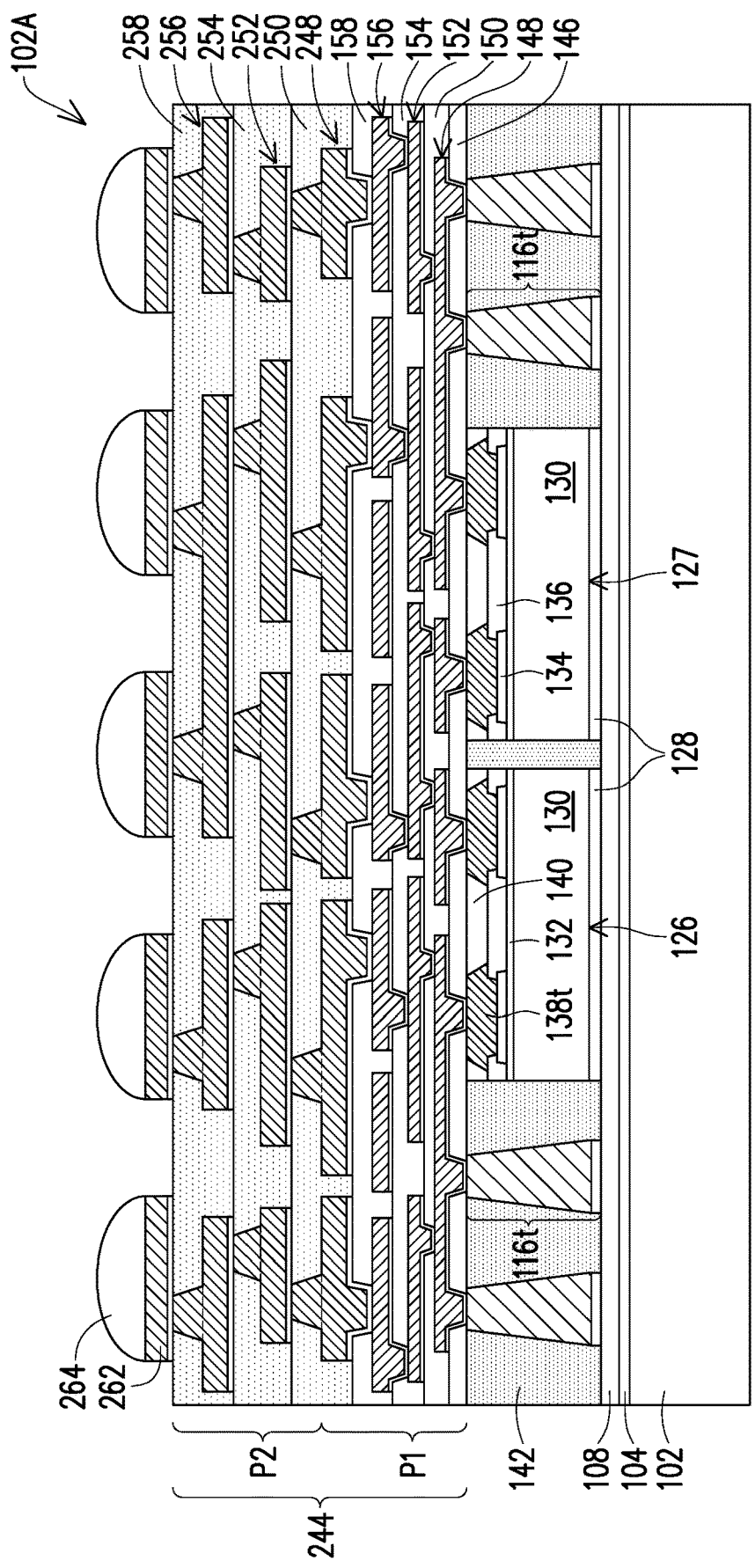
FIGS. 7A through 7B are schematic cross-sectional views illustrating a method of manufacturing a device package according to some embodiments of the disclosure.
Figure 7B:
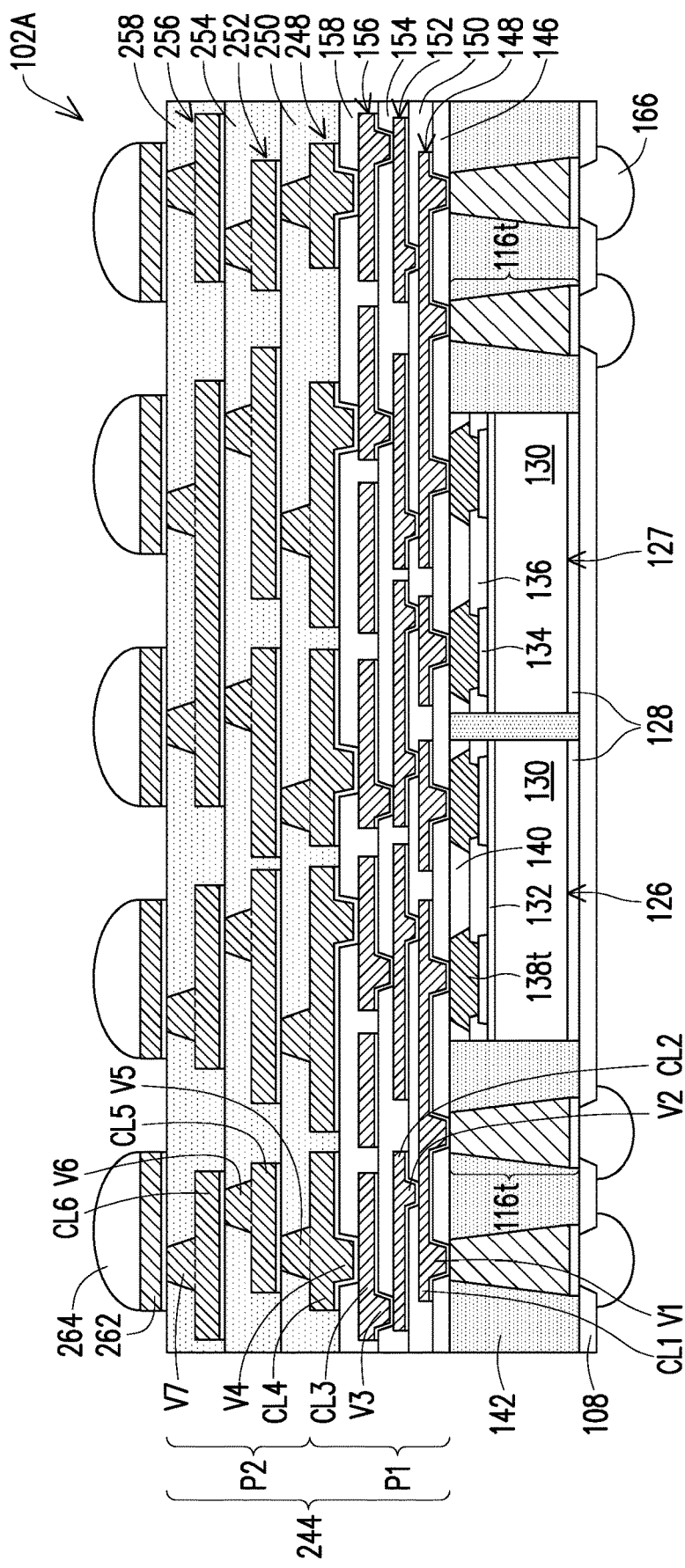
Figure 8A:
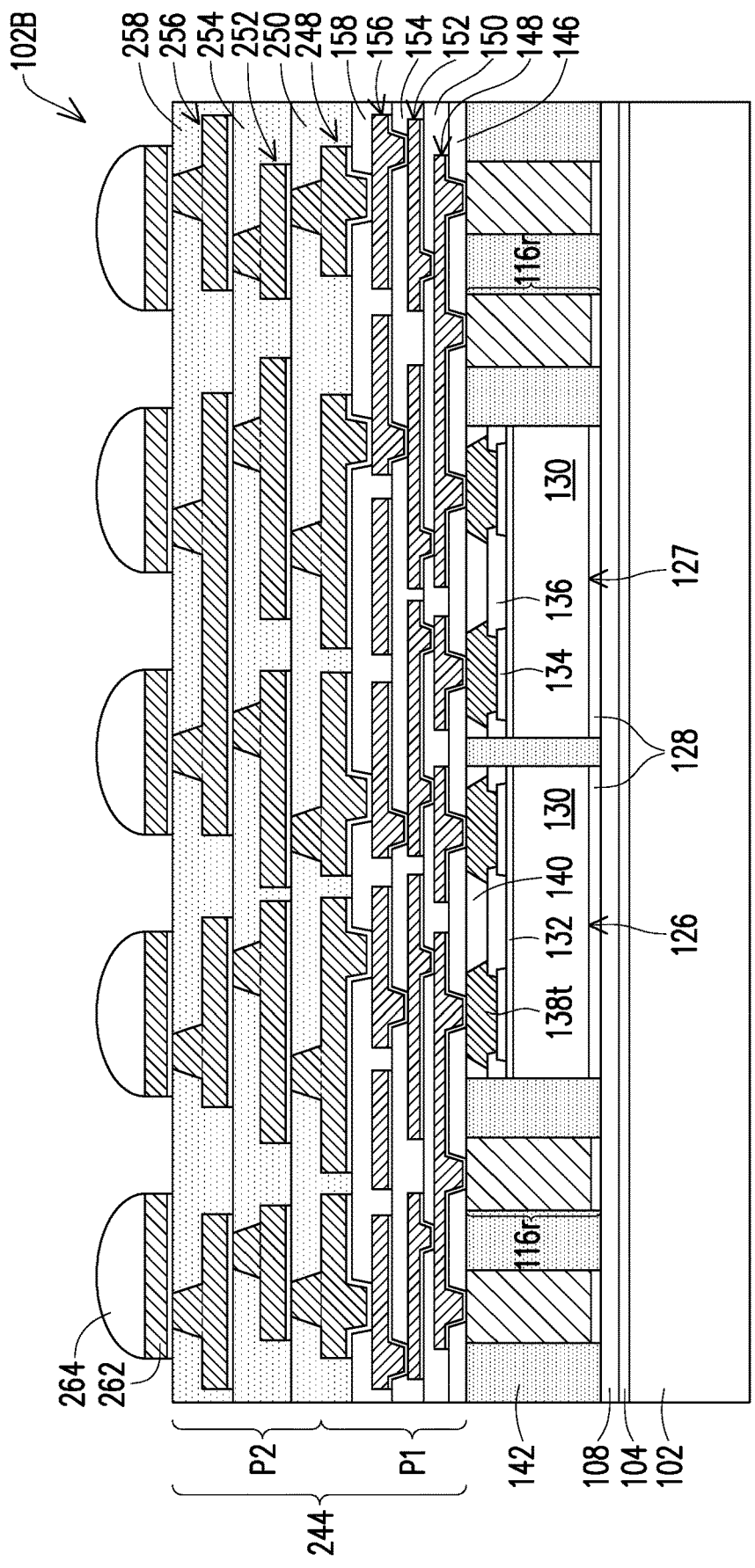
FIGS. 8A through 8B are schematic cross-sectional views illustrating a method of manufacturing a device package according to some embodiments of the disclosure.
Figure 8B:
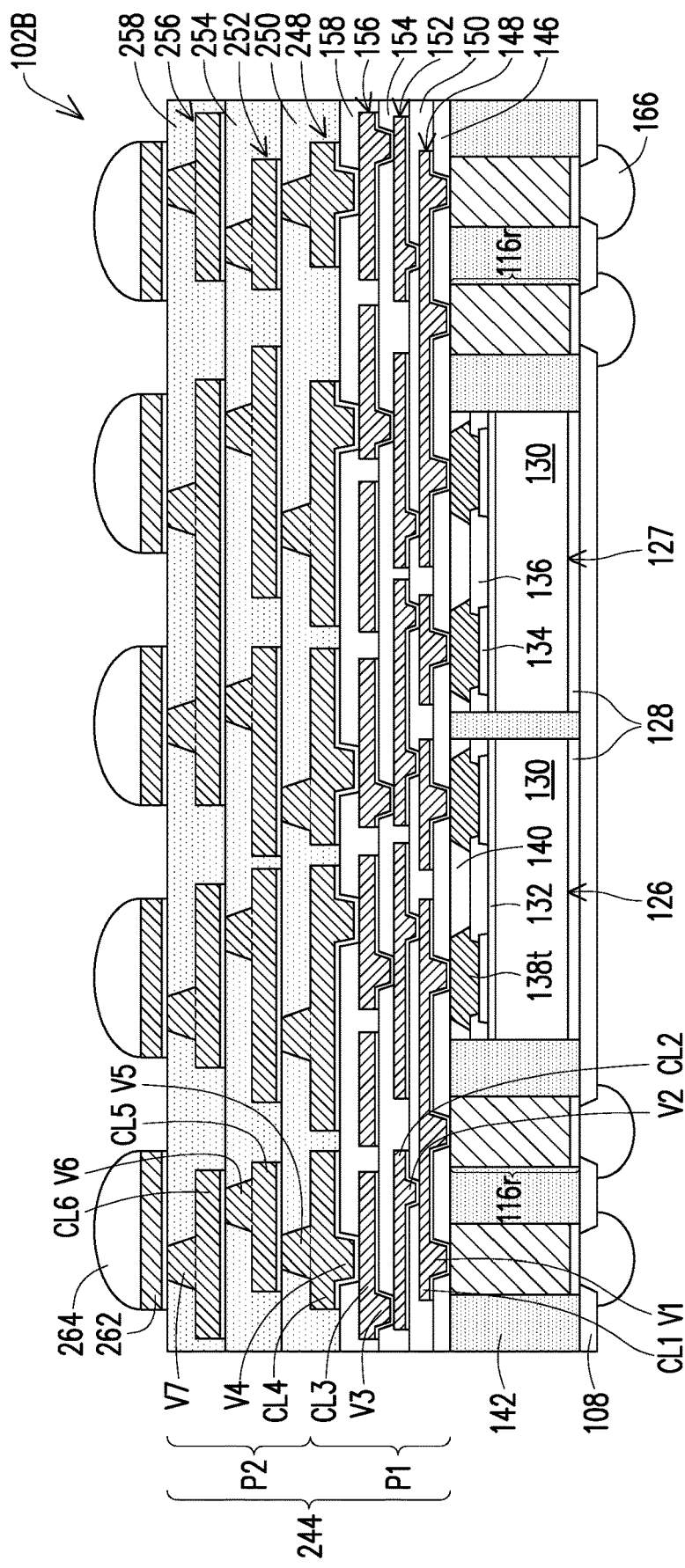
Figure 9:
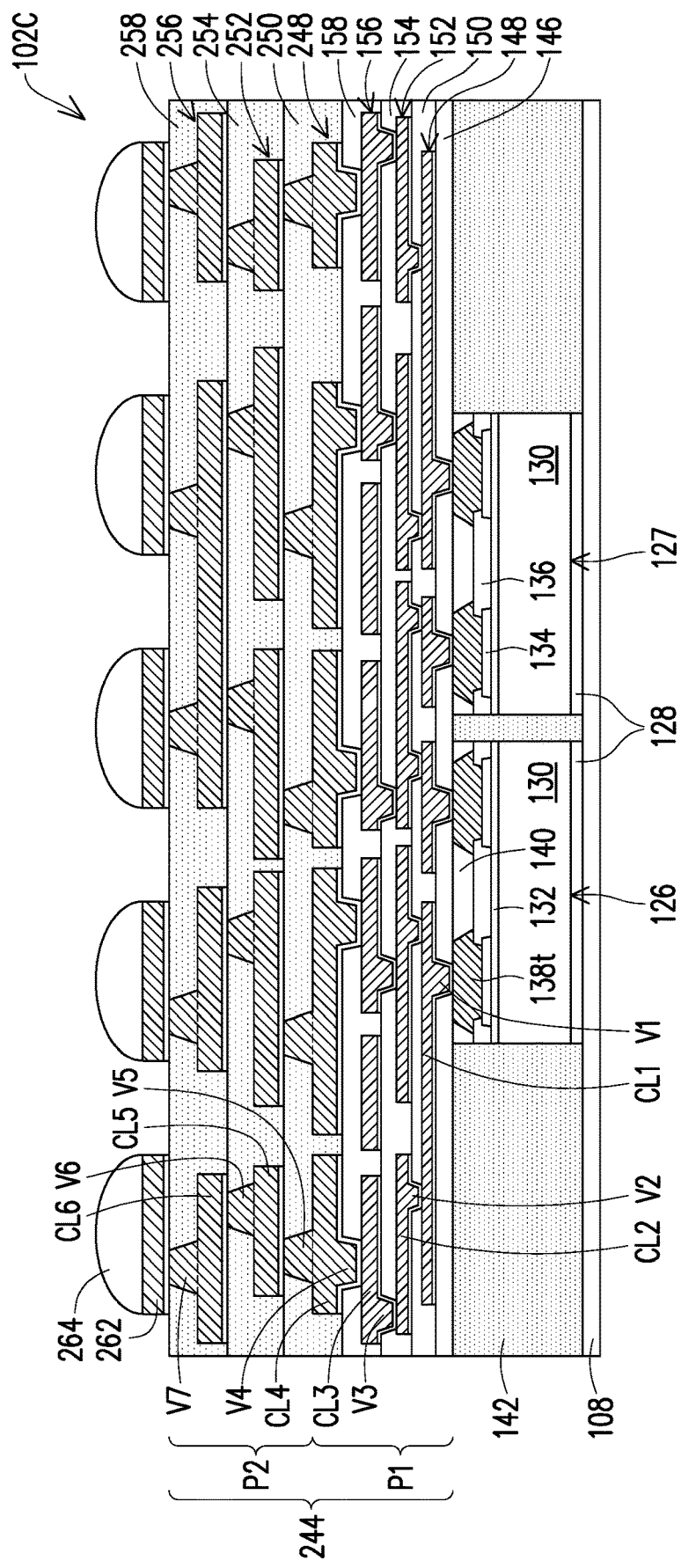
FIG. 9 is schematic cross-sectional view illustrating a device package according to some embodiments of the disclosure.

FIGS. 7A through 7B are schematic cross-sectional views illustrating a method of manufacturing a device package 102A according to some embodiments of the disclosure. FIGS. 8A through 8B are schematic cross-sectional views illustrating a method of manufacturing a device package 102B according to some embodiments of the disclosure. FIG. 9 is schematic cross-sectional view illustrating a package structure 102C according to some embodiments of the disclosure.

Referring to FIGS. 7B, 8B and 9, the device package structures 102A, 102B and 102C are similar to the device package 100A, 100B and 100C illustrated in FIGS. 1F, 5A and 5B respectively, and the difference is that a front-side redistribution structure 244, which is included in the device package 102A, 102B and 102C, includes more dielectric layers and metallization patterns, respectively.

Referring to FIG. 7A, in some embodiments, the front-side redistribution structure 244 includes a first redistribution structure P1, and a second redistribution structure P2 on the first redistribution structure P1. The first redistribution structure P1 includes the dielectric layers 146, 150, 154, and 158, and the metallization patterns 148, 152, and 156. The second redistribution structure P2 includes molding compounds 250, 254, and 258, and the metallization patterns 248, 252, and 256, and under bump metallurgies (UBMs) 262.

The structures, materials and formations of the dielectric layers 146, 150, 154, and 158, and the metallization patterns 148, 152, and 156 of the first redistribution structure P1 of the front-side redistribution structure 244 may be the same as or similar to the structures, the materials and formations of the corresponding parts of the device package 100A, 100B, and 100C as illustrated in FIGS. 1F, 5A and 5B. The structures, materials and formations of the molding materials 250, 254, and 258, and the metallization patterns 248, 252, and 256 of the second redistribution structure P2 of the front-side redistribution structure 244 are illustrated in FIGS. 10A-10K.

Figure 10G:
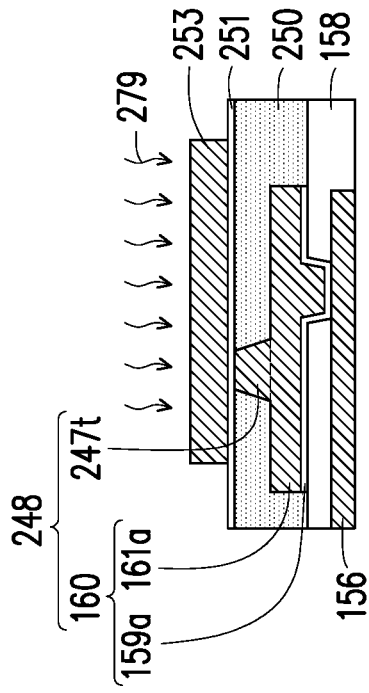
FIGS. 10A through 10P are schematic cross-sectional views illustrating a method of manufacturing a front-side redistribution structure and conductive connectors according to some embodiments of the disclosure.
Figure 10H:
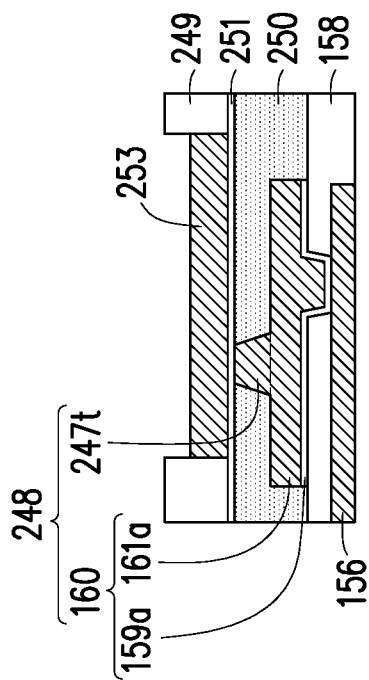
Figure 10I:
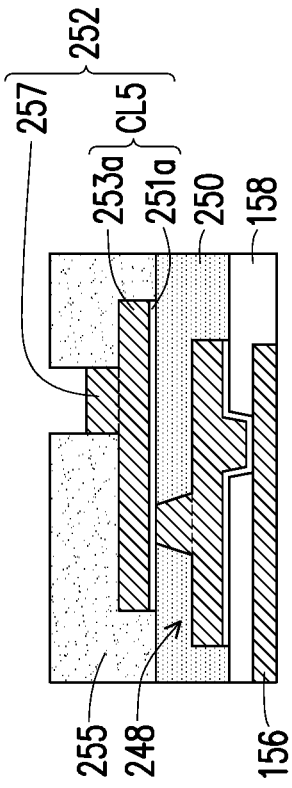
Figure 10J:
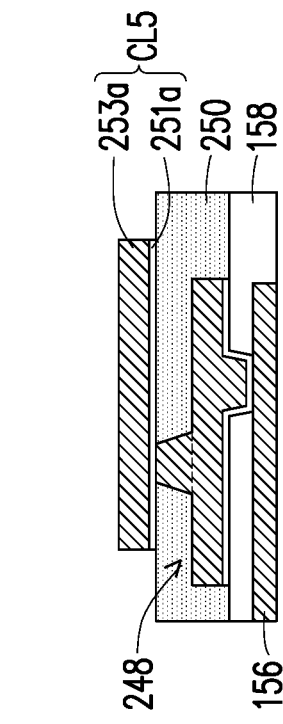
Figure 10K:
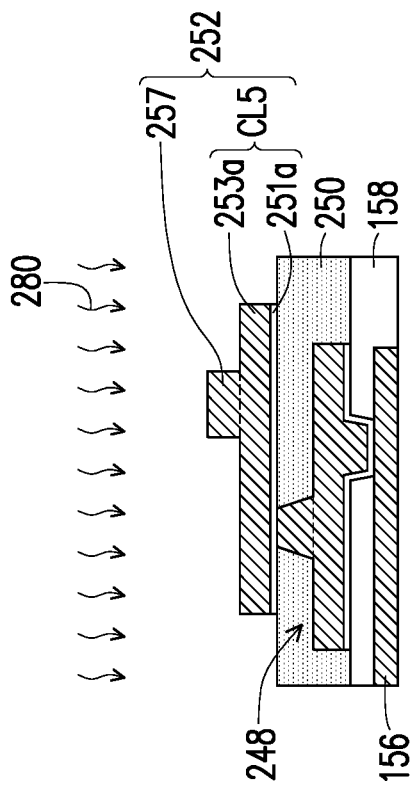
Figure 10L:
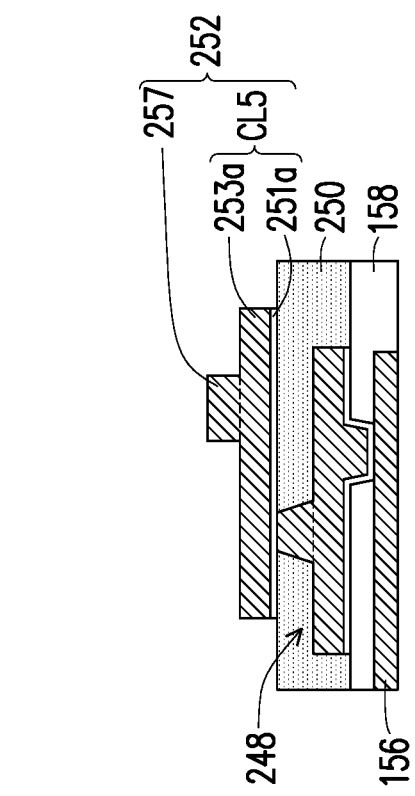
Figure 10M:
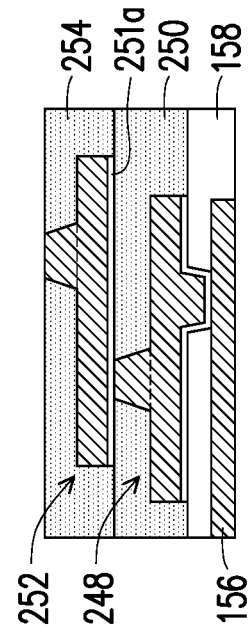
Figure 10N:
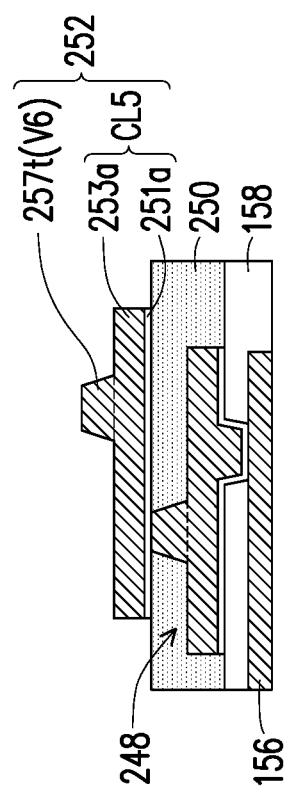
Figure 10P:
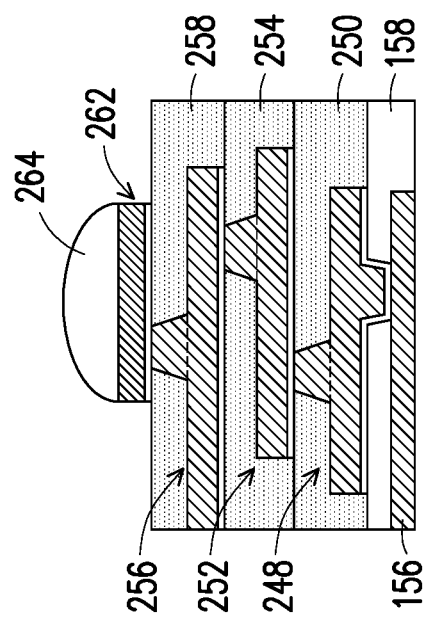

The process of forming a portion of the front-side redistribution structure 244 in FIGS. 7A, 7B, 8A, 8B and 9 is shown in FIGS. 10A through 10P.

Referring to FIG. 10A, after the dielectric layer 158 is formed, the metallization pattern 160 may be formed on and in the dielectric layer 158. The metallization pattern 160 includes a seed layer 159a and a conductive material 161a. The metallization pattern 160 may be formed in a manner similar to the metallization pattern 148, and may be formed of the same material as the metallization pattern 148. The metallization pattern 160 includes conductive line CL4 on and extending along the top surface of the dielectric layer 158, and conductive via V4 extending through the dielectric layer 158 to be physically and electrically connected to the conductive line CL3.

Referring to FIG. 10B and step S12 of FIG. 20, as an example to form the second redistribution structure P2 of the front-side redistribution structure 244, a photoresist 243 is then formed and patterned on the metallization pattern 148 and the dielectric layer 158. The photoresist 243 may be formed by spin coating or the like and may be exposed to light for patterning. The patterning forms a via opening 241 through the photoresist 243 to expose the metallization pattern 160. After the photoresist 243 is patterned, the photoresist 243 may be referred to as a patterned mask layer.

Referring to FIG. 10B and step S14 of FIG. 20, a conductive material 247 is then formed in the via openings 241 of the photoresist 243 and on the exposed portions of the metallization pattern 160. The conductive material 247 may be formed by plating, such as electroplating or electroless plating, or the like. The conductive material 247 may include a metal, like copper, titanium, tungsten, aluminum, or the like.

Referring to FIG. 10C and step S16 of FIG. 20, the photoresist 243 is removed. The photoresist 243 may be removed by an acceptable ashing or stripping process, such as using an oxygen plasma or the like.

Referring to FIG. 10D and step S20 of FIG. 20, the conductive material 247 is further etched by using an etching process 278. In some embodiments, the etching process 278 is similar to the etching process 119 described in FIG. 2A-6. In some embodiments, the etching process 278 may be a wet etching process using an etching solution without wetting agent adding to the etching solution to etch the conductive material 247.

After the etching process 278, the conductive material 247 becomes a taper-shaped conductive material 247t as shown in FIG. 10E, which is tapered from the metallization pattern 160. During the etching process 278, the metallization pattern 160 may be etched as well. However, since the thickness of the metallization pattern 160 is larger than the thickness of the conductive material 247, the etching process 278 will not affect the conductive properties of the metallization pattern 160. The etching process 278 may be the same as process 118 shown in FIG. 2A-4 to 2A-5. In some embodiments, the taper-shaped conductive material 247t may also be formed in the method described in FIGS. 2B-1 to 2B-5 or 2C-1 to 2C-5, even without the existence of the seed layer.

In some embodiments, the taper-shaped conductive material 247t forms a taper-shaped via V5, and the taper-shaped conductive material 247t and the metallization pattern 160 form the metallization pattern 248.

Referring to FIG. 10F, the molding compound 250 is deposited on the dielectric layer 158, and the metallization pattern 248. In some embodiments, the molding compound 250 and the dielectric layer 146 have different materials. In alternative embodiments, the dielectric layer 250 and 146 may have the same material. In some embodiments, the material of the molding compound 250 may be similar to the material of the encapsulant 142. The molding compound 250 may be applied by compression molding, transfer molding, spin-coating, lamination, deposition, or similar processes, and may be formed over the carrier substrate 102 such that the metallization pattern 248 and/or the metallization pattern 160 are buried or covered. The molding compound 250 is then cured. Since the conductive material 247t is taper-shaped, the molding compound 250 may be formed by covering the conductive material 247t and the conductive lines CL4 without forming bubbles at the end of the conductive material 247t connecting the conductive lines CL4.

A planarization process is then performed on the molding compound 250 to remove a portion of the molding compound 250, such that the top surfaces of the metallization pattern 248 is exposed. In some embodiments, top surfaces of the metallization pattern 248 and the molding compound 250 are substantially coplanar after the planarization process. The planarization process may be, for example, a chemical-mechanical polish (CMP), a grinding process, or the like. In some embodiments, the planarization may be omitted, for example, if the metallization pattern 248 is already exposed.

The metallization pattern 248 includes the taper-shaped conductive material 247t and the metallization pattern 160. The taper-shaped conductive material 247t is the taper-shaped via V5, and the metallization pattern 160 includes a conductive line CL4 and a via V4. The conductive line CL4 is formed on and extending along the top surface of the dielectric layer 158. The via V4 extends through the dielectric layer 158 to be physically and electrically connected to the conductive line CL3, while the taper-shaped via V5 is formed on and physically and electrically connected to the conductive line CL4. The taper-shaped via V5 and the conductive line CL4 are encapsulated by the molding compound 250. In some embodiments, the taper-shaped conductive material 247t may be replaced with a rectangular-shaped conductive material, where the sidewalls of the rectangular-shaped conductive via are straight. In addition, the conductive line CL4 may be a conformal layer, and has a recess on the conductive via V4.

Referring to FIGS. 10G and steps S10 and S12 of FIG. 20, a seed layer 251 is formed over the molding compound 250. The seed layer 251 may be formed in a manner similar to the seed layer 115, and may be formed of the same material as the seed layer 115. A photoresist 249 is formed and patterned on the seed layer 251. The photoresist 249 may be formed in a manner similar to the photoresist 143, and may be formed of the same material as the photoresist 143.

Referring to FIG. 10G and step S14 of FIG. 20, a conductive material 253 is formed in openings of the photoresist 249 and on the exposed portions of the seed layer 251. The conductive material 253 may be formed in a manner similar to the conductive material 247, and may be formed of the same material as the conductive material 247.

Referring to FIGS. 10G through 10H and step S16 of FIG. 20, the photoresist 249 may be removed in a manner similar to the photoresist 143.

Referring to FIG. 10H to FIG. 10I and step S18 of FIG. 20, once the photoresist 249 is removed, exposed portions of the seed layer 251 are removed by using an acceptable etching process 279, such as a wet or a dry etching process so that a seed layer 251a and a conductive material 253a are left, and the seed layer 251a and the conductive material 253a form a conductive line CL5.

Referring to FIG. 10J and step S12 of FIG. 20, a photoresist 255 is formed and patterned on the conductive material 253a. The photoresist 255 may be formed may be formed in a manner similar to the photoresist 243, and may be formed of the same material as the photoresist 243.

Referring to FIG. 10J and step S14 of FIG. 20, a conductive material 257 is then formed in a via opening of the photoresist 255 and on the exposed portions of the conductive material 253a. The conductive material 257 may be formed may be formed in a manner similar to the conductive material 247, and may be formed of the same material as the conductive material 247.

Referring to FIGS. 10K and 10L and steps S18 and S20 of FIG. 20, once the photoresist 255 is removed, the conductive material 257 is treated by an acceptable etching process 280, such as the etching process similar to the etching process 278. After the etching process 280, the conductive material 257 becomes a taper-shaped conductive material 257t, which is tapered from the conductive material 253a. The taper-shaped conductive material 257t forms a taper-shaped via V6 on the conductive line CL5. The taper-shaped via V6 and the conductive line CL5 forms the metallization pattern 252.

Referring to FIGS. 10M and 10N, once the taper-shaped via V6 is formed, the molding compound 254 is formed on the molding compound 250. The molding compound 254 may be formed in a manner similar to the molding compound 250, and may be formed of the same material as the molding compound 250. In some embodiments, a top surface of the molding compound 254 and a top surface of the taper-shaped via V6 are substantially coplanar, and a bottom surface of the molding compound 254 and a bottom surface of the seed layer 251a are substantially coplanar.

Figure 10O:
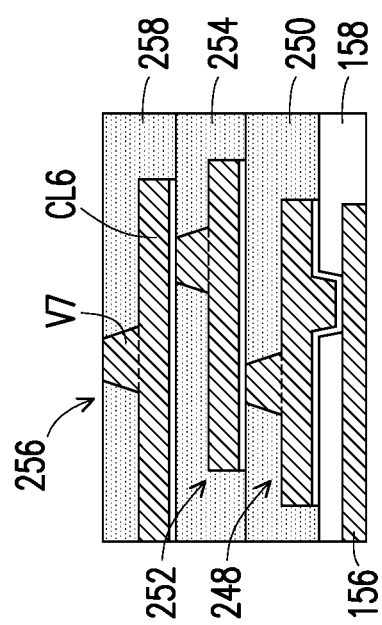

Referring to FIG. 10O, the metallization pattern 256 and the molding compound 258 are formed on the molding compound 254 and the metallization pattern 252. The metallization pattern 256 may be formed in a manner similar to the metallization pattern 252, and may be formed of the same material as the metallization pattern 252. The molding compound 258 may be formed in a manner similar to the molding compound 250, and may be formed of the same material as the molding compound 250. The metallization pattern 256 includes a conductive line CL6 and a taper-shaped via V7 on the conductive line CL6. In some embodiments, a top surface of the molding compound 258 and a top surface of the taper-shaped via V7 are substantially coplanar, and a bottom surface of the molding compound 258 and a bottom surface of the seed layer of the conductive line CL6 are substantially coplanar.

Referring to FIG. 10P, an UBM 262 are optionally formed on the molding compound 258. The UBMs 262 may be formed in a manner similar to the conductive line CL5, and may be formed of the same material as the conductive line CL5. The conductive connector 264 is formed on the UBM 262. The conductive connector 264 may be formed in a manner similar to the conductive connector 164, and may be formed of the same material as the conductive connector 164 as illustrated in FIG. 1E.

Referring back to FIGS. 7A to 9 and FIGS. 10A to 10P, the front-side redistribution structure 244 includes the first redistribution structure P1 and the second redistribution structure P2. The two redistribution structures have different structures.

In the first redistribution structure P1, the vias V1, V2 and V3 of the metallization patterns 148, 152 and 156 are formed below the conductive lines CL1, CL2 and CL3, respectively. In the second redistribution structure P2, the vias V5, V6 and V7 of the metallization patterns 248, 252 and 256 are formed above the conductive lines CL4, CL5 and CL6. For the conductive line CL4, it has two vias: the via V4 is below the conductive line CL4 and the via V5 is above the conductive line CL4.

In the first redistribution structure P1, the conductive vias V1, V2, V3 and V4 have seed layer and are formed below the conductive lines CL1, CL2, CL3 and CL4, and are formed on seed layers, respectively. Further, in the first redistribution structure P1, the seed layers of the conductive lines CL1, CL2 and CL3 of the metallization patterns 148, 152 and 156 are formed over the dielectric layers 146, 150 and 154. In the second redistribution structure P2, the conductive vias V5, V6 and V7 are formed directly on the conductive lines CL4, CL5 and CL6 without seed layers, respectively.

In the first redistribution structure P1, there is no interface between the conductive line CL1 and the via V1 of the metallization pattern 148, the conductive line CL2 and the via V2 of the metallization pattern 152, the conductive line CL3 and the via V3 of the metallization pattern 156 and the conductive line CL4 and the via V4 of the metallization pattern 248.

In the second redistribution structure P2, there is also no interface between the conductive line CL4 and the via V5 of the metallization pattern 248, the conductive line CL5 and the via V6 of the metallization pattern 252, and the conductive line CL6 and the vias V7 of the metallization pattern 256.

In the first redistribution structure P1, the conductive line CL1 of the metallization pattern 148 are enclosed by dielectric layers 146 and 150; the conductive line CL2 of the metallization pattern 152 are enclosed by dielectric layers 150 and 154; and the conductive line CL3 of the metallization pattern 156 are enclosed by dielectric layers 154 and 158. In the second redistribution structure P2, the via V5 and the conductive line CL4 of the metallization pattern 248 are enclosed by a same layer of molding compound 250; the via V6 and the conductive line CL5 of the metallization pattern 252 are enclosed by a same layer of molding compound 254; and the via V7 and the conductive line CL6 of the metallization pattern 256 are enclosed by a same layer of molding compound 258. The via V4 and the conductive line CL4 of the metallization pattern 248 are enclosed by dielectric layer 158 and the molding compound 250.

In FIG. 7B, there are different kinds of taper-shaped conductive structures: such as taper-shaped through vias 116t, taper-shaped die connectors 138t, taper-shaped vias V1 to V7. The taper-shaped through vias 116t, taper-shaped die connectors 138t, and taper-shaped vias V5, V6, and V7 are tapered toward the conductive connector 264, or in upward direction. The taper-shaped vias V1 to V4 are tapered toward the conductive connectors 166, or in downward direction, which is opposite to the taper direction of the taper-shaped through vias 116t, taper-shaped die connectors 138t, and taper-shaped vias V5, V6, and V7. For the taper-shaped through vias 116t, taper-shaped die connectors 138t, and taper-shaped vias V5, V6, and V7, these structures are used when a molding compound or dielectric layer is used to encapsulate the conductive structures. With these upward taper-shaped conductive structures, the polymer of the molding compound or the dielectric layer may be formed and coated on these taper-shaped conductive structures without forming bubbles which may damage the packaged device.

Figure 11A:
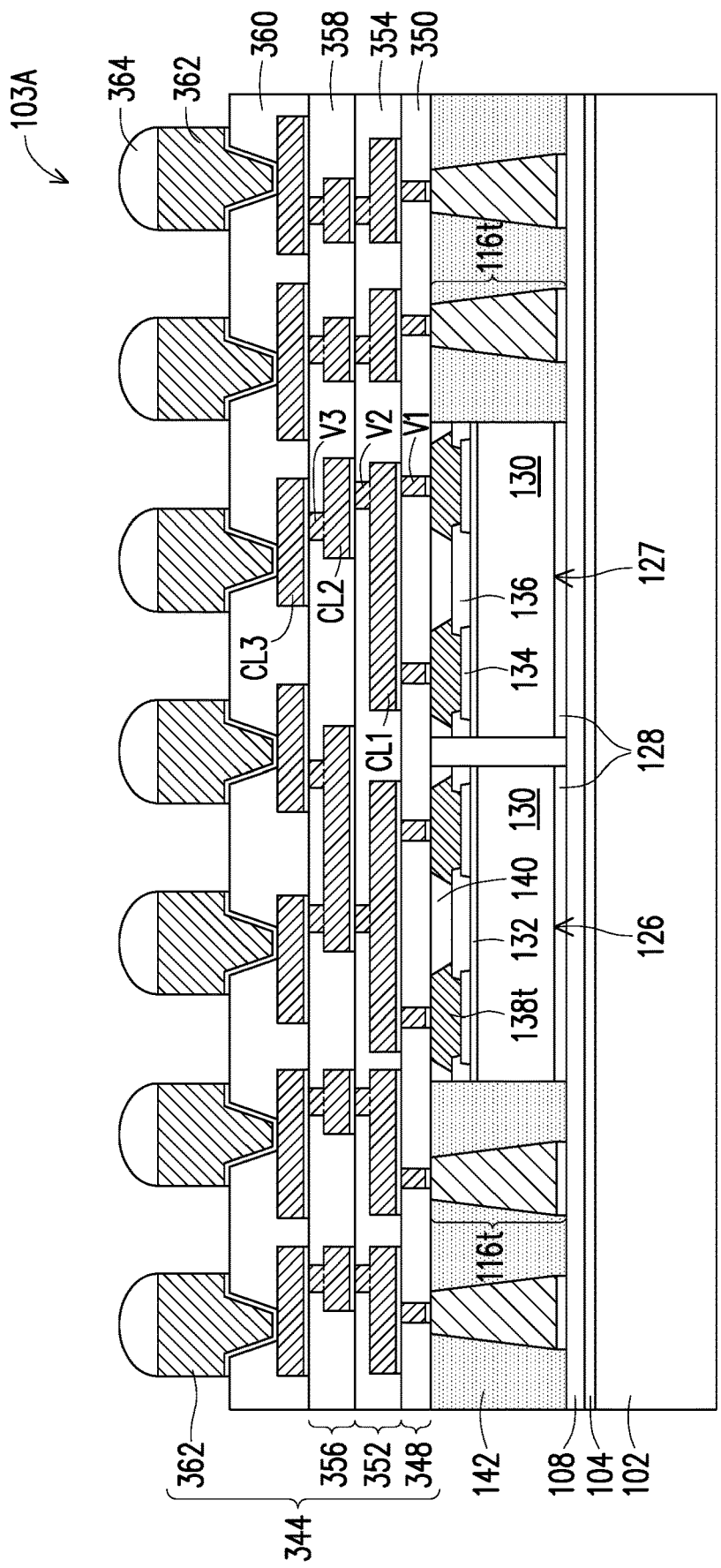
FIGS. 11A through 11B are schematic cross-sectional views illustrating a method of manufacturing a device package according to some embodiments of the disclosure.
Figure 11B:
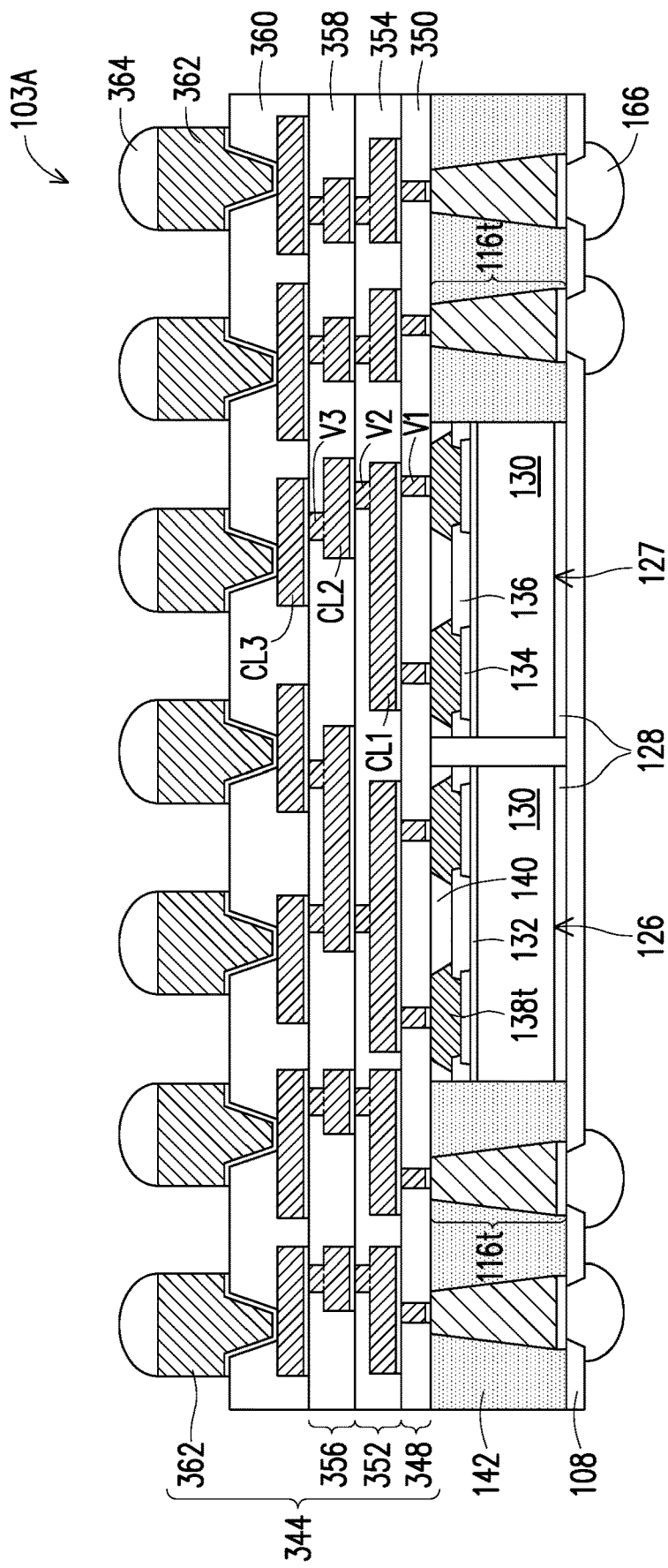
Figure 12A:
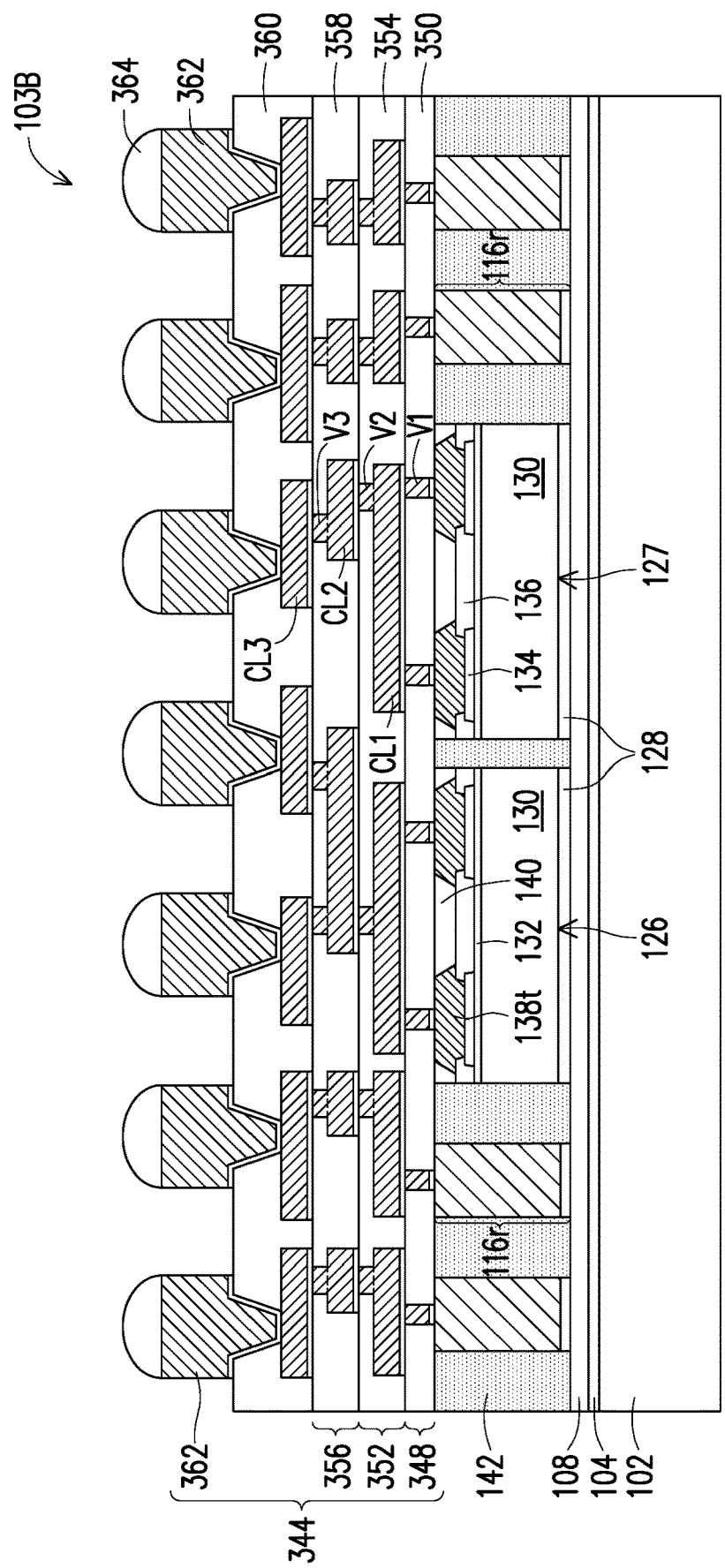
FIGS. 12A through 12B are schematic cross-sectional views illustrating a method of manufacturing a device package according to some embodiments of the disclosure.
Figure 12B:
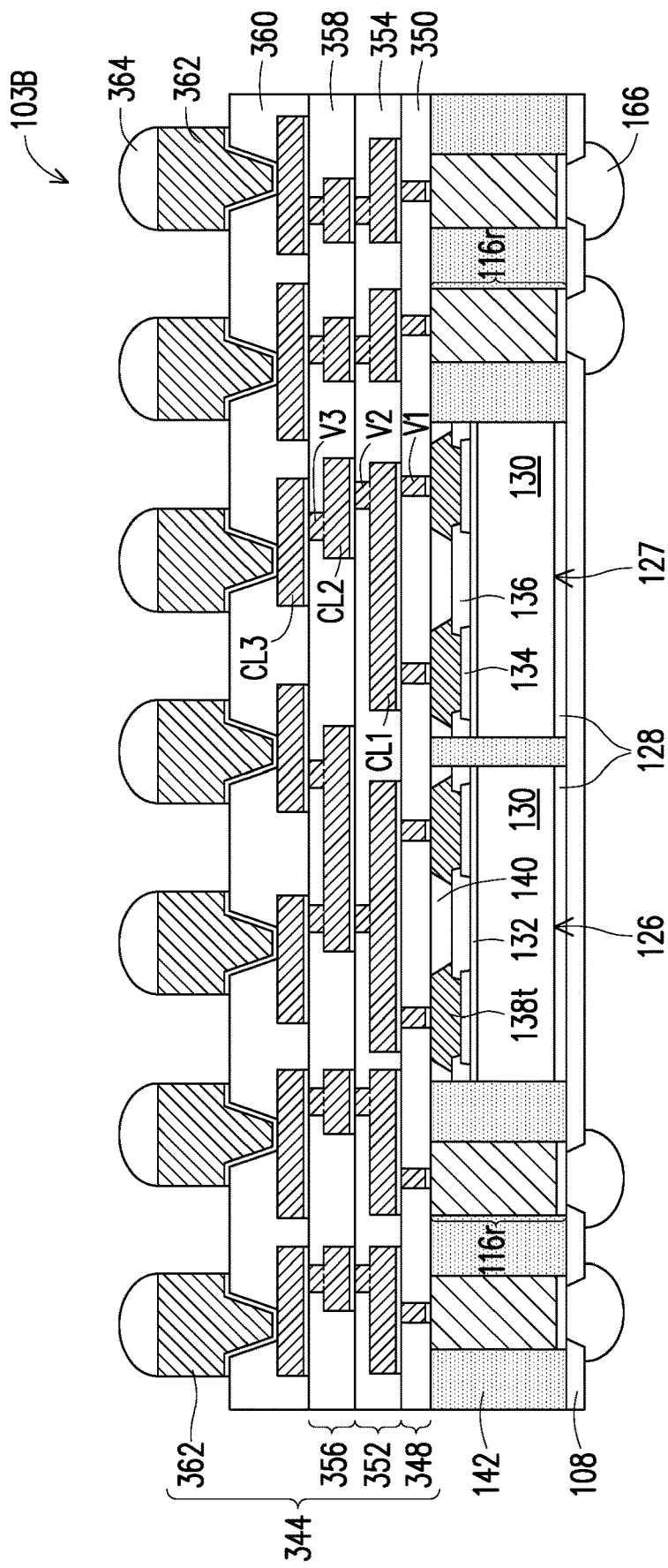
Figure 13:
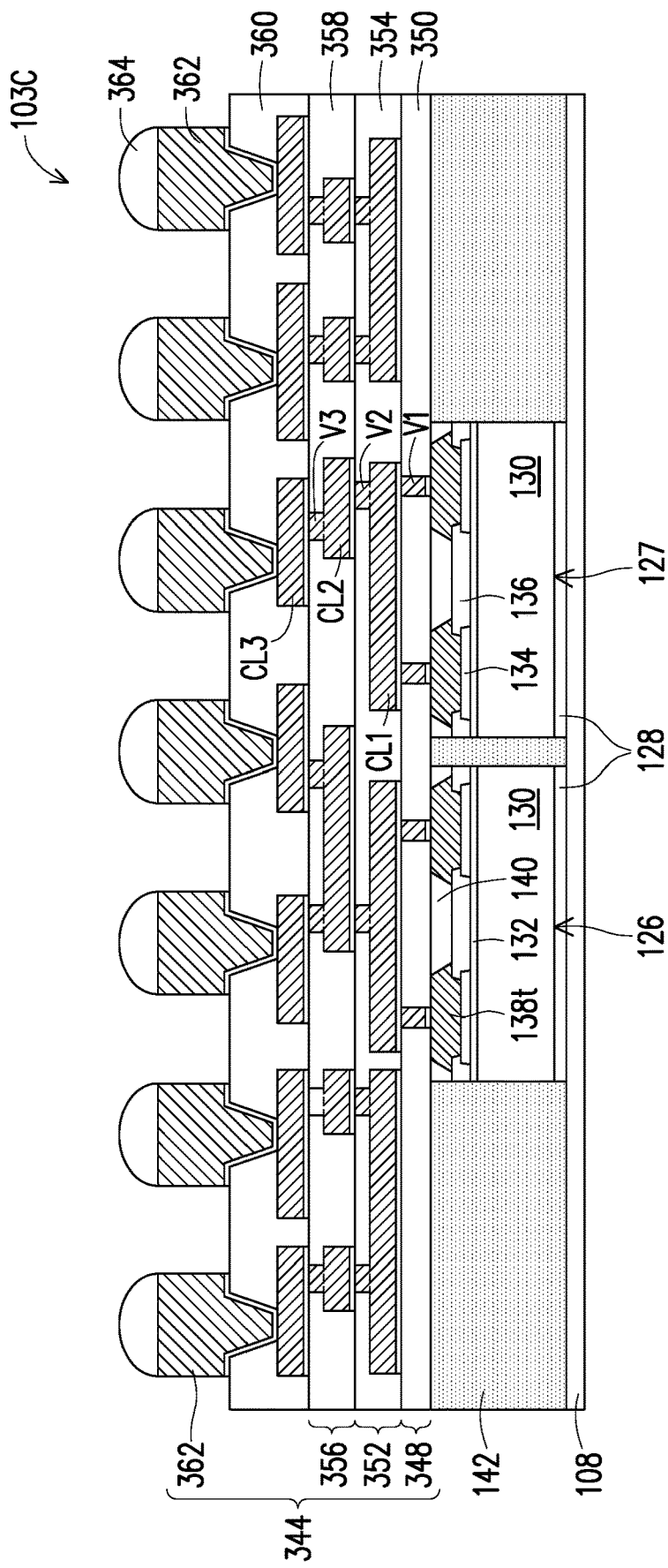
FIG. 13 is schematic cross-sectional view illustrating a device package according to some embodiments of the disclosure.

FIGS. 11A through 11B are schematic cross-sectional views illustrating a method of manufacturing a device package 103A according to some embodiments of the disclosure. FIGS. 12A through 12B are schematic cross-sectional views illustrating a method of manufacturing a device package 103B according to some embodiments of the disclosure. FIG. 13 is schematic cross-sectional view illustrating a device package 103C according to some embodiments of the disclosure.

Referring to FIGS. 11B, 12B and 13, the device package structures 103A, 103B and 103C are similar to the device package 100A, 100B and 100C as illustrated in FIGS. 1E, 5A and 5B respectively, and the difference is a front-side redistribution structure 344 in the device package structures 103A, 103B and 103C.

Referring to FIG. 11A, an encapsulant 142 is formed to laterally encapsulate the taper-shaped through vias 116t and the IC dies 126 and 127 in a procedure the same as or similar to the formations of the corresponding parts as illustrated in FIGS. 1D to 1F. The materials of the encapsulant 142 may be the same as or similar to the materials of the corresponding parts as illustrated in FIGS. 1D to 1F. Then, the front-side redistribution structure 344 and conductive connectors 364 are formed on the encapsulant 142, the taper-shaped through vias 116t and the IC dies 126 and 127, as illustrated in FIGS. 14A to 14I.

FIGS. 14A to 14I are schematic cross-sectional views illustrating a method of manufacturing a front-side redistribution structure 344 and conductive connectors 364 according to some embodiments of the disclosure.

Figure 14A:
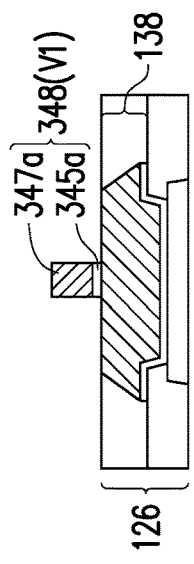
FIGS. 14A through 14I are schematic cross-sectional views illustrating a method of manufacturing a front-side redistribution structure and conductive connectors according to some embodiments of the disclosure.

Referring to FIG. 14A, as an example to form the front-side redistribution structure 344. A seed layer 345 is formed over the encapsulant 142 (not shown), the taper-shaped through vias 116t (not shown), and the IC dies 126 and 127. In some embodiments, the seed layer 345 may be formed in a manner similar to the seed layer 115, and may be formed of the same material as the seed layer 115 as illustrated in FIG. 2A-1.

Referring to FIG. 14A, a photoresist 343 is then formed and patterned on the seed layer 345. The photoresist 343 may be formed by spin coating or the like and may be exposed to light for patterning. The pattern of the photoresist 343 corresponds to the metallization pattern 348. The patterning forms a via opening 349 through the photoresist 343 to expose the seed layer 345.

Figure 14B:
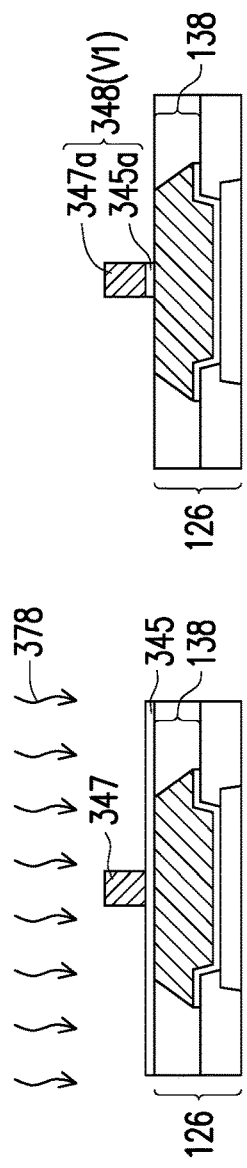

Referring to FIGS. 14A and 14B, a conductive material 347 is then formed in the via openings 349 of the photoresist 343 and on the exposed portions of the seed layer 345. The conductive material 347 may be formed in a manner similar to the conductive material 247, and may be formed of the same material as the conductive material 247.

Referring to FIG. 14B, the photoresist 343 is removed. The photoresist 343 may be removed by an acceptable ashing or stripping process, such as using an oxygen plasma or the like.

Figure 14C:
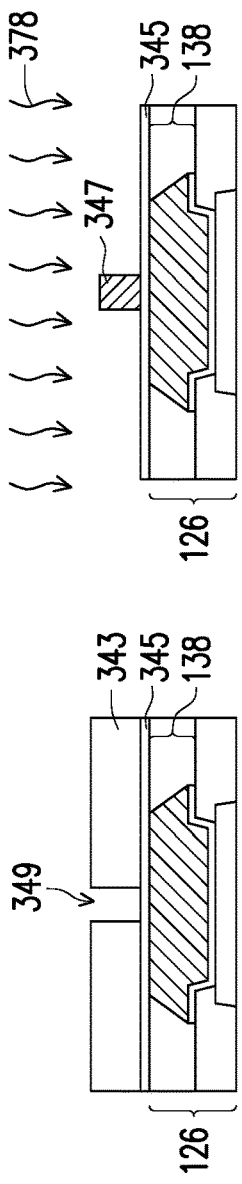

Referring to FIGS. 14B and 14C, once the photoresist 343 is removed, exposed portions of the seed layer 345 are removed by an etching process 378. The etching process 378 may be performed in a manner the same as or similar to the etching process 118. After the etching process 378, a seed layer 345a and a conductive material 347a are left, and the seed layer 345a and the conductive material 347a form the metallization pattern 348. In some embodiments, the metallization pattern 348 is a via, and thus may be referred to as a via V1.

Figure 14D:
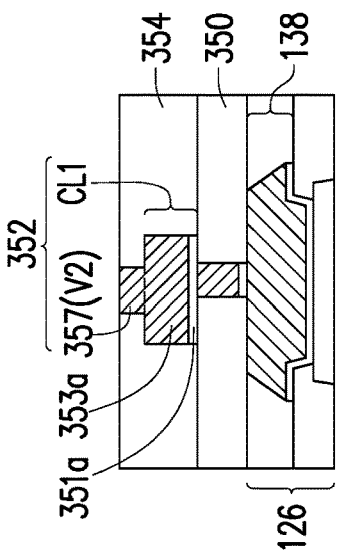

Referring to FIG. 14D, a dielectric layer 350 is deposited on the IC die 126, and the die connector 138. In some embodiments, the dielectric layer 350 is formed of a photosensitive material such as PBO, polyimide, BCB, or the like, which may be patterned using a lithography mask. The dielectric layer 350 may be formed by spin coating, lamination, CVD, the like, or a combination thereof. A planarization process is then performed on the dielectric layer 350 to remove a portion of the dielectric layer 350, such that the top surfaces of the metallization pattern 348 is exposed. In some embodiments, top surfaces of the metallization pattern 348 and the dielectric layer 350 are substantially coplanar after the planarization process. The planarization process may be, for example, a chemical-mechanical polish (CMP), a grinding process, or the like. In some embodiments, the planarization may be omitted, for example, if the metallization pattern 348 is already exposed. In some embodiments, a bottom surface of the seed layer 345a of the metallization pattern 348 and a bottom surface of the dielectric layer 350 are coplanar.

Figure 14E:
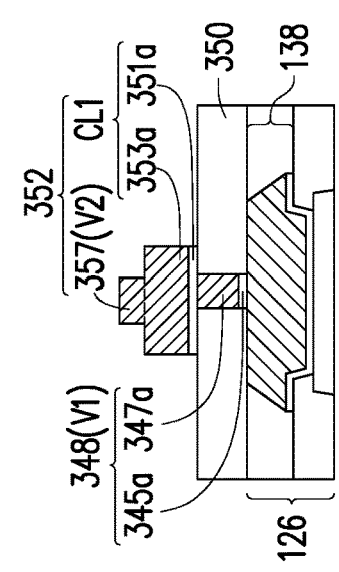

Referring to FIG. 14E, a metallization pattern 352 is formed on the metallization pattern 348 and the dielectric layer 350. The metallization pattern 352 includes a conductive line CL1 and a via V2. The conductive line CL1 includes a seed layer 351a on the metallization pattern 348 and the dielectric layer 350, and a conductive material 353a on the seed layer 351a. The via V2 includes conductive material 357 on the conductive material 353a. The metallization pattern 352 may be formed in a manner similar to the metallization pattern 252, and may be formed of the same material as the metallization pattern 252 as illustrated in FIGS. 10I to 10K.

Figure 14F:
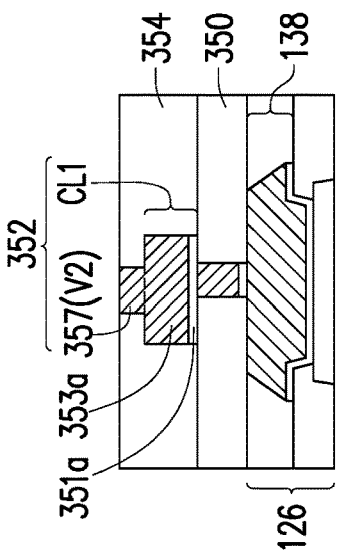
Figure 14I:
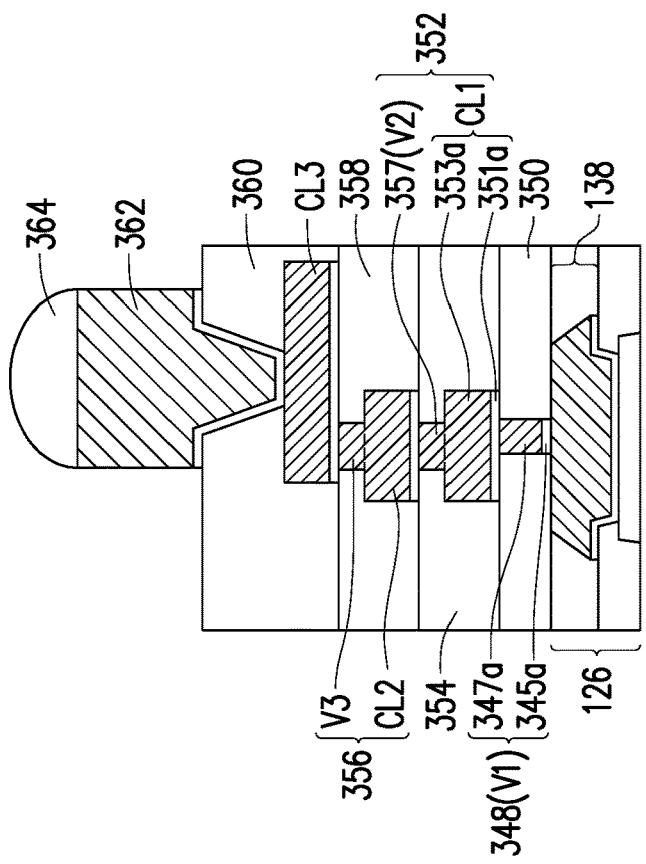
Figure 14G:
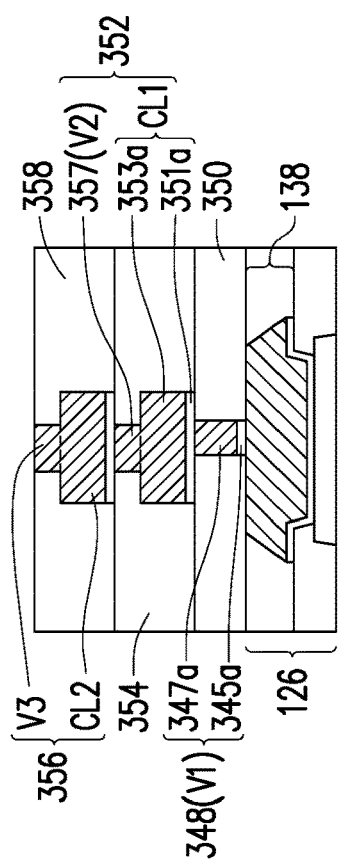

Referring to FIG. 14F and 14G, after the metallization pattern 352 is formed, a dielectric layer 354 is formed on the dielectric layer 350, and a metallization pattern 356 and a dielectric layer 358 are formed on the dielectric layer 354 and the metallization pattern 352. The dielectric layers 354 and 358 may be formed in a manner similar to the dielectric layer 350, and may be formed of the same material as the dielectric layer 350. The metallization pattern 356 may be formed in a manner similar to the metallization pattern 252, and may be formed of the same material as the metallization pattern 252 as illustrated in FIGS. 10J to 10L. In some embodiments, a top surface of the dielectric layer 354 and a top surface of the conductive material 357 of the via V2 are coplanar, and a bottom surface of the dielectric layer 354 and a bottom surface of the seed layer 351a of the conductive line CL1 are coplanar. In other some embodiments, a top surface of the dielectric layer 358 and a top surface of a conductive material of the via V3 are coplanar, and a bottom surface of the dielectric layer 358 and a bottom surface of the seed layer of the conductive line CL2 are coplanar.

Figure 14H:
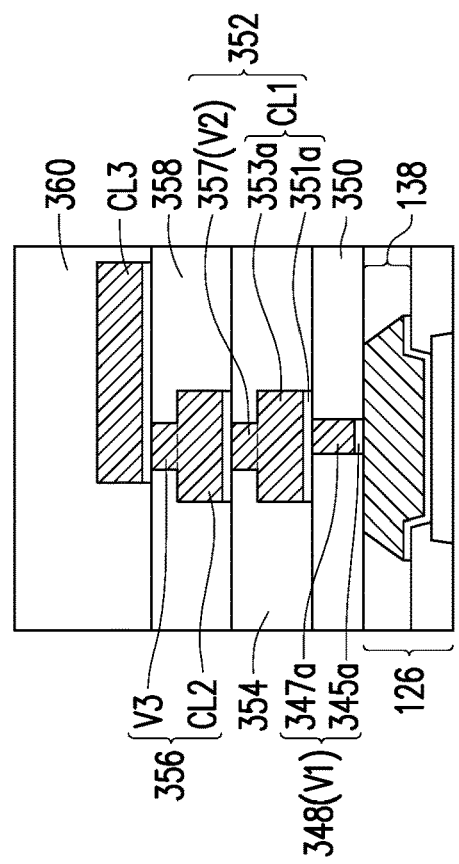

Referring to FIG. 14H, a conductive CL3 and a dielectric layer 360 are formed on the dielectric layer 358 and the metallization pattern 356. The conductive CL3 may be formed in a manner similar to the conductive CL5, and may be formed of the same material as the conductive CL5 as illustrated in FIGS. 10G to 10I. The dielectric layer 360 may be formed in a manner similar to the dielectric layer 350, and may be formed of the same material as the dielectric layer 350. In some embodiments, a bottom surface of the dielectric layer 360 and a bottom surface of the seed layer of the conductive line CL3 are coplanar.

Referring to FIG. 14I, the dielectric layer 360 is then patterned. The patterning forms opening (not shown) exposing portion of the conductive CL3. The patterning may be by an acceptable process, such as by exposing the dielectric layer 360 to light when the dielectric layer 360 is a photosensitive material or by etching using, for example, an anisotropic etch. If the dielectric layer 360 is a photosensitive material, the dielectric layer 360 may be developed after the exposure.

Referring to FIG. 14I, an UBM 362 are optionally formed on the dielectric layer 360 and filled in the opening of the dielectric layer 360. The UBM 362 may be formed in a manner similar to the UBM 162, and may be formed of the same material as the UBM 162 as illustrated in FIGS. 1D. A conductive connector 364 is formed on the UBM 362. The conductive connector 364 may be formed in a manner similar to the conductive connector 164, and may be formed of the same material as the conductive connector 164 as illustrated in FIGS. 1E, 5A and 5B.

Referring back to FIGS. 11A, 11B, 12A, 12B and 13, the front-side redistribution structure 344 is different from the front-side redistribution structure 144 as shown in FIGS. 1F. In the front-side redistribution structure 344, the conductive vias V1, V2 and V3 have substantially vertical profiles. In some embodiments, the conductive vias V1, V2 and V3 in the front-side redistribution structure 344 have downward taper-shaped profiles similar to the conductive vias V1, V2 and V3 shown in FIG. 1F.

Figure 15A:
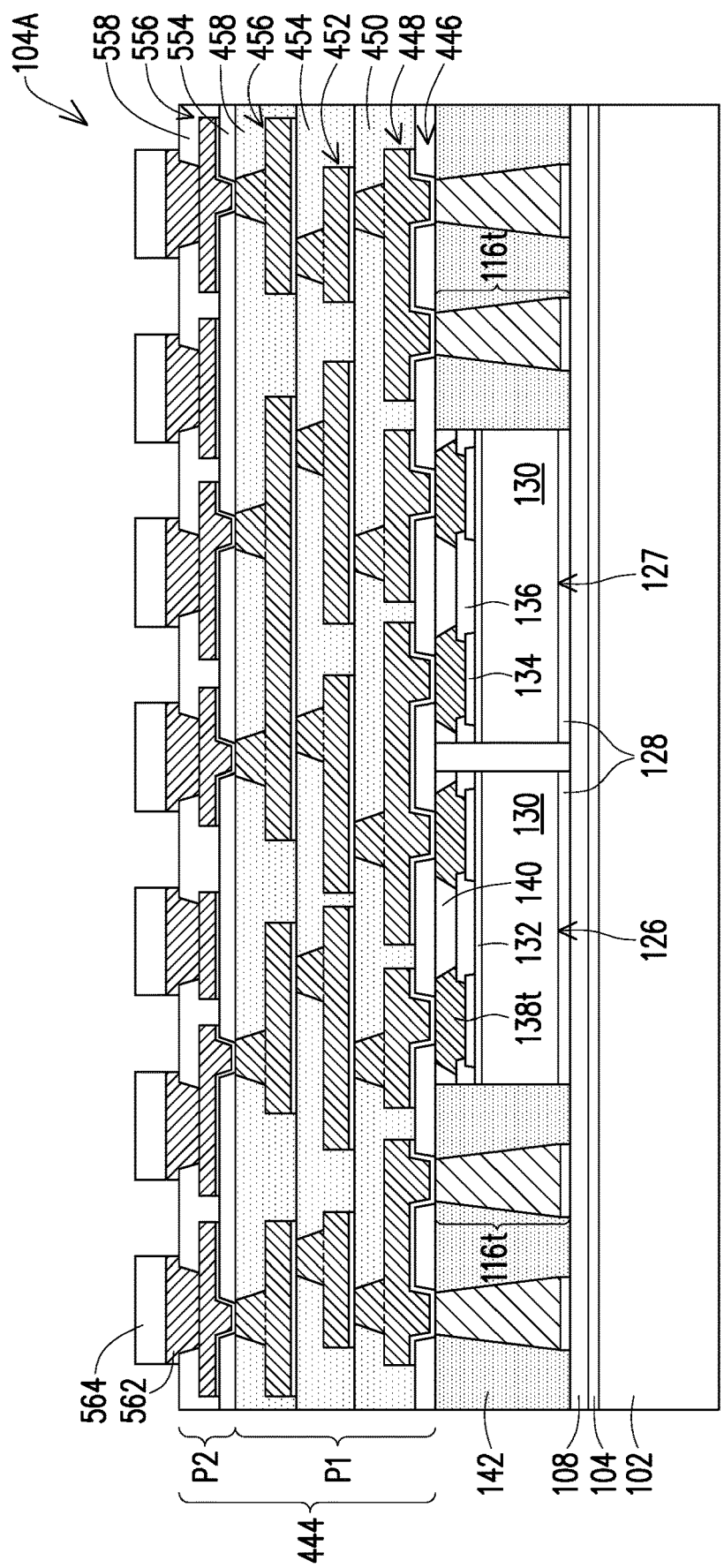
FIGS. 15A through 15B are schematic cross-sectional views illustrating a method of manufacturing a device package according to some embodiments of the disclosure.
Figure 15B:
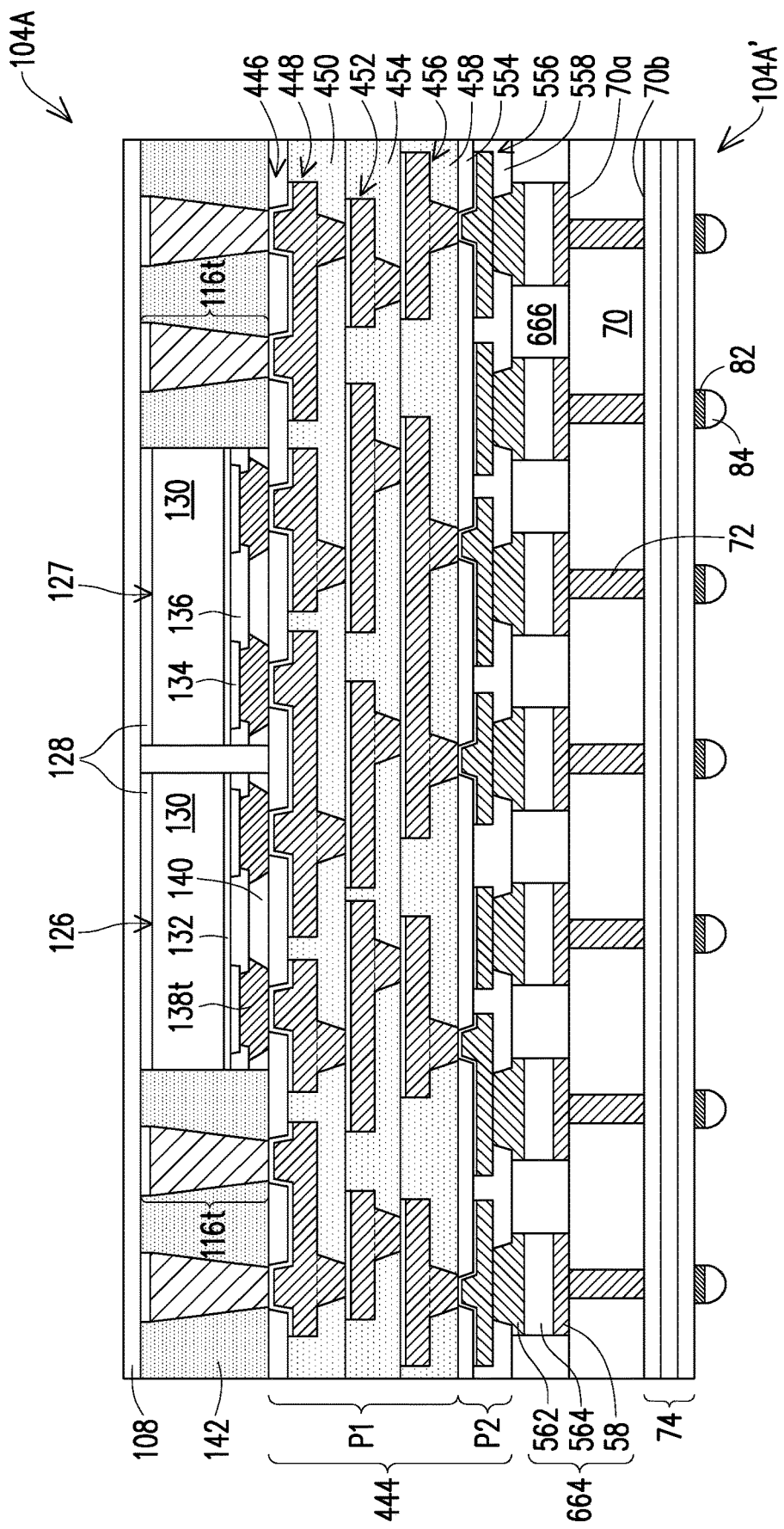

FIGS. 15A through 15B are schematic cross-sectional views illustrating a method of manufacturing a device package 104A according to some embodiments of the disclosure. The package structure 104A shown in FIG. 15A is similar to the device package 100A illustrated in FIG. 1E. The difference is the following.

In FIG. 15A, after a planarization process is performed on the encapsulant 142 to remove a portion of the encapsulant 142, the top surfaces of the taper-shaped through vias 116t and the taper-shaped die connectors 138t are exposed. A front-side redistribution structure 444 is formed over front-side surfaces of the IC dies 126 and 127, the taper-shaped through vias 116t and the encapsulant 142. The front-side redistribution structure 444 includes a first redistribution structure P1 and a second redistribution structure P2. The first redistribution structure P1 of the front-side redistribution structure 444 includes dielectric layer 446, molding compounds 450, 454, and 458 and metallization patterns 448, 452, and 456. The second redistribution structure P2 includes dielectric layers 554 and 558, a metallization pattern 556 and metal pillars 562.

In some embodiments, the dielectric layer 446 in FIG. 15A may be formed by dielectric materials similar to dielectric layer 146 of FIG. 1F. The molding compounds 450, 454, and 458 may be formed by molding compounds similar to molding compounds 250, 254 or 258 of FIG. 7B. The metallization pattern 448 in FIG. 15A may include taper-shaped conductive vias in the dielectric layer 446 which are tapered toward the IC dies 126 and 127 and are similar to the taper-shaped conductive vias V4 of the metallization patterns 248 in FIG. 7B. The metallization patterns 448, 452 and 456 in FIG. 15A may include taper-shaped conductive vias encapsulated by the molding compounds 450, 454, and 458 which are tapered toward the metal pillar 562 and are similar to the taper-shaped conductive vias V5 to V7 of the metallization patterns 248, 252, and 256 in FIG. 7B.

In some embodiments, the first redistribution structure P1 includes three metallization patterns 448, 452 and 456. In alternative embodiments, the number of metallization patterns in the first redistribution structure P1 of the front-side redistribution structure 444 may be more than three or less than three, which is not limited thereto. The processes of forming the first redistribution structure P1 of the front-side redistribution structure 444 is similar to the process of forming the second redistribution structure P2 of the front-side redistribution structure 244 shown in FIG. 7B.

After the first redistribution structure P1 of the front-side redistribution structure 444 is formed, the second redistribution structure P2 of the front-side redistribution structure 444 is formed on the first redistribution structure P1 of the front-side redistribution structure 444. In this embodiment, the second redistribution structure P2 of the front-side redistribution structure 444 includes the dielectric layer 554, the dielectric layer 558, the metallization pattern 556 and metal pillar 562. Metal cap layer 564 are formed on the metal pillars 562. In some embodiments, the metal pillar 562 and the metal cap layer 564 may also referred to as UBMs and connectors, respectively. The process of forming the dielectric layers 554 and 558, the metallization pattern 556 are similar to the process of forming the dielectric layer 158, the metallization pattern 156 illustrated in FIG. 1E, respectively. In some embodiments, the second redistribution structure P2 includes one metallization pattern. In alternative embodiments the number of metallization patterns in the second redistribution structure P2 may be more than one, which is not limited thereto. In some embodiments, the conductive pillars 562 include a conductive material such as copper, aluminum, gold, nickel, palladium, the like, or a combination thereof and may be formed by sputtering, printing, electro plating, electroless plating, CVD, or the like. In some embodiments, the metal cap layer 564 may include nickel, tin, tin-lead, gold, copper, silver, palladium, indium, nickel-palladium-gold, nickel-gold, the like, or a combination thereof and may be formed by a plating process.

Referring to FIG. 15B, a carrier substrate de-bonding is performed to detach the carrier substrate 102. In some embodiments, the de-bonding includes projecting a light such as a laser light or an UV light on the release layer 104 so that the release layer 104 decomposes under the heat of the light and the carrier substrate 102 may be removed. The debonded package 104A is flipped over and disposed over the component 104A'. The components 104A' may be an interposer or another die. In embodiments where component 104A' is an interposer, the component 104A' will generally not include active devices therein, although the interposer may include passive devices formed in and/or on a front-side or active surface 70a of a substrate 70 of the components 104A'. Through-vias (TVs) 72 are formed to extend from the front-side or active surface 70a of the substrate 70 into substrate 70. The TVs 72 are also sometimes referred to as through-substrate vias (TSVs) or through-silicon vias when substrate 70 is a silicon substrate. The TVs 72 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings. The barrier layer may include a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 70 by, for example, CMP. Thus, the TVs 72 may include a conductive material and a thin barrier layer between the conductive material and the substrate 70.

In some embodiments, the packages 104A are attached to a first side 70a of the components 104A' through flip-chip bonding by connecting the conductive pillars 562 and the conductive pillars 58 on the components 104A' with metal cap layers 564 to form conductive joints 664. The conductive pillars 58 may include a conductive material such as copper, aluminum, gold, nickel, palladium, the like, or a combination thereof and may be formed by sputtering, printing, electro plating, electroless plating, CVD, or the like. The packages 104A may be placed on the conductive connectors 58 using, for example, a pick-and-place tool. The conductive joints 664 electrically couple the circuits in the packages 104A through the RDL 444, to TVs 72 in the components 104A'.

Referring to FIG. 15B, the packages 104A are bonded to the components 104A' through a solder bonding or a direct metal to-metal (such as a copper-to-copper or tin-to-tin) bonding. In some embodiments, the packages 104A are bonded to the components 104A' by a reflow process. During this reflow process, the conductive pillars 562 and the conductive connector 58 are in contact with the pads of the RDL structure 444 to electrically couple the packages 104A to the components 104A'. After the bonding process, an intermetallic compound (IMC) (not shown) may form at the interface of the conductive pillars 562 and the metal cap layers 564, and the interface of the conductive pillars 58 and the metal cap layers 564.

Referring to FIG. 15B, an underfill material 666 is dispensed into the gaps between the packages 104A and the components 104A'. The underfill material 666 may extend up along sidewall of the packages 104A (not shown). The underfill material 666 may be any acceptable material, such as a polymer, epoxy, molding underfill, or the like. The underfill material 666 may be formed by a capillary flow process after the packages 104A are attached, or may be formed by a suitable deposition method before the packages 104A are attached.

Referring to FIG. 15B, an RDL structure 74 is formed the back-side or non-active surface 70b of the substrate 70. The RDL structure 74 may be formed in a manner similar to similar to the RDLs 144, 244, 344 or 444, and may be formed of the same material as the RDLs 144, 244, 344 or 444.

Referring to FIG. 15B, conductive connectors 84 are also formed on the RDL structure 74 and are electrically coupled to TVs 72. In some embodiments, the RDL structure 74 include UBMs 82. In the illustrated embodiment, the UBMS 82 extend through an opening of a dielectric layer of the RDL structure 74 and also extend across the top surface of the RDL structure 74. In another embodiment, the UBMS 82 are formed in openings of the dielectric layers of the RDL structure 74. The UBMs 82 may be formed in manner similar to similar to the UBMs 162, 262 or 362, and may be formed of the same material as the UBMs 162, 262 or 362. The conductive connectors 84 may be formed in manner similar to the conductive connectors 164, 264 or 364, and may be formed of the same material as the conductive connectors 164, 264 or 364. The conductive connectors 84 may be used to bond to an additional electrical component, which may be a semiconductor substrate, a package substrate, a printed circuit board (PCB), or the like.

FIGS. 16A through 16M are schematic cross-sectional views illustrating a method of manufacturing a device package 105, or specifically, a chip-on-wafer-on-substrate (COWOS) package structure, according to some embodiments of the disclosure.

Referring to FIG. 16A, IC dies 126B are placed on a temporary carrier 12B. In some embodiments, the IC dies 126B are attached to the temporary carrier 12B by a temporary bonding layer 14B. A material of the temporary carrier 12B may include glass, metal, ceramic, silicon, plastic, combinations thereof, multi-layers thereof, or other suitable material that may provide structural support for the IC dies 126B in subsequent processing. In some embodiments, the temporary carrier 12B is made of glass, and the temporary bonding layer 14B includes an adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used.

The IC dies 126B is adhered to the temporary bonding layer 14B by an adhesive 128B. Before being adhered to temporary bonding layer 14B, the IC dies 126B may be processed according to applicable manufacturing processes to form integrated circuits in the IC dies 126B. The IC dies 126B may be similar to the IC dies 126. For example, the IC dies 126B each include a semiconductor substrate 130B, die connectors 138B, and dielectric layer 140B. The IC dies 126B each may further include interconnect structures, pads, and a passivation film (not shown). The IC dies 126B may be formed in a manner similar to the IC dies 126. The die connectors 138B may be tapered, in a manner similar to the taper-shaped die connectors 138*t*. The dielectric layer 140B may be molding compounds similar to dielectric layer 140. Therefore, when the dielectric layer 140B is formed on the taper-shaped die connectors 138B, bubbles will be prevented from forming at the end of the taper-shaped die connectors 138B connecting the IC dies 126B. The semiconductor substrate 130B, the die connectors 138B, the dielectric layer 140B, the interconnect structures, the pads, and the passivation film may be formed of the same material as the corresponding parts of the IC dies 126. The adhesive 128B is on the back-side surfaces 126B-BS of the IC die 126B and adheres the IC die 126B to the temporary bonding layer 14B. The adhesive 128B may be applied to the back-side surfaces 126B-BS of the IC die 126B before singulating to separate the IC die 126B. The adhesive 128B may be any suitable adhesive, epoxy, die attach film (DAF), or the like.

Referring to 16A, an encapsulant 142B is formed over and surrounding the IC dies 126B. In some embodiments, the encapsulant 142B may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the encapsulant 142B may include one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In other embodiments, the encapsulant 142B may include a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the IC dies 126B.

The encapsulant 142B and the IC dies 126B are planarized, such that front surfaces 126B-FS of the IC dies 126B are substantially level or coplanar with a topmost surface of the encapsulant 142B. In some embodiments the encapsulant 142B and the IC dies 126B may be planarized using a CMP process, a grinding process, an etching process, a combination thereof, or the like. In some embodiment, the planarization process exposes the die connectors 138B, such that exposed surfaces of the die connectors 138B are substantially level or coplanar with the topmost surface of the encapsulant 142B.

Referring to FIG. 16B, an RDL structure 144B are formed on the IC dies 126B and the encapsulant 142B. The RDL structure 144B includes dielectric layers and metallization patterns. In some embodiments, the RDL structure 144B may be formed in a manner the same as or similar to the front-side RDL structure 144, 244, 344 or 444.

Figure 16C:
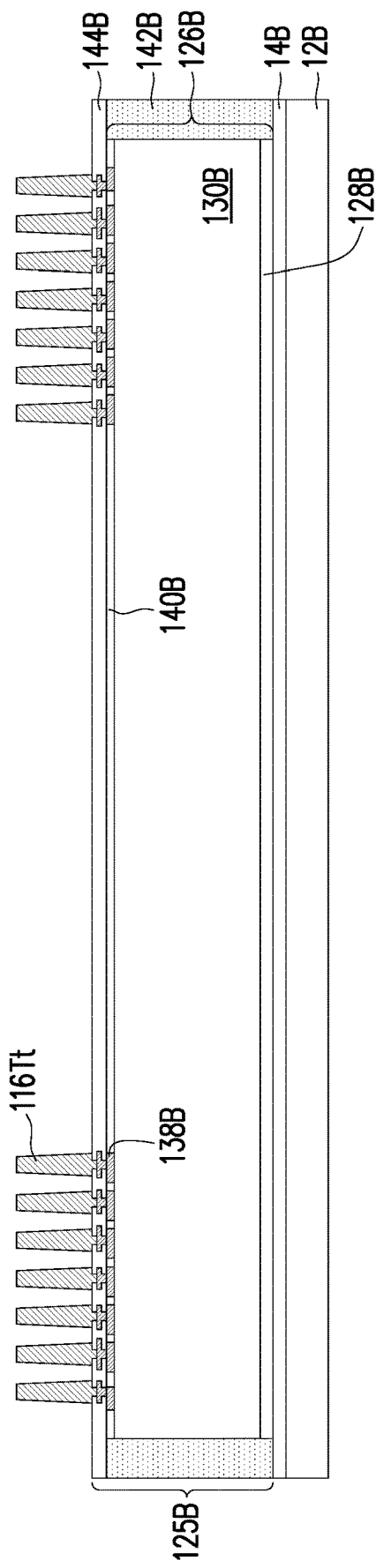

Referring to FIG. 16C, conductive pillars 116Tt are formed on the RDL structure 144B. In some embodiments, the conductive pillars 116Tt may be formed in a manner similar to the taper-shaped conductive pillars 116*t* as illustrated in FIG. 1C, and formed of the same material of the conductive pillars 116*t*. Specifically, the taper-shaped conductive pillars 116Tt may be tapered toward a direction away from the IC dies 126B.

Figure 16D:
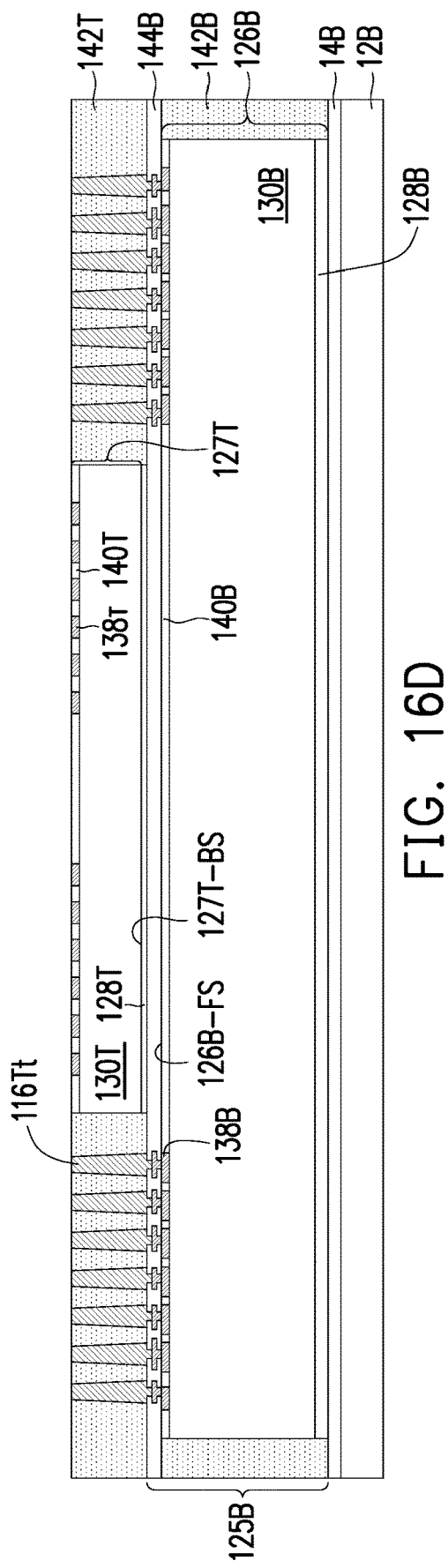

Referring to FIG. 16D, IC die 127T is adhered to the RDL structure 144B. The IC dies 127T and the IC dies 126B may be different in functions and properties. For example, the IC die 126B may be an IC die with larger footprint, such as a logic die (e.g., a system-on-a-chip (SoC), a central processing unit (CPU), a graphics processing unit (GPU), etc.). The IC die 127T may be an IC die with smaller footprint than the foot print of IC die 126B, such as a memory die (e.g., a dynamic random access memory (DRAM) die, a static random access memory (SRAM) die, a synchronous dynamic random access memory (SDRAM), a NAND flash, etc.). Each of the IC dies 127T may include a semiconductor substrate 130T, die connectors 138T, and dielectric layer 140T. The IC die 127T each may further include interconnect structures, pads, and a passivation film (not shown). The IC die 127T may be formed in a manner similar to the IC dies 126 as shown in FIG. 1F. The die connectors 138T may be taper-shaped (not shown), in a manner similar to the taper-shaped die connectors 138*t* as shown in FIG. 1F. The dielectric layer 140T may be molding compounds similar to dielectric layer 140. Therefore, when the polymer of the dielectric layer 140T is formed on the taper-shaped die connectors 138T, bubbles will be prevented from forming at the end of the taper-shaped die connectors 138T connecting the IC die 127T. The semiconductor substrate 130T, the die connectors 138T, the dielectric layer 140T, the interconnect structures, the pads, and the passivation film may be formed of the same material as the corresponding parts of the IC dies 126 shown in FIG. 1F.

In some embodiments, the IC die 127T may be disposed on the IC die 126B in a back-to-face configuration. For example, the back surface 127T-BS of the IC dies 127T face toward the front surface 126B-FS of the IC dies 126B. The back-side surfaces are opposite to front-side surfaces. In some embodiments, the front surfaces may be referred to as active surfaces. The non-active surfaces are opposite to active side surfaces. In some embodiments, the IC die 127T is adhered to the RDL structure 144B by an adhesive 128T. The adhesive 128T is on the back-side surfaces 127T-BS of the IC die 127T and adheres the IC die 127T to the RDL structure 144B. The adhesive 128T may be applied to the back-side surfaces 127T-BS of the IC die 127T before singulating to separate the IC die 127T. The adhesive 128T may be any suitable adhesive, epoxy, die attach film (DAF), or the like.

Referring to 16D, an encapsulant 142T is formed over the IC die 127T to encapsulate the IC die 127T. In some embodiments, the encapsulant 142T may be formed using similar material and methods as the encapsulant 142B, and the description is not repeated herein. The taper-shaped conductive pillars 116Tt penetrate the encapsulant 142T, and the taper-shaped conductive pillars 116Tt are sometimes referred to as taper-shaped through vias 116Tt or taper-shaped through integrated fan-out vias (TIVs) 116Tt. The taper-shaped through vias 116Tt are electrically connected to the IC dies 126B through the RDL structure 144B.

Figure 16E:
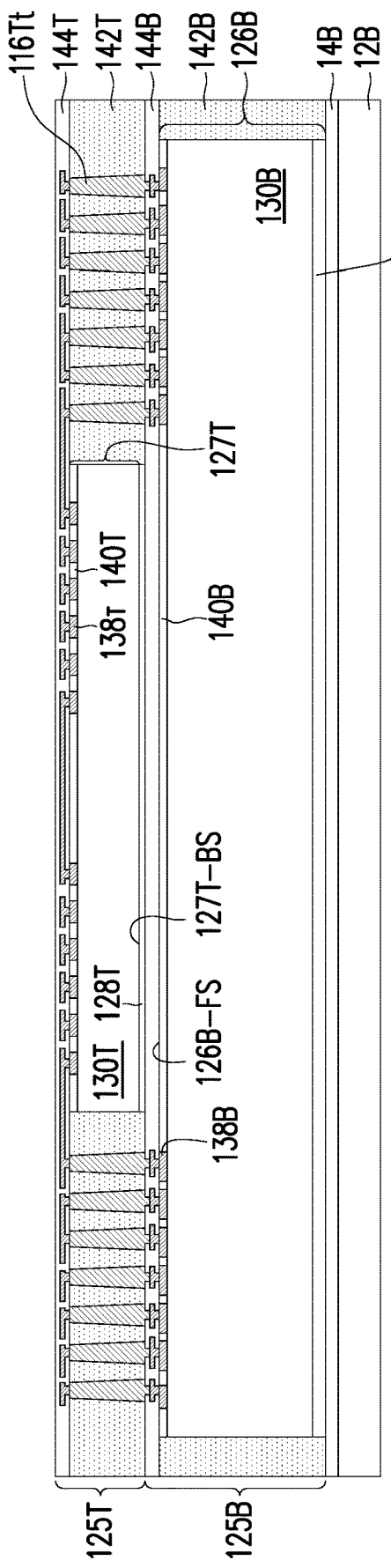

Referring to FIG. 16E, an RDL structure 144T are formed on the IC dies 127T, the taper-shaped conductive pillars 116Tt and the encapsulant 142T. In some embodiments, the RDL structure 144T may be formed in a manner the same as or similar to the front-side RDL structure 144, 244, 344 or 444. The RDL structure 144T may be electrically connected to the IC die 127T and electrically connected to the IC dies 126B through the taper-shaped conductive pillars 116Tt.

Figure 16F:
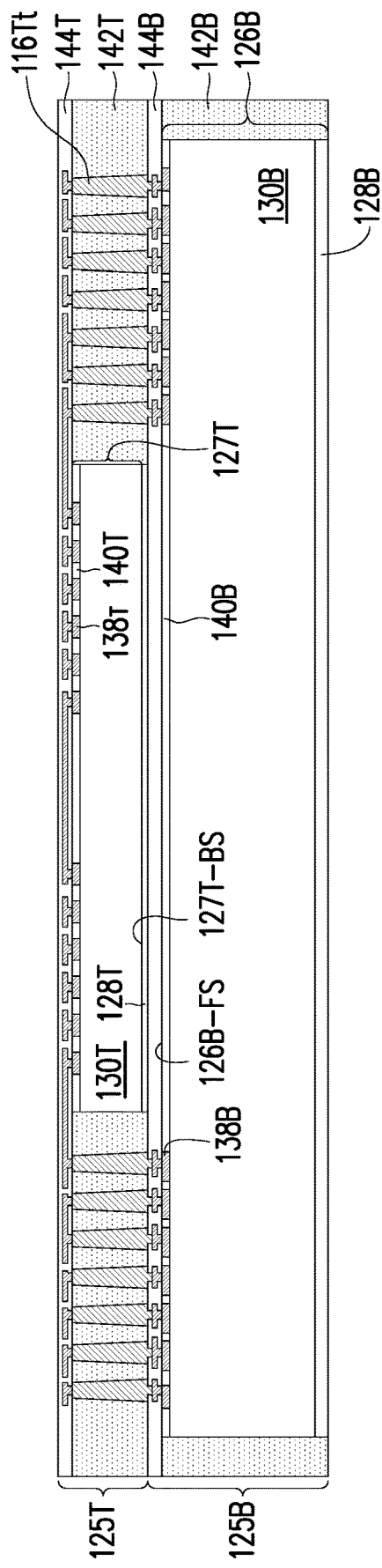

Referring to FIG. 16F, the temporary carrier 12B is removed from the IC dies 126B. The combination structure including IC dies 126B and 127T may be also referred to as package structure 105'.

Figure 16G:
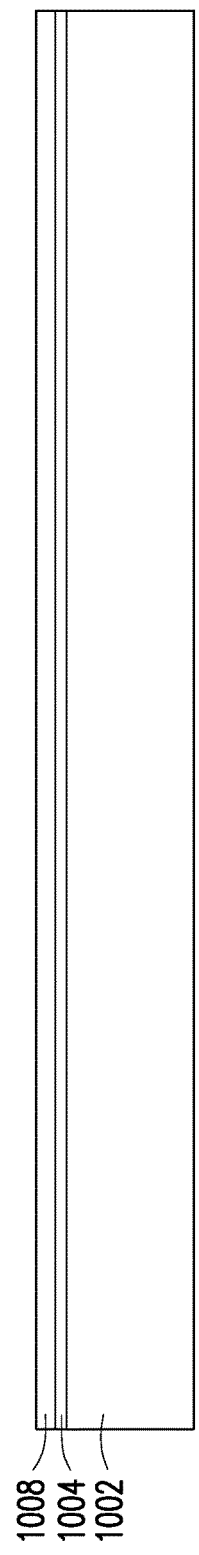

Referring to FIG. 16G, a carrier substrate (or referred to as a substrate) 1002 is provided, and a release layer 1004 is formed on the carrier substrate 1002. A bottom dielectric layer 1008 is formed on the release layer 1004. The carrier substrate 1002, the release layer 1004 and the bottom dielectric layer 1008 may be formed by the same or similar materials and method as the carrier substrate 102, the release layer 104 and the bottom dielectric layer 108, respectively.

Referring to FIG. 16G, a bottom dielectric layer 1008 is formed on the release layer 1004. The bottom surface of the bottom dielectric layer 1008 may be in contact with the top surface of the release layer 1004. In some embodiments, the bottom dielectric layer 1008 is formed of a polymer, such as polybenzoxazole (PBO), polyimide (PI), benzocyclobutene (BCB), or the like. In other embodiments, the dielectric layer 1008 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 1008 may be formed by any acceptable deposition process, such as spin coating, chemical vapor deposition (CVD), laminating, the like, or a combination thereof.

Figure 16H:
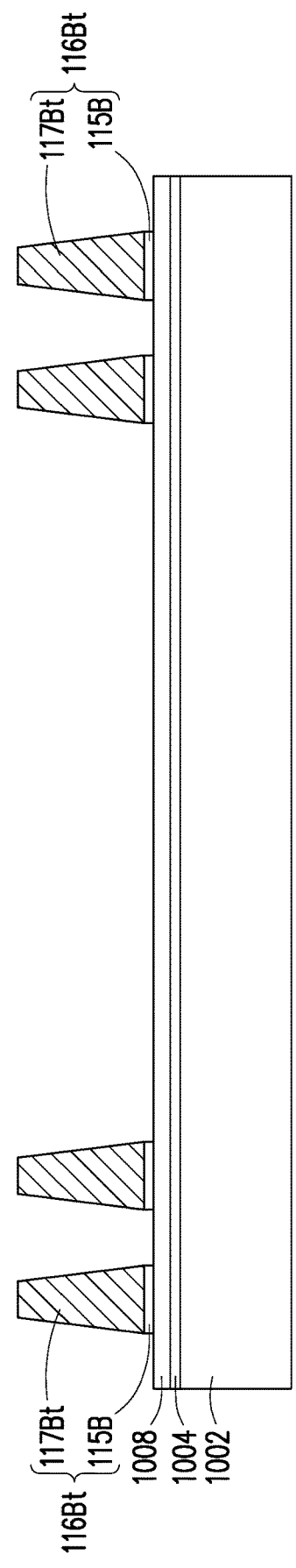

Referring to FIG. 16H, taper-shaped conductive pillars 116Bt are formed on the bottom dielectric layer 1008. The taper-shaped conductive pillars 116Bt comprises the seed layer 115B and taper-shaped conductive material 117Bt. The seed layer 115B and taper-shaped conductive material 117Bt are similar to the seed layer 115 and the taper-shaped conductive material 117t as shown in FIG. 2A-7. Specifically, the conductive pillars 116Bt have a tapered shape, which the taper-shaped conductive pillars 116Bt is tapered toward a direction away from the dielectric layer 1008. The method of forming the taper-shaped conductive pillar 116Bt is similar to the steps shown in FIGS. 2A-1 to 2A-7, 2B-1 to 2B-5 or 2C-1 to 2C-5.

Referring back to FIG. 16I, the package structure 105' is adhered to the release layer 1004 by an adhesive 128B. The package structure 105' is attached laterally aside the taper-shaped conductive pillars 116Bt with the back surface of the IC die 126B attached to the bottom dielectric layer 1008.

Referring back to FIG. 16J, an encapsulant 142B is formed over the bottom dielectric layer 1008, the taper-shaped conductive pillars 116Bt and the package structure 105'. After formation, the encapsulant 142B laterally encapsulates the taper-shaped conductive pillars 116Bt and the package structure 105'. In some embodiments, the encapsulant 142B includes a molding compound, a molding underfill, a resin such as epoxy, a combination thereof, or the like. In some other embodiments, the encapsulant 142B includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 142B includes nitride such as silicon nitride, oxide such as silicon oxide, phosphosilicate glass (PSG), borosilicate glass (BSG), boron-doped phosphosilicate glass (BPSG), a combination thereof, or the like.

The encapsulant 142B may be applied by compression molding, transfer molding, spin-coating, lamination, deposition, or similar processes, and may be formed over the carrier substrate 1002 such that the taper-shaped conductive pillars 116Bt and/or the package structure 105' are buried or covered. The encapsulant 142B is then cured.

Figure 16K:
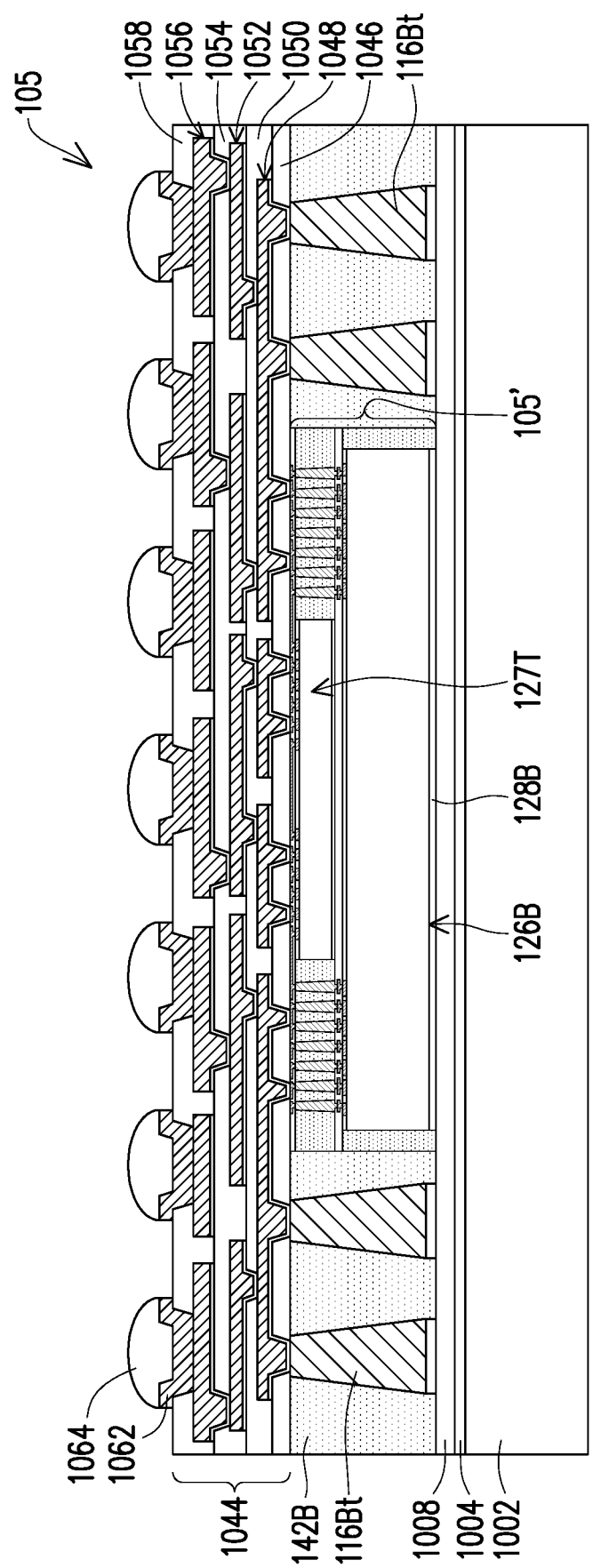

Referring to FIG. 16K, a planarization process is then performed on the encapsulant 142B to remove a portion of the encapsulant 142B, such that the top surfaces of the package structure 105' are exposed. In some embodiments which the top surfaces of the taper-shaped conductive pillars 116Bt and the package structure 105' are not coplanar (as shown in FIG. 16I), portions of the taper-shaped conductive pillars 116Bt or/and portions of the package structure 105' may also be removed by the planarization process. In some embodiments, top surfaces of the taper-shaped conductive pillars 116Bt, the package structure 105' and the encapsulant 142B are substantially coplanar after the planarization process. The planarization process may be, for example, a chemical-mechanical polish (CMP), a grinding process, or the like. In some embodiments, the planarization may be omitted, for example, if the taper-shaped conductive pillars 116Bt and the top surface of the package structure 105' are already exposed. The taper-shaped conductive pillars 116Bt penetrate the encapsulant 142B, and the taper-shaped conductive pillars 116Bt are sometimes referred to as taper-shaped through vias 116Bt or taper-shaped through integrated fan-out vias (TIVs) 116Bt.

Referring to FIG. 16K, a front-side redistribution structure 1044 is formed over front-side surfaces of the IC dies 127T, the taper-shaped through vias 116Bt, and the encapsulant 142B. The front-side redistribution structure 1044 includes dielectric layers 1046, 1050, 1054, and 1058; metallization patterns 1048, 1052, and 1056; and under bump metallurgies (UBMs) 1062. The conductive connectors 1064 are formed on the UBMs 1062. The front-side redistribution structure 1044 is shown as an example. More or fewer dielectric layers and metallization patterns may be formed in the front-side redistribution structure 1044. The front-side redistribution structure 1044 may be formed in a manner similar to the front-side redistribution structure 144, and may be formed of the same material as the front-side RDL structure 144.

Figure 16L:
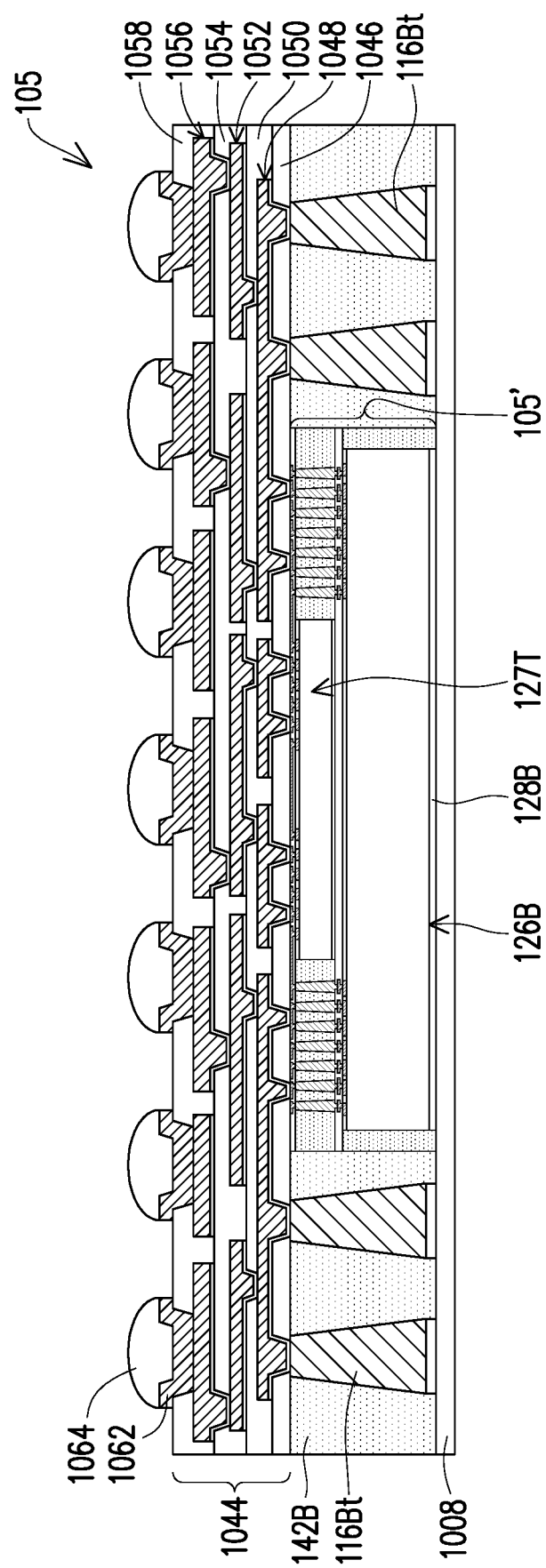

Referring to FIGS. 16K and 16L, a carrier substrate de-bonding is performed to detach (or "de-bond") the carrier substrate 1002 from the encapsulant 142B and the adhesive 1028 to form a package. In accordance with some embodiments, the de-bonding includes projecting a light such as a laser light or an UV light on the release layer 1004 so that the release layer 1004 decomposes under the heat of the light and the carrier substrate 1002 may be removed. The package is then flipped over and placed on a tape (not shown).

Figure 16M:
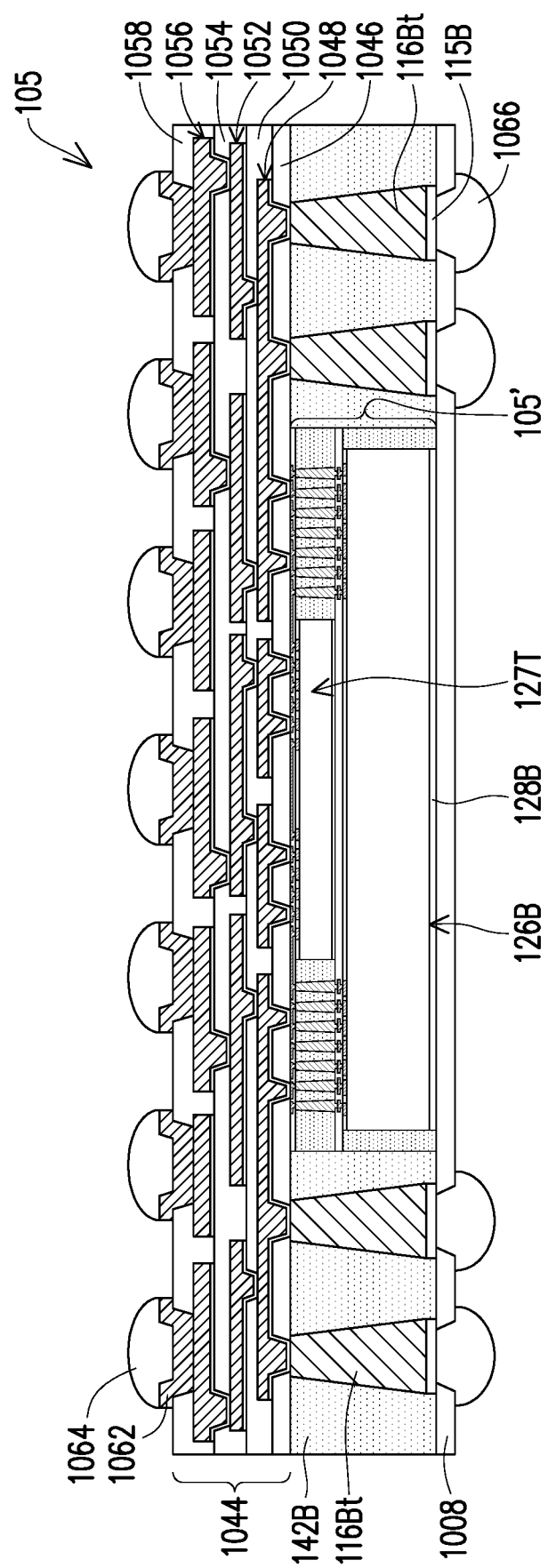

Referring to FIG. 16M, in some embodiments, conductive connectors 1066 are formed on the seed layer 115B to electrically connect to the taper-shaped through vias 116Bt and the IC dies 126B and 127T through the RDL structure 1044, and thereby forming a device package 105. In some embodiments, the conductive connectors 1066 may be formed in a manner similar to the conductive connectors 1064, and may be formed of the same material as the conductive connectors 1064.

FIGS. 17A through 17I are schematic cross-sectional views illustrating a method of manufacturing a device package 106A according to some embodiments of the disclosure.

Referring to FIG. 17A, IC dies 26 are placed on a temporary carrier 12. In some embodiments, the IC dies 26 are attached to the temporary carrier 12 by a temporary bonding layer 14. A material of the temporary carrier 12 may include glass, metal, ceramic, silicon, plastic, combinations thereof, multi-layers thereof, or other suitable material that may provide structural support for the IC dies 26 in subsequent processing. In some embodiments, the temporary carrier 12 is made of glass, and the temporary bonding layer 14 includes an adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used.

Before being adhered to temporary bonding layer 14, the IC dies 26 may be processed according to applicable manufacturing processes to form integrated circuits in the IC dies 26. The IC dies 26 may be similar to the IC dies 126. For example, the IC dies 26 each include a semiconductor substrate 30, die connectors 38, and dielectric material 40. The IC dies 26 each may further include interconnect structures, pads, and a passivation film (not shown). The IC dies 26 may be formed in a manner similar to the IC dies 126. The die connectors 38 may be tapered, in a manner similar to the taper-shaped die connectors 138t. The dielectric layer 40 may be molding compounds similar to dielectric layer 140. Therefore, when the molding compound of the dielectric material 40 is formed on the taper-shaped die connectors 38, no bubbles will be formed at the end of the taper-shaped die connectors 38 connecting the IC dies 26. The semiconductor substrate 30, the die connectors 38, the dielectric material 40, the interconnect structures, the pads, and the passivation film may be formed of the same material as the corresponding parts of the IC dies 126.

Referring to 17A, an encapsulant 42$_1$ is formed over and surrounding the IC dies 26. In some embodiments, the encapsulant 42$_1$ may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the encapsulant 42$_1$ may include one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In other embodiments, the encapsulant 42$_1$ may include a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the IC dies 26.

The encapsulant 42$_1$ and the IC dies 26 are planarized, such that front surfaces 26-FS of the IC dies 26 are substantially level or coplanar with a topmost surface of the encapsulant 42$_1$. In some embodiments the encapsulant 42$_1$ and the IC dies 26 may be planarized using a CMP process, a grinding process, an etching process, a combination thereof, or the like. In some embodiment, the planarization process exposes the die connectors 38, such that exposed surfaces of the die connectors 38 are substantially level or coplanar with the topmost surface of the encapsulant 42$_1$.

Referring to FIG. 17B, an RDL structure 44$_1$ are formed on the IC dies 26 and the encapsulant 42$_1$. The RDL structure 44$_1$ includes dielectric layers and metallization patterns. In some embodiments, the RDL structure 44$_1$ may be formed in a manner the same as or similar to the front-side RDL structure 144, 244, 344 or 444. The IC dies 26, the encapsulant 42$_1$ and the RDL structure 44$_1$ form a tier 1 structure 25$_1$.

Referring to FIG. 17C, conductive pillars 16t$_1$ are formed on the RDL structure 44$_1$. In some embodiments, the conductive pillars 16t$_1$ may be formed in a manner similar to the taper-shaped conductive pillars 116t as illustrated in FIG. 1C, and formed of the same material of the conductive pillars 116t. Specifically, the taper-shaped conductive pillars 16t$_1$ may be tapered toward a direction away from the IC dies 26.

Referring to FIG. 17D, IC dies 27$_1$ are adhered to the RDL structure 44$_1$. The IC dies 27$_1$ and the IC dies 26 are singulated from different wafers, and may be different in functions and properties. For example, the IC die 26 may be a logic die (e.g., a system-on-a-chip (SoC), a central processing unit (CPU), a graphics processing unit (GPU), etc.). The IC die 27$_1$ may be a memory die (e.g., a dynamic random access memory (DRAM) die, a static random access memory (SRAM) die, a synchronous dynamic random access memory (SDRAM), a NAND flash, etc.). The IC dies 27$_1$ each include a semiconductor substrate 30$_1$, die connectors 38$_1$, and dielectric material 40$_1$. The IC dies 27$_1$ each may further include interconnect structures, pads, and a passivation film (not shown). The IC dies 27$_1$ may be formed in a manner similar to the IC dies 126 or 127. The die connectors 38$_1$ may be tapered (not shown), in a manner similar to the taper-shaped die connectors 138t. The dielectric layer 40$_1$ may be molding compounds similar to dielectric layer 140. Therefore, when the molding compound of the dielectric layer 40$_1$ is formed on the taper-shaped die connectors $38_1$, no bubbles will be formed at the end of the taper-shaped die connectors $38_1$ connecting the IC dies $27_1$. The semiconductor substrate $30_1$, the die connectors $38_1$, the dielectric material $40_1$, the interconnect structures, the pads, and the passivation film may be formed of the same material as the corresponding parts of the IC dies 126.

In some embodiments, the IC dies $27_1$ may be disposed on the IC dies 26 in a back-to-face configuration. For example, the back surface $27_1$-BS of the IC dies $27_1$ face toward the front surface 26-FS of the IC dies 26. The back-side surfaces are opposite to front-side surfaces. In some embodiments, the front surfaces may be referred to as active surfaces. The non-active surfaces are opposite to active side surfaces. In some embodiments, the IC dies $27_1$ are adhered to the RDL structure $44_1$ by an adhesive $28_1$. The adhesive $28_1$ is on the back-side surfaces $27_1$-BS of the IC dies $27_1$ and adheres the IC dies $27_1$ to the RDL structure $44_1$. The adhesive 28 may be applied to the back-side surfaces $27_1$-BS of the IC dies $27_1$ before singulating to separate the IC dies $27_1$. The adhesive $28_1$ may be any suitable adhesive, epoxy, die attach film (DAF), or the like.

Referring to 17D, the IC dies $27_1$ are encapsulated in an encapsulant $42_2$ is formed over the IC dies $27_1$. In some embodiments, the encapsulant $42_2$ may be formed using similar material and methods as the encapsulant $42_1$, and the description is not repeated herein. The taper-shaped conductive pillars $16t_1$ penetrate the encapsulant $42_2$, and the taper-shaped conductive pillars $16t_1$ are sometimes referred to as taper-shaped through vias $16t_1$ or taper-shaped through integrated fan-out vias (TIVs) $16t_1$. The taper-shaped conductive pillars $16t_1$ are electrically connected to the IC dies 26 through the RDL structure $44_1$.

Figure 17E:
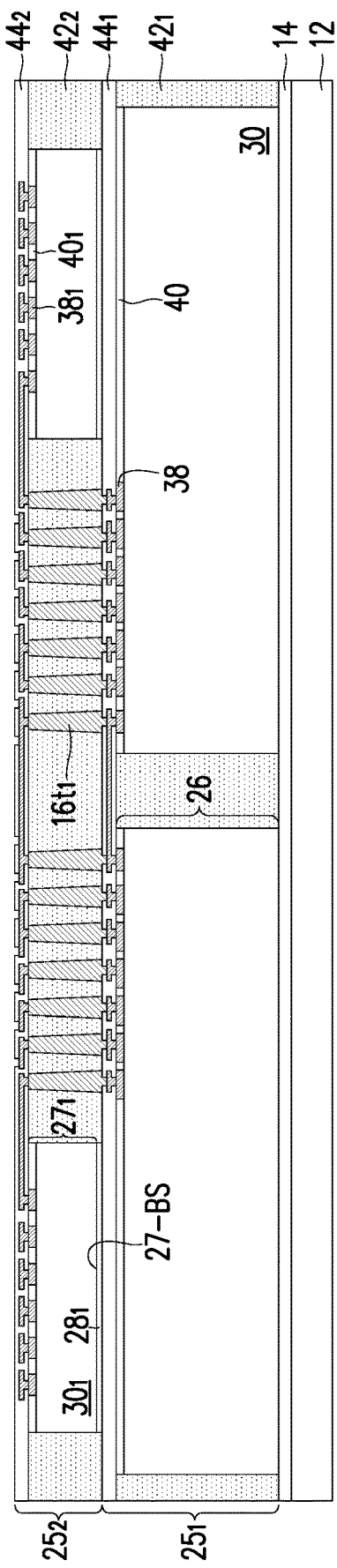

Referring to FIG. 17E, an RDL structure $44_2$ are formed on the IC dies $27_1$, the taper-shaped conductive pillars $16t_1$ and the encapsulant $42_2$. In some embodiments, the RDL structure $44_2$ may be formed in a manner the same as or similar to the front-side RDL structure 144, 244, 344 or 444. The RDL structure $44_2$ may be electrically connected to the IC dies $27_1$ and electrically connected to the IC dies 26 through the RDL structure $44_2$ and the taper-shaped conductive pillars $16t_1$. The RDL structure $44_2$, the taper-shaped conductive pillars $16t_1$, the IC dies $27_1$, and the encapsulant $42_2$ form a tier 2 structure $25_2$ over the tier 1 structure $25_1$.

Figure 17F:
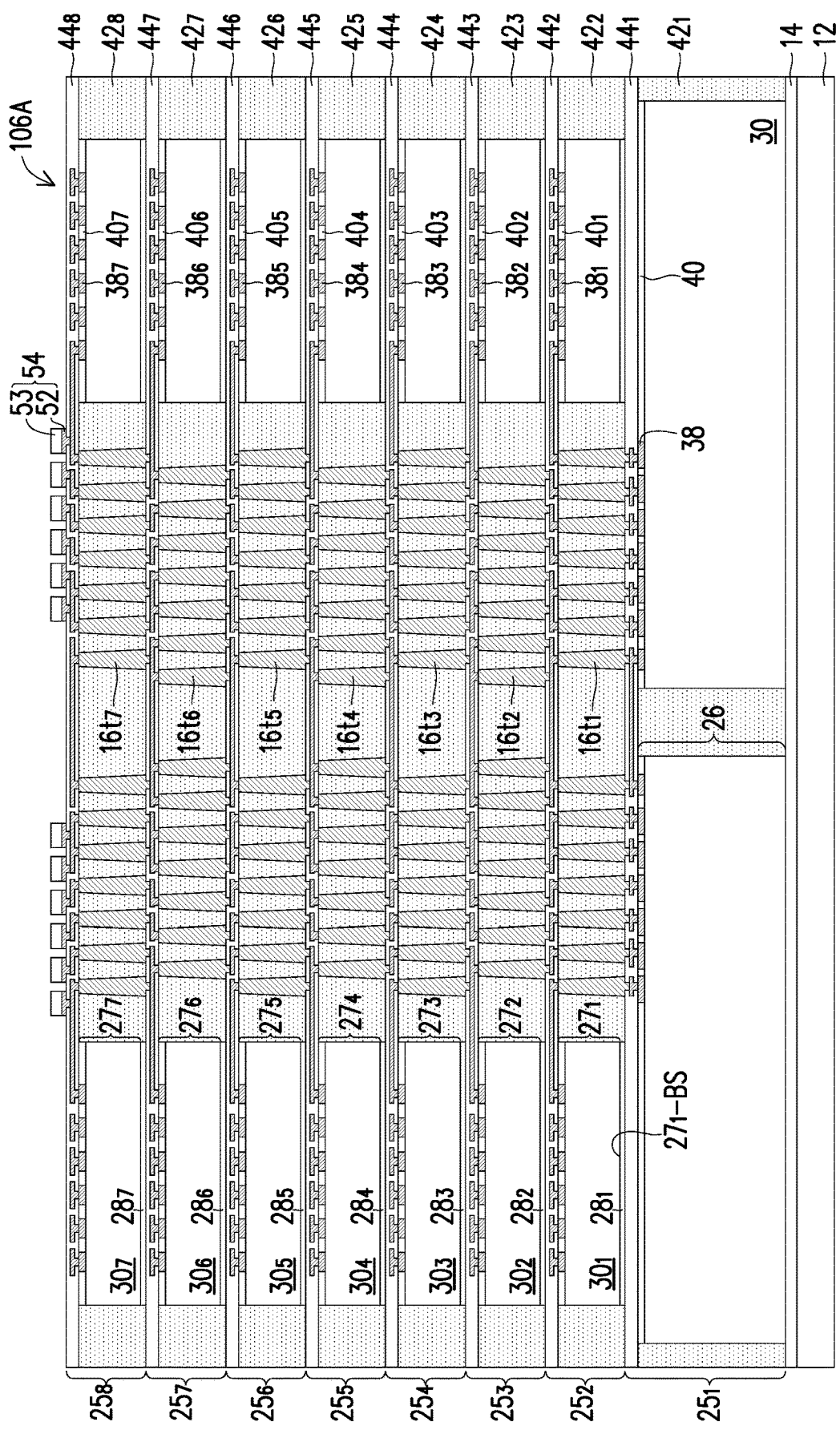

Referring to FIG. 17F, a tier 3 structure $25_3$, a tier 4 structure $25_4$, a tier 5 structure $25_5$, a tier 6 structure $25_6$, a tier 7 structure $25_7$, and a tier 8 structure $25_8$ are formed over the tier 2 structure $25_2$. The tier 3 structure $25_3$ includes an RDL structure $44_3$, the conductive pillars $16t_2$, IC dies $27_2$, and an encapsulant $42_3$. The tier 4 structure $25_4$ includes an RDL structure $44_4$, the conductive pillars $16t_3$, IC dies $27_3$, and an encapsulant $42_4$. The tier 5 structure $25_5$ includes an RDL structure $44_5$, the conductive pillars $16t_4$, IC dies $27_4$, and an encapsulant $42_5$. The tier 6 structure $25_6$ includes an RDL structure $44_6$, the conductive pillars $16t_5$, IC dies $27_5$, and an encapsulant $42_6$. The tier 7 structure $25_7$ includes an RDL structure $44_7$, the conductive pillars $16t_6$, IC dies $27_6$, and an encapsulant $42_7$. The tier 8 structure $25_8$ includes an RDL structure $44_8$, the conductive pillars $16t_7$, IC dies $27_7$, and an encapsulant $42_8$. In some embodiments, the conductive pillars $16t_2$ to $16t_7$ may be similar to the taper-shaped conductive pillars $16t_1$, which are also tapered, with similar features of the conductive pillars $16t_2$ to $16t_7$ and the conductive pillars $16t_1$ being referred to with similar numerical references. In some embodiments, the IC dies $27_2$ to $27_7$ may be similar to the IC dies $27_1$, with similar features of the IC dies $27_2$ to $27_7$ and the IC dies $27_1$ being referred to with similar numerical references. In some embodiments, the encapsulants $42_3$ to $42_8$ may be formed using similar material and methods as the encapsulant $42_1$, and the description is not repeated herein. In some embodiments, the tier 3 structure $25_3$ to the tier 8 structure $25_8$ may be formed using similar methods as the tier 2 structure $25_2$ described above, and the description is not repeated herein.

Referring to FIG. 17F, conductive connectors 54 are formed on conductive pads at the top surface of the RDL structure $44_8$. In some embodiments, the conductive pads include UBMs. In the illustrated embodiment, the pads are formed in openings of the dielectric layers of the RDL structure $44_8$. In another embodiment, the pads (UBMs) may extend through an opening of a dielectric layer of the RDL structure $44_8$ and also extend across the top surface of the RDL structure $44_8$. In some embodiments, the pads (UBMs) may be formed in a manner similar to the UBMs 162, 262, or 362, and may be formed of the same material as the UBMs 162, 262, or 362.

In some embodiments, the conductive connectors 54 include a metal pillar 52 with a metal cap layer 53, which may be a solder cap, over the metal pillar 52. The conductive connectors 54 including the pillar 52 and the cap layer 53 are sometimes referred to as micro bumps 52/53. In some embodiments, the conductive pillars 52 include a conductive material such as copper, aluminum, gold, nickel, palladium, the like, or a combination thereof and may be formed by sputtering, printing, electro plating, electroless plating, CVD, or the like. The conductive pillars 52 may be solder free and have substantially vertical sidewalls. In some embodiments, a metal cap layer 53 is formed on the top of the metal pillar 52. The metal cap layer 53 may include nickel, tin, tin-lead, gold, copper, silver, palladium, indium, nickel-palladium-gold, nickel-gold, the like, or a combination thereof and may be formed by a plating process. In another embodiment, the conductive connectors 54 do not include the conductive pillars and are solder balls and/or bumps, such as controlled collapse chip connection (C4), electroless nickel immersion Gold (ENIG), electroless nickel electroless palladium immersion gold technique (EN EPIG) formed bumps, or the like. In this embodiment, the bump conductive connectors 54 may include a conductive material such as solder, copper, aluminum, gold, nickel, silver, palladium, tin, the like, or a combination thereof. In this embodiment, the conductive connectors 54 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 17G:
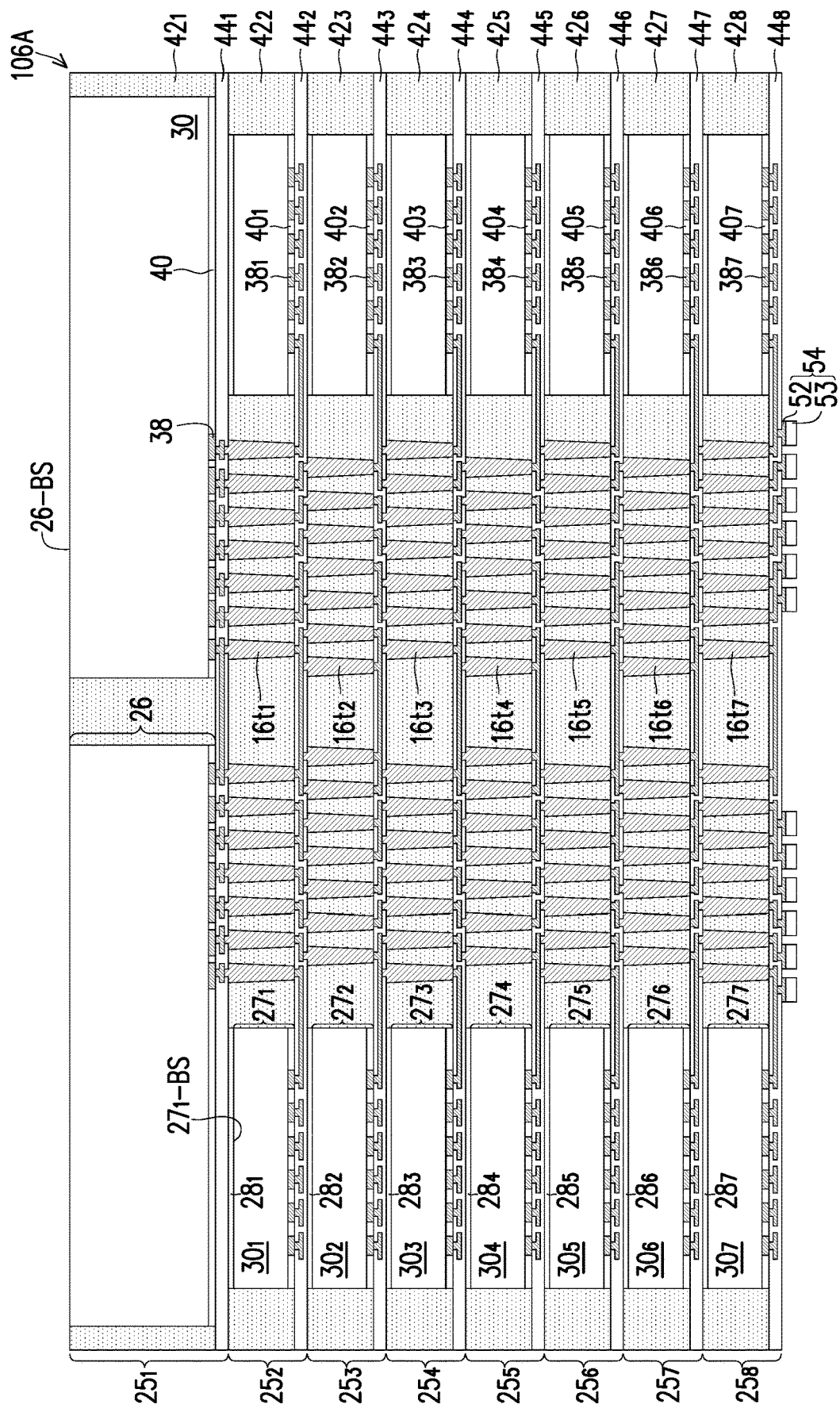

Referring to FIG. 17G, after forming the conductive connectors 54, another temporary carrier (not shown) is optionally attached to the tier 8 structure $25_8$ opposite to the temporary carrier 12. In some embodiments, before attaching another temporary carrier (not shown), other processes may be performed one the tier 8 structure $25_8$ depending on the design requirements. A de-bonding process is performed to release the temporary carrier 12 from the overlying structure, such that the front surface 26-BS of the IC dies 26 are exposed. In some embodiments, after the de-bonding of the temporary carrier 12, the back surface 26-BS of the IC dies 26 are cleaned for further processing.

Figure 17H:
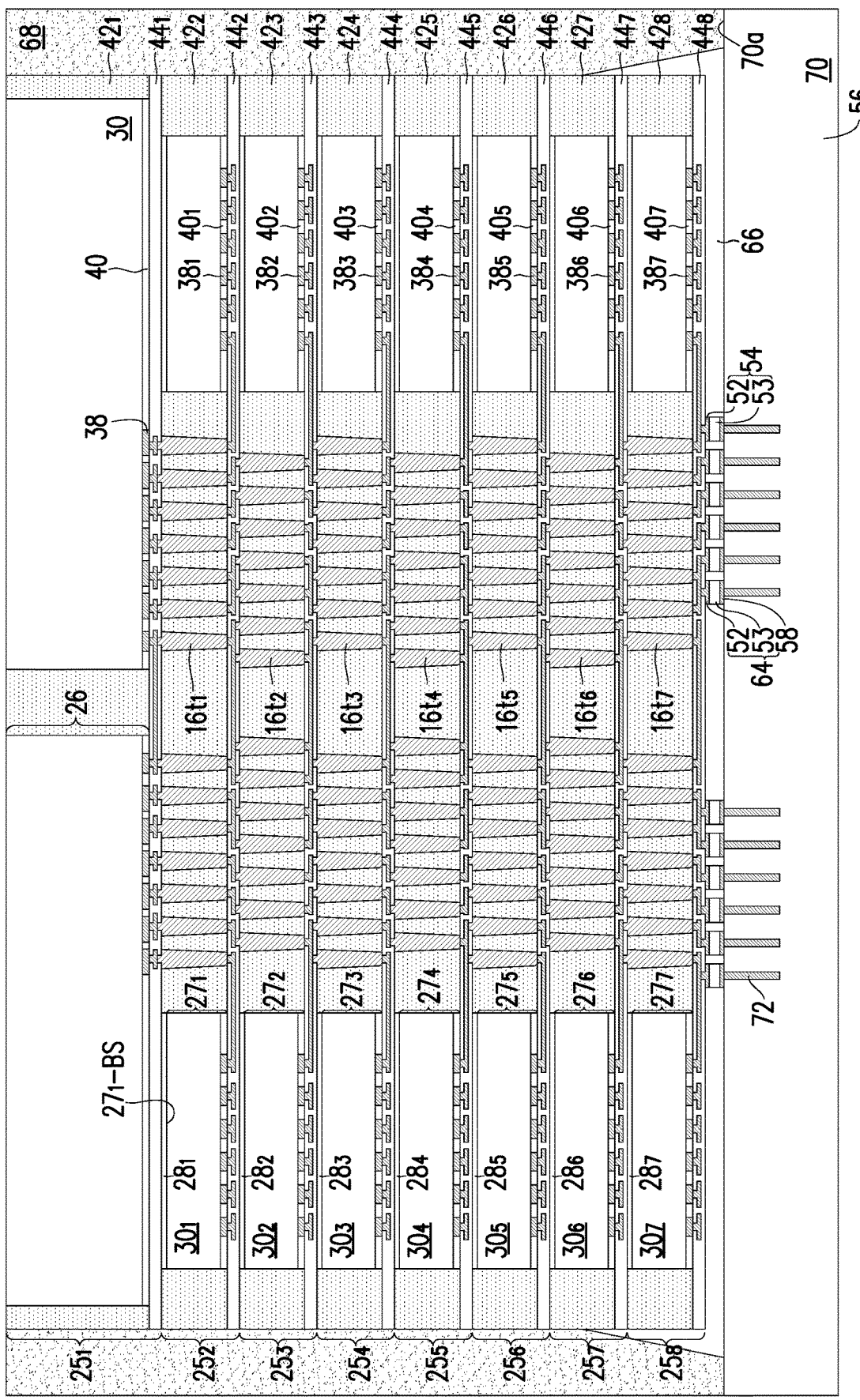

Referring to FIG. 17H, the resulting structure is singulated into a plurality of packages 106A, such that each package 106A includes the IC dies 26 with the respective stack of IC dies $27_1$-$27_7$. In some embodiments, the singulation process may include sawing, laser ablation, etching, a combination thereof, or the like. In other embodiments, the temporary carrier (not shown) may be removed before performing the singulation process. The temporary carrier (not shown) may be removed using a CMP process, a grinding process, an etching process, a combination thereof, or the like.

In some embodiments, the package 106A includes one or more memory dies, such as a stack of memory dies (e.g., DRAM dies, SRAM dies, high-bandwidth memory (HBM) dies, hybrid memory cubes (HMC) dies, or the like). In the stack of memory dies embodiments, the packages 106A may include both memory dies and a memory controller, such as, for example, a stack of four or eight memory dies with a memory controller. Also, in some embodiments, the IC dies 26 and $27_1$-$27_7$ of the package 106A may be in different sizes (e.g., different heights and/or surface areas), and in other embodiments, the IC dies 26 and $27_1$-$27_7$ may be in the same size (e.g., same heights and/or surface areas).

Referring to FIG. 17H, the packages 106A are attached to a first side of the components 56. The components 56 may be an interposer or another die. In embodiments where component 56 is an interposer, the component 56 will generally not include active devices therein, although the interposer may include passive devices formed in and/or on a front-side or active surface 70a of a substrate 70 of the components 56. Through-vias (TVs) 72 are formed to extend from the front-side or active surface 70a of the substrate 70 into substrate 70. The TVs 72 are also sometimes referred to as through-substrate vias or through-silicon vias when substrate 70 is a silicon substrate. The TVs 72 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings. The barrier layer may include a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 70 by, for example, CMP. Thus, the TVs 72 may include a conductive material and a thin barrier layer between the conductive material and the substrate 70.

In some embodiments, the packages 106A are attached to a first side of the components 56 through flip-chip bonding by way of the conductive connectors 54 and the conductive pillars 58 on the components 56 to form conductive joints 64. The conductive pillars 58 may be similar to the conductive pillars 52 and the description is not repeated herein. The packages 106A may be placed on the conductive connectors 58 using, for example, a pick-and-place tool. In some embodiments, the metal cap layers 53 are formed on the conductive pillars 52 (as shown in FIG. 17F), the conductive pillars 58 of the components 56, or both. The conductive joints 64 electrically couple the circuits in the packages 106A through the RDL $44_8$, and the taper-shaped conductive pillars $16t_7$ respectively, to TVs 72 in the components 56.

Referring to FIG. 17H, the packages 106A are bonded to the components 56 through a solder bonding or a direct metal to-metal (such as a copper-to-copper or tin-to-tin) bonding. In some embodiments, the packages 106A are bonded to the components 56 by a reflow process. During this reflow process, the conductive connectors 54/58 are in contact with the pads of the RDL structure $44_8$ to electrically couple the packages 106A to the components 56. After the bonding process, an intermetallic compound (IMC) (not shown) may form at the interface of the conductive pillars 52 and the metal cap layers 53, and the interface of the conductive pillars 58 and the metal cap layers 53.

Referring to FIG. 17H, an underfill material 66 is dispensed into the gaps between the packages 106A, and the components 56. The underfill material 66 may extend up along sidewall of the packages 106A. The underfill material 66 may be any acceptable material, such as a polymer, epoxy, molding underfill, or the like. The underfill material 66 may be formed by a capillary flow process after the packages 106A are attached, or may be formed by a suitable deposition method before the packages 106A are attached.

Referring to FIG. 17H, an encapsulant 68 is formed on the various components. The encapsulant 68 may be similar to the encapsulate 142. In some embodiments, the encapsulant 68 includes a molding compound, epoxy, or the like, and may be applied by compression molding, transfer molding, or the like. A curing step is performed to cure the encapsulant 68, such as a thermal curing, an ultra-violet (UV) curing, or the like. In some embodiments, the packages 106A are buried in the encapsulant 68, and after the curing of the encapsulant 68, a planarization step, such as a grinding, may be performed to remove excess portions of the encapsulant 68, which excess portions are over top surfaces of the packages 106A. Accordingly, top surfaces of the packages 106A are exposed, and are level with a top surface of the encapsulant 68.

Figure 17I:
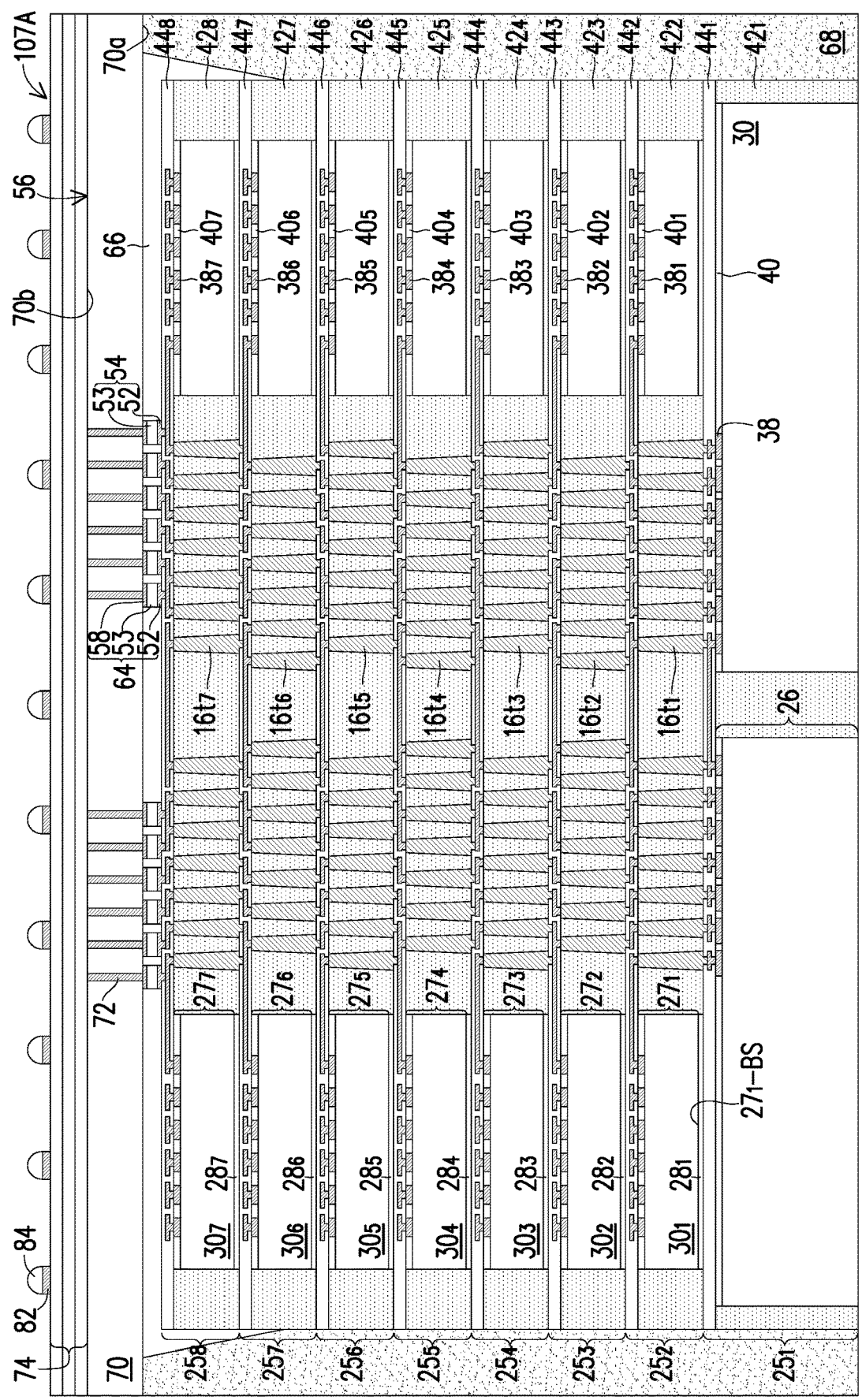

Referring to FIG. 17I, the structure of FIG. 17H is flipped over to prepare for the formation of a second side of components 56. Although not shown, the structure may be placed on carrier or support structure for the process of FIG. 17I. A thinning process is performed on the second side of the substrate 70 to thin the substrate 70 to a back-side or non-active surface 70b until TVs 72 are exposed. The thinning process may include an etching process, a grinding process, the like, or a combination thereof.

Referring to FIG. 17I, an RDL structure 74 is formed the back-side or non-active surface 70b of the substrate 70. The RDL structure 74 may be formed in a manner similar to similar to the RDLs 144, 244, 344 or 444, and may be formed of the same material as the RDLs 144, 244, 344 or 444.

Referring to FIG. 17I, conductive connectors 84 are also formed on the RDL structure 74 and are electrically coupled to TVs 72. In some embodiments, the RDL structure 74 include UBMs 82. In the illustrated embodiment, the UBMS 82 extend through an opening of a dielectric layer of the RDL structure 74 and also extend across the top surface of the RDL structure 74. In another embodiment, the UBMS 82 are formed in openings of the dielectric layers of the RDL structure 74. The UBMs 82 may be formed in manner similar to similar to the UBMs 162, 262 or 362, and may be formed of the same material as the UBMs 162, 262 or 362. The conductive connectors 84 may be formed in manner similar to the conductive connectors 164, 264 or 364, and may be formed of the same material as the conductive connectors 164, 264 or 364. The conductive connectors 84 may be used to bond to an additional electrical component, which may be a semiconductor substrate, a package substrate, a printed circuit board (PCB), or the like. The components 56 are singulated to form component packages 107A comprising, among other things, the package 106A, and the component 56. The singulation may be by sawing, dicing, or the like.

Figure 18:
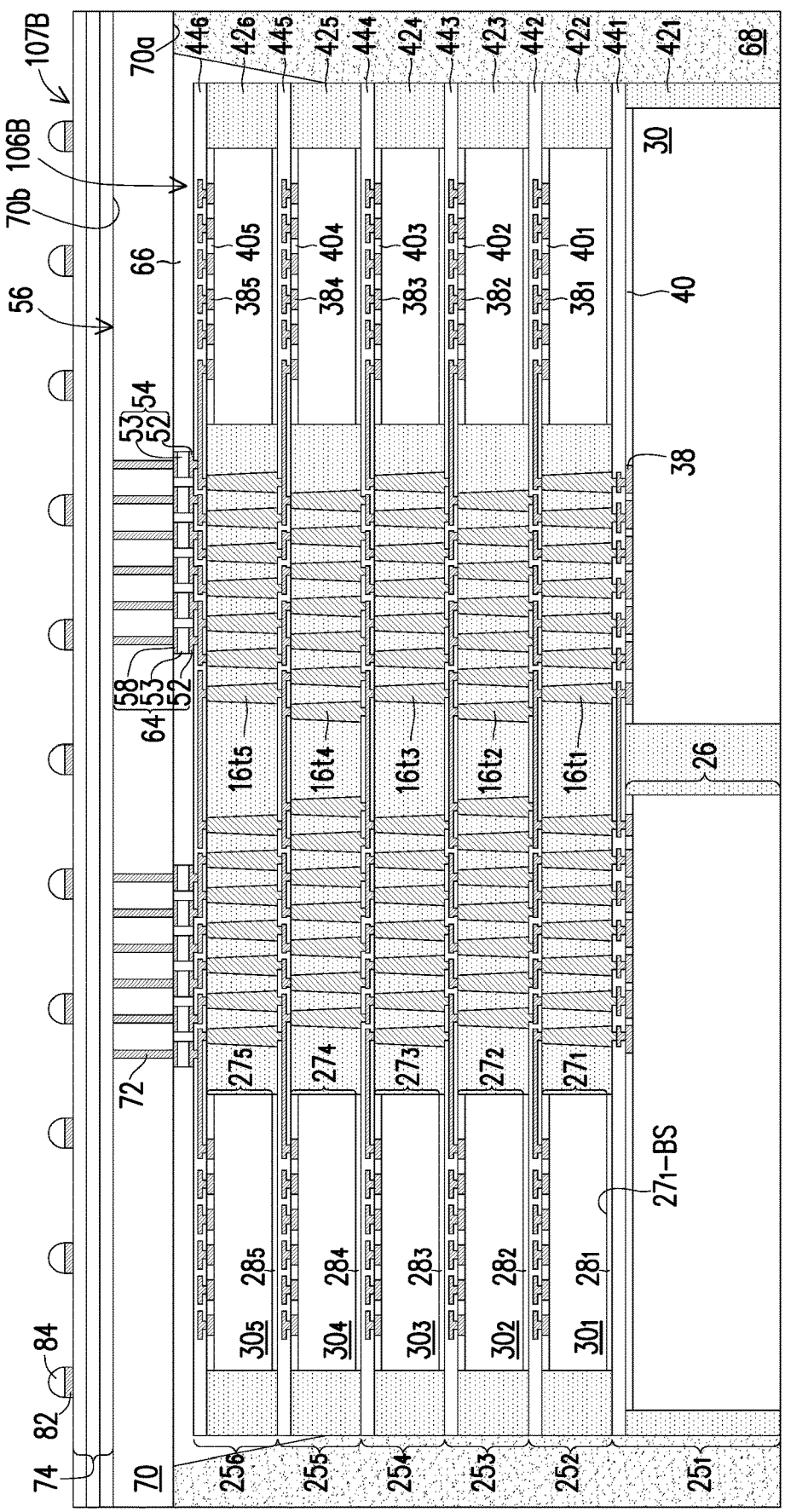
FIGS. 18 and 19 are schematic cross-sectional views illustrating device packages according to some embodiments of the disclosure.
Figure 19:
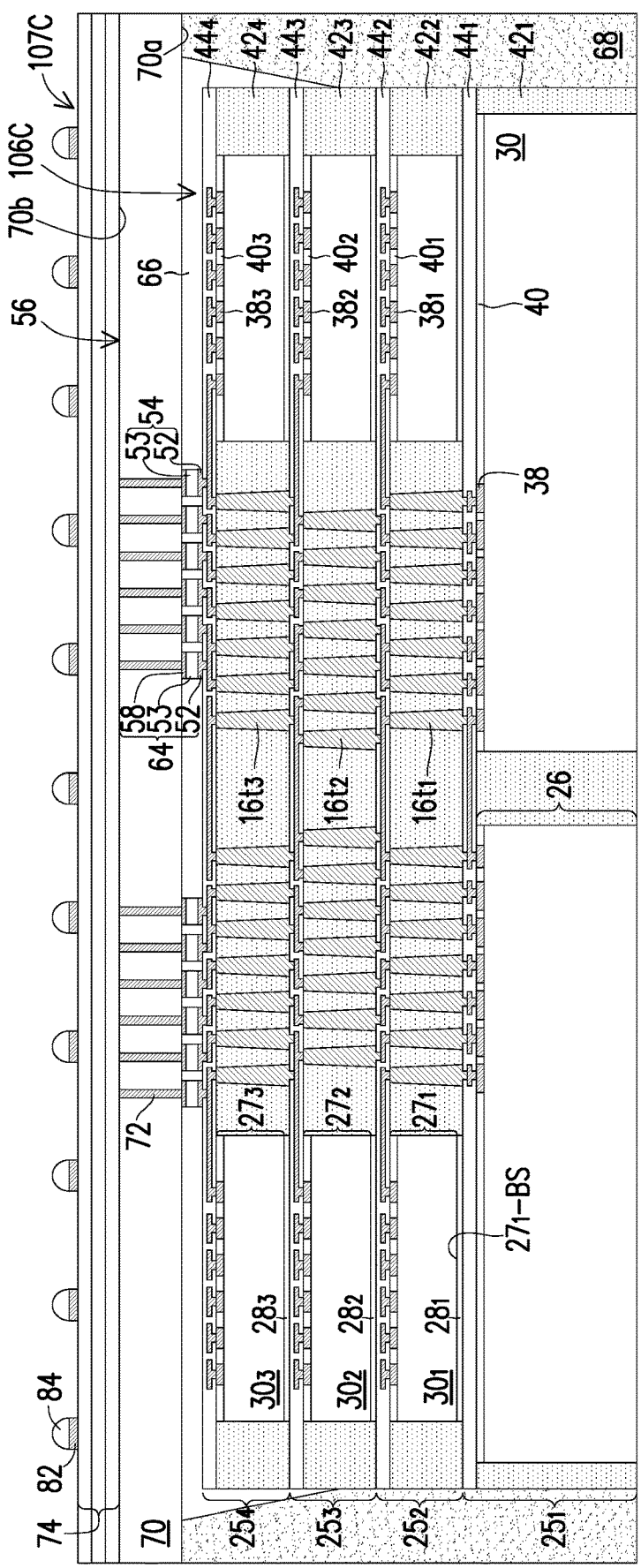

Referring to FIGS. 18 and 19, more or fewer tier structures may be included in component package. For example, component package 107B and 107C are similar to the component package 107A, and the difference is that the component package 107B includes a package 106B, and the component package 107C includes a package 106C, in which the package 106B and 106C each includes fewer tier structures compare to package 106A. The package 106B includes a tier 1 structure $25_1$ to a tier 6 structure $25_6$, while the package 106C includes a tier 1 structure $25_1$ to a tier 4 structure $25_4$.

In the embodiment of the present disclosure, a taper-shaped conductive pillar is used in the package structure, wherein the conductive pillar is tapered upward from the surface the conductive pillar is formed. In some embodiments of the present disclosure, the taper-shaped conductive pillars may be a TIV in an encapsulant, a die connector in the dielectric layer, or a conductive via in a redistribution layer. During the process of forming the molding compound or the dielectric layer, the taper-shaped conductive pillar may be coated or buried with high viscosity polymers without forming bubbles at the edge between the end of the conductive pillar and the surface the conductive pillar is formed. As a result, the stability of package structure may be improved. This taper-shaped conductive pillar structure may be applied to the development of fine-pitch package manufacturing processes.

In accordance with some embodiments of the disclosure, a conductive structure, includes: a plurality of conductive layers; a plurality of conductive pillars being formed on the plurality of conductive layers, respectively; and a molding compound laterally coating the plurality of conductive pillars, wherein each of the plurality of conductive pillars is a taper-shaped conductive pillar, and is tapered from the conductive layers.

In accordance with alternative embodiments of the disclosure, an integrated circuit (IC) die, includes: a substrate; a plurality of pads over the substrate; a passivation layer on portions of each of the plurality of pads; a plurality of die connectors on the plurality of pads, respectively; and a molding compound laterally encapsulating the plurality of die connectors, wherein each of the plurality of die connectors is a taper-shaped die connector and is tapered from the pads.

In accordance with some embodiments of the disclosure, a method for forming a conductive structure, includes: forming a plurality of conductive layers; forming a plurality of conductive pillars on the plurality of conductive layers, respectively; treating the plurality of conductive pillars, thereby forming a plurality of taper-shaped conductive pillars which is tapered from the conductive layer; and forming a molding compound around the plurality of taper-shaped conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   at least one die comprising a plurality of die connectors;
   a plurality of taper-shaped through vias, wherein each of the plurality of taper-shaped through vias comprises a conductive layer and a taper-shaped conductive pillar on the conductive layer;
   an encapsulant laterally encapsulating the at least one die and the plurality of taper-shaped through vias; and
   a redistribution structure, disposed over the encapsulant and electrically connected with the at least one die and the plurality of taper-shaped through vias, wherein the redistribution structure is in direct contact with the plurality of die connectors, a width of the taper-shaped conductive pillar gradually decreases along a direction from the conductive layer toward the redistribution structure, each of the plurality of die connectors is a taper-shaped die connector, and a width of each of the plurality of die connectors gradually decreases along the direction.

2. The package structure of claim 1, wherein the conductive layer is a seed layer.

3. The package structure of claim 1, wherein top surfaces of the taper-shaped through vias and the encapsulant are substantially coplanar.

4. The package structure of claim 1, wherein a ratio of a height of the taper-shaped through vias to a width of a top side of the taper-shaped through vias is larger than or equal to 5.

5. The package structure of claim 1, wherein a ratio of a width of a bottom side of the taper-shaped through vias to a width of a top side of the taper-shaped through vias is larger than 1 and is smaller or equal to 3.

6. The package structure of claim 1, wherein each of the taper-shaped through vias further comprises:
   a first angle between a top side of the taper-shaped through vias and a first lateral side of the taper-shaped through vias; and
   a second angle between the top side of the taper-shaped through vias and a second lateral side of the taper-shaped through via,
   wherein the first angle and the second angle are both larger than 90 degrees and smaller than 135 degrees.

7. The package structure of claim 1, wherein a distance between opposing top sides, of the adjacent taper-shaped through vias is larger than or equal to a width of a top side of the taper-shaped through vias.

8. The package structure of claim 1, wherein a distance between opposing bottom sides of the adjacent taper-shaped through vias is smaller than or equal to 15 μm.

9. The package structure of claim 1, wherein a ratio of a height of the taper-shaped through vias to a distance between opposing top sides of the adjacent taper-shaped through vias is larger than or equal to 1.33.

10. An package structure, comprising:
    at least one die, wherein the at least one die comprises:
      a substrate;
      a plurality of pads over the substrate;
      a passivation layer on portions of each of the plurality of pads;
      a plurality of die connectors on the plurality of pads, respectively; and
      a dielectric layer laterally encapsulating the plurality of die connectors;

a plurality of seed layers and a plurality of taper-shaped conductive pillars on the plurality of seed layers, respectively, wherein each of the plurality of taper-shaped conductive pillars is tapered from the plurality of seed layers;

an encapsulant laterally encapsulating the at least one die, the plurality of seed layers and the plurality of taper-shaped conductive pillars; and a redistribution structure, disposed over the encapsulant and electrically connected with the plurality of die connectors of the at least one die and the plurality of taper-shaped conductive pillars, wherein the redistribution structure is in direct contact with the plurality of die connectors, each of the plurality of die connectors is a taper-shaped die connector, and a width of each of the plurality of die connectors gradually decreases from the pads toward the redistribution structure.

11. The package structure of claim 10, wherein a ratio of a height of the taper-shaped die connector to a width of a top side of the taper-shaped die connector is larger than or equal to 2.

12. The package structure of claim 10, wherein a ratio of a width of a bottom side of the taper-shaped die connector to a width of a top side of the taper-shaped die connector is larger than 1 and is smaller or equal to 3.

13. The package structure of claim 10, wherein the taper-shaped die connector further comprises:

a first angle between a top side of the taper-shaped die connector and a first lateral side of the taper-shaped die connector; and a second angle between the top side of the taper-shaped die connector and a second lateral side of the taper-shaped die connector, wherein the first angle and the second angle are both larger than 90 degrees and smaller than 135 degrees.

14. The package structure of claim 13, wherein the first angle is the same as the second angle.

15. The package structure of claim 10, wherein a distance between centers of the adjacent taper-shaped die connectors is smaller than or equal to 50 μm.

16. The package structure of claim 10, wherein a distance between opposing bottom sides of the adjacent taper-shaped die connectors is smaller than or equal to 15 μm.

17. The package structure of claim 10, wherein a width of a top side of the taper-shaped die connector is smaller than or equal to 15 μm.

18. The package structure of claim 10, wherein a ratio of a height of the taper-shaped die connector to a distance between opposing top sides of the adjacent taper-shaped die connectors is larger than or equal to 2.

19. A package structure, comprising:

at least one die comprising a plurality of pads and a plurality of die connectors on the plurality of pads along a first direction, espectively;

a plurality of through vias;

an encapsulant laterally encapsulating the at least one die and the plurality of through vias; and a redistribution structure, disposed over the encapsulant, the at least one die and the plurality of through vias along the first direction, wherein the redistribution structure is in direct contact with the plurality of die connectors, each of the plurality of die connectors is a taper-shaped die connector, and a dimension of each of the plurality of die connectors along a second direction perpendicular to the first direction gradually decreases along the first direction from the pads toward the redistribution structure.

20. The package structure of claim 19, wherein a distance between centers of the adjacent taper-shaped die connectors is smaller than or equal to 50 μm.

* * * * *